(12) United States Patent
Chen et al.

(10) Patent No.: US 11,676,896 B2
(45) Date of Patent: Jun. 13, 2023

(54) INTEGRATED CIRCUIT AND METHOD FOR FORMING THE SAME

(71) Applicant: TAIWAN SEMICONDUCTOR MANUFACTURING COMPANY, LTD., Hsinchu (TW)

(72) Inventors: Chih-Liang Chen, Hsinchu (TW); Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 233 days.

(21) Appl. No.: 17/167,646

(22) Filed: Feb. 4, 2021

(65) Prior Publication Data

US 2021/0343646 A1    Nov. 4, 2021

Related U.S. Application Data

(60) Provisional application No. 63/018,277, filed on Apr. 30, 2020.

(51) Int. Cl.
*H01L 23/528* (2006.01)
*H01L 29/06* (2006.01)
(Continued)

(52) U.S. Cl.
CPC .... *H01L 23/5286* (2013.01); *H01L 21/02603* (2013.01); *H01L 21/28518* (2013.01);
(Continued)

(58) Field of Classification Search
CPC ........... H01L 23/5286; H01L 21/02603; H01L 21/28518; H01L 21/30604; H01L 21/30625; H01L 29/0673; H01L 29/42392; H01L 29/45; H01L 29/66545; H01L 29/66553; H01L 29/66742;
(Continued)

(56) References Cited

U.S. PATENT DOCUMENTS

| 2018/0374791 A1* | 12/2018 | Smith | H01L 29/78696 |
| 2019/0164882 A1* | 5/2019 | Chen | H01L 23/535 |
| 2020/0135578 A1* | 4/2020 | Ching | H01L 29/785 |

FOREIGN PATENT DOCUMENTS

| JP | 2010171166 | 8/2010 |
| KR | 20190015269 | 2/2019 |

(Continued)

*Primary Examiner* — Tong-Ho Kim
(74) *Attorney, Agent, or Firm* — Hauptman Ham, LLP

(57) ABSTRACT

A semiconductor device includes a substrate, a gate structure, source/drain structures, a backside via, and a power rail. The gate structure extends along a first direction parallel with a front-side surface of the substrate. The backside via extends along a second direction parallel with the front-side surface of the substrate but perpendicular to the first direction, the backside via has a first portion aligned with one of the source/drain structures along the first direction and a second portion aligned with the gate structure along the first direction, the first portion of the backside via has a first width along the first direction, and the second portion of the backside via has a second width along the first direction, in which the first width is greater than the second width. The power rail is on a backside surface of the substrate and in contact with the backside via.

20 Claims, 126 Drawing Sheets

(51) Int. Cl.
| | |
|---|---|
| *H01L 29/423* | (2006.01) |
| *H01L 29/45* | (2006.01) |
| *H01L 29/786* | (2006.01) |
| *H01L 21/02* | (2006.01) |
| *H01L 21/285* | (2006.01) |
| *H01L 21/306* | (2006.01) |
| *H01L 29/66* | (2006.01) |

(52) U.S. Cl.
CPC .. *H01L 21/30604* (2013.01); *H01L 21/30625* (2013.01); *H01L 29/0673* (2013.01); *H01L 29/42392* (2013.01); *H01L 29/45* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
CPC ......... H01L 29/78618; H01L 29/78696; H01L 23/485; H01L 21/76898; H01L 23/481; H01L 27/088; H01L 21/823475; H01L 21/823412; H01L 21/823418; H01L 21/823437; H01L 21/823462; H01L 21/823468
USPC ......................................................... 257/347
See application file for complete search history.

(56) References Cited

FOREIGN PATENT DOCUMENTS

| | | |
|---|---|---|
| KR | 2019007267 | 6/2019 |
| WO | 2018/004653 | 1/2018 |

\* cited by examiner

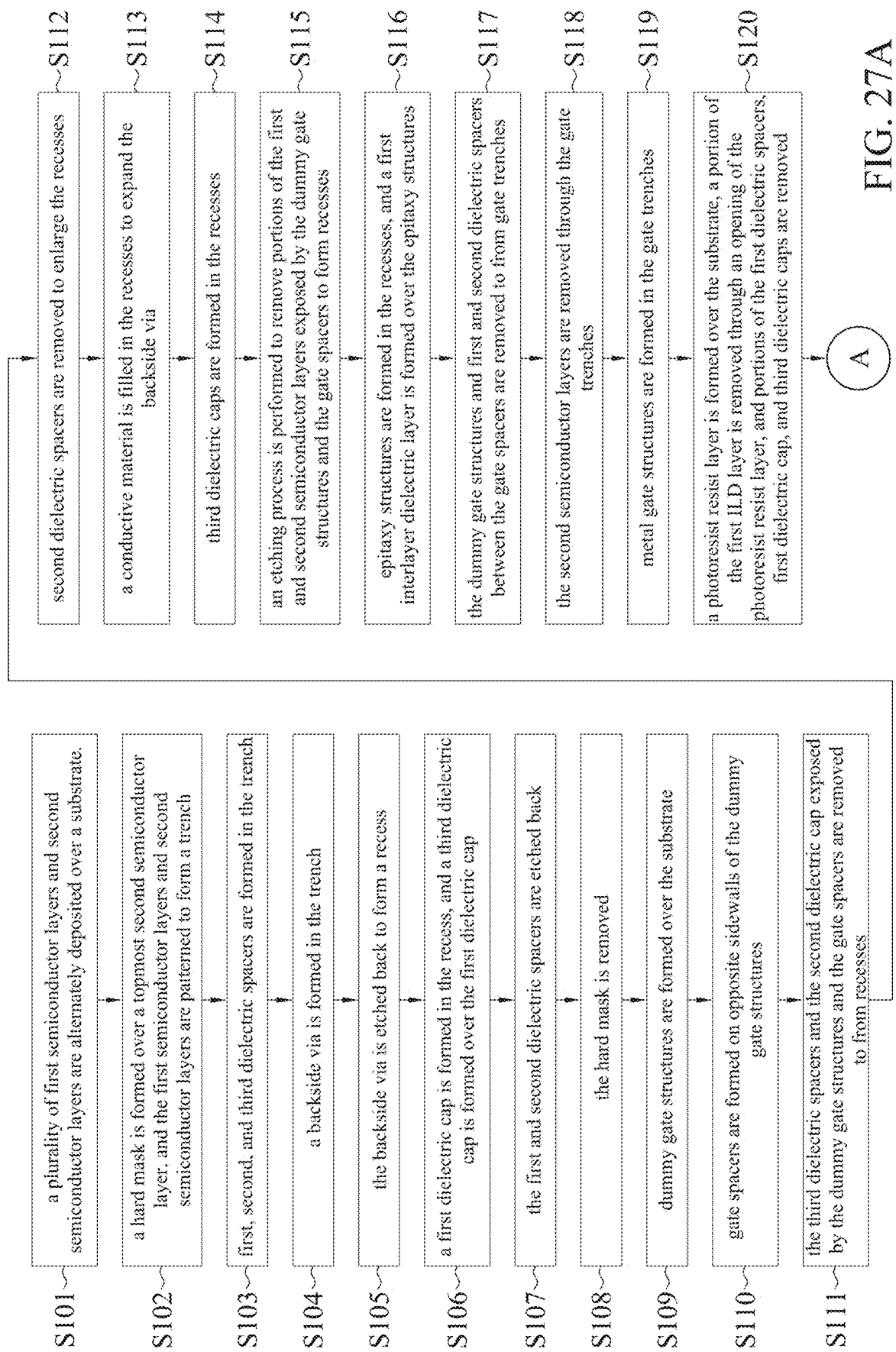

INTEGRATED CIRCUIT AND METHOD FOR FORMING THE SAME

PRIORITY CLAIM

The present application claims the priority of U.S. Provisional Application No. 63/018,277, filed Apr. 30, 2020, which is incorporated herein by reference in its entirety.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 27A and 27B illustrate a method of manufacturing an integrated circuit in accordance with some embodiments of the present disclosure.

DETAILED DESCRIPTION

Figure 1A:
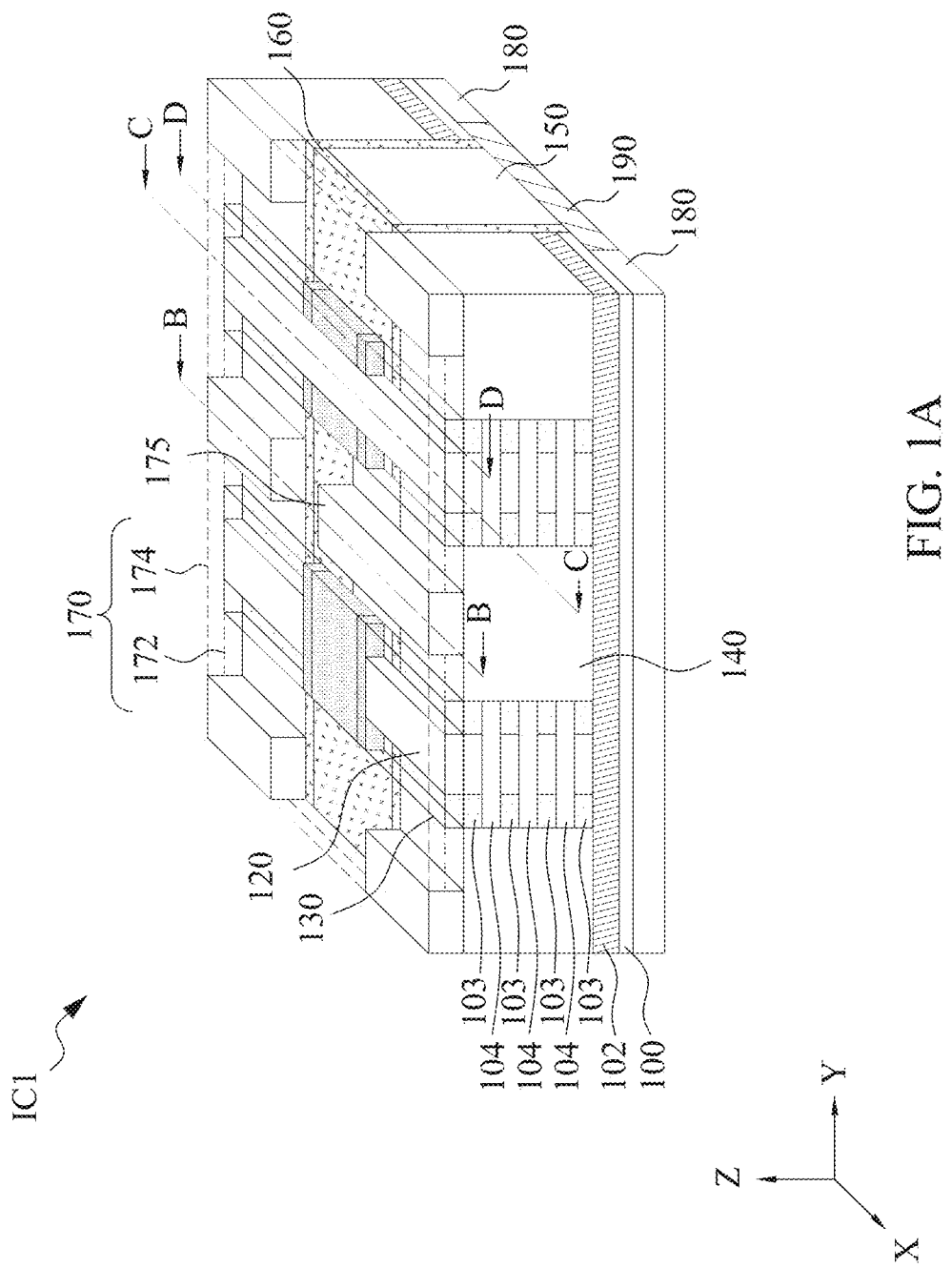
FIGS. 1A to 1E are schematic views of an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
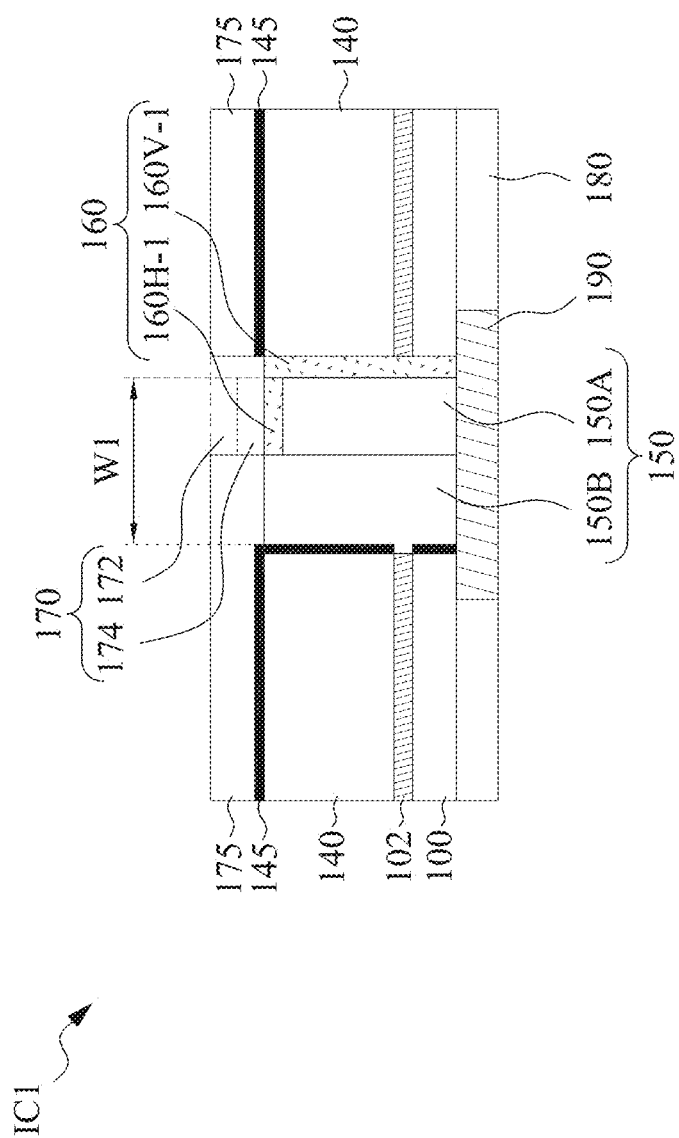
Figure 1C:
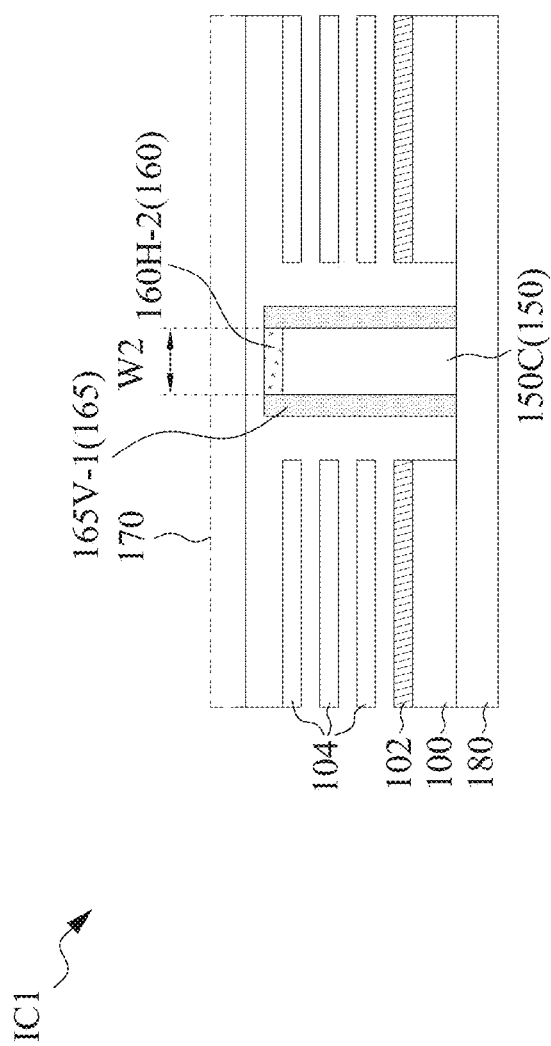
Figure 1D:
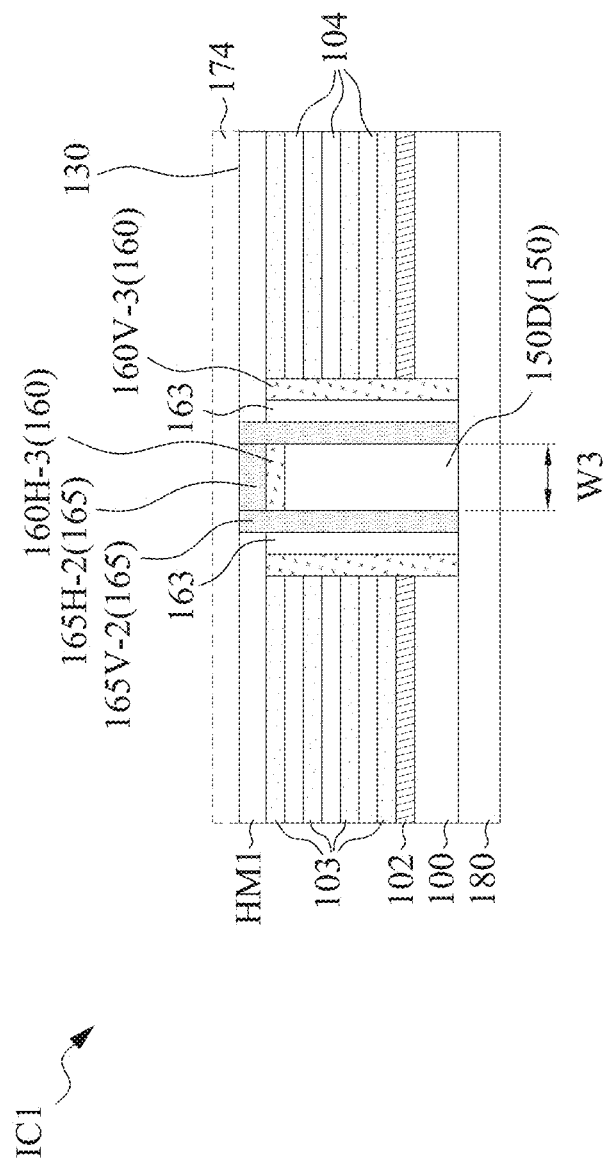
Figure 1E:
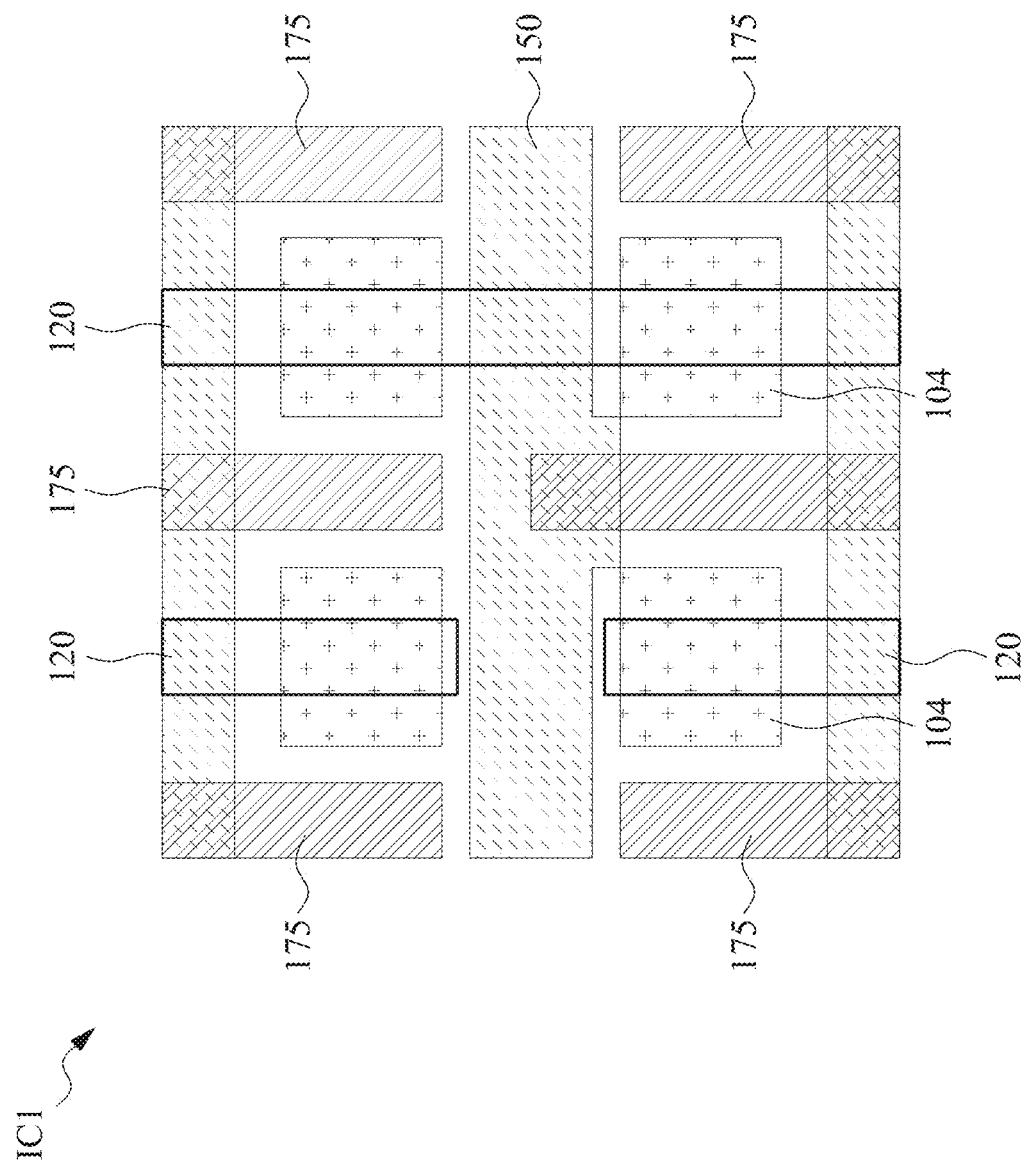

FIGS. 1A to 1E are schematic views of an integrated circuit in accordance with some embodiments of the present disclosure, in which FIG. 1A is a perspective view of an integrated circuit IC1, FIG. 1B is a cross-sectional view along line B-B of FIG. 1A, FIG. 1C is a cross-sectional view along line C-C of FIG. 1A, FIG. 1D is a cross-sectional view along line D-D of FIG. 1A, and FIG. 1E is a top view of FIG. 1A. It is noted that some elements in FIGS. 1B to 1D are not illustrated in FIGS. 1A and 1B for simplicity. It is noted that the present disclosure presents embodiments in the form of a gate-all-around (GAA) device. One of ordinary skill may recognize other examples of semiconductor devices that may benefit from aspects of the present disclosure. For example, some embodiments as described herein may also be applied to a planar device or a FinFET device.

An integrated circuit IC1 is shown. The integrated circuit IC1 includes a substrate 100. In some embodiments, the substrate 100 includes silicon. Alternatively, the substrate 100 may include germanium, silicon germanium, gallium arsenide or other appropriate semiconductor materials. Also alternatively, the substrate 100 may include an epitaxial layer.

A dielectric layer 102 is disposed on the front side of the substrate 100. In some embodiments, the dielectric layer 102 may be made of oxide, such as silicon dioxide ($SiO_2$), and thus the dielectric layer 102 can also be interchangeably referred to as an oxide layer. In some other embodiments, the dielectric layer 102 may be made of other suitable materials, such as nitride, oxynitride, or the like.

The integrated circuit IC1 further includes a plurality of semiconductor layers 104 disposed over the dielectric layer 102 and spaced apart from each other. Accordingly, the dielectric layer 102 is vertically between the substrate 100 and the semiconductor layers 104. The semiconductor layers 104 are alternately stacked on each other, and each semiconductor layer 104 is vertically spaced apart from the overlaying and underlying semiconductor layers 104. In some embodiments, the semiconductor layers 104 may be made of silicon, or other suitable materials. In some embodiments, the semiconductor layers 104 or portions thereof may serve as channel layers (or channel regions) of semiconductor devices in the integrated circuit IC1. In some embodiments, the semiconductor layers 104 may also be referred to as nanostructures, the nanostructures can be "nanosheets" or "nanowires" depending on their geometry, and these nanostructures are used to form a channel region of a semiconductor device such as a GAA transistor. The use of the semiconductor layers 104 to define a channel or channels of the semiconductor device is further provided below, and thus the semiconductor layers 104 can also be referred to as channel layers.

The integrated circuit IC1 further includes a plurality of gate structures 120 wrapping around the semiconductor layers 104. The gate structures 120 extend along a first direction (e.g., the X direction). In some embodiments, each of the gate structures 120 covers at least four sides of each of the semiconductor layers 104. In some embodiments, each of the gate structures 120 includes a gate dielectric layer, a work function metal layer over the gate dielectric layer, and a filling metal over the work function metal layer. In the cross-sectional view of FIG. 1C, the gate structures 120 are in contact with top surface and sidewalls of the dielectric layer 102, and are in contact with sidewalls of the substrate 100. In some embodiments, the topmost surface of the substrate 100 is separated from the gate structures 120 by the dielectric layer 102.

In some embodiments, the gate dielectric layers may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer may include oxide layers. The work function metal layer may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The filling metal may include tungsten (W), aluminum (Al), copper (Cu), or other suitable conductive material.

The integrated circuit IC1 further includes a plurality of gate spacers 130 disposed on opposite sidewalls of the gate structures 120. In some embodiments, the gate spacers 130 may include $SiO_2$, $Si_3N_4$, $SiO_xN_y$, SiC, SiCN films, SiOC, SiOCN films, and/or combinations thereof.

The integrated circuit IC1 further includes a plurality of semiconductor layers 103 between the semiconductor layers 104. In some embodiments, the semiconductor layers 103 are vertically below the gate spacers 120, and are in contact with sidewalls of the gate structures 120.

The integrated circuit IC1 further includes a plurality of source/drain epitaxy structures 140. The source/drain epitaxy structures 140 are disposed on opposite sides of the gate structures 120 and are in contact with sidewalls of the semiconductor layers 104, as shown in FIG. 1A. In some embodiments, at least two source/drain epitaxy structures 140 are disposed on opposite sides of a dummy gate structure 110 along a second direction (e.g., the Y-direction). In some embodiments, the semiconductor layers 104, the gate structure 120, and the source/drain epitaxy structures 140 on opposite sides of the semiconductor layers 104 and the gate structure 120 form a GAA transistor within the integrated circuit IC1, in which the semiconductor layers 104 serve as a channel region of the transistor, the gate structure 120 serves as a gate region of the transistor, and the source/drain epitaxy structures 140 serve as source/drain regions of the transistor. In some embodiments, the source/drain epitaxy structures 140 can also be interchangeably referred to as source/drain structures. In various embodiments, the source/drain epitaxy structures 140 may include Ge, Si, GaAs, AlGaAs, SiGe, GaAsP, SiP, or other suitable material.

In the cross-sectional view of FIG. 1B, the integrated circuit IC1 further includes silicide layers 145 having a first portion disposed on surfaces of the source/drain epitaxy structures 140 and a second portion disposed on a sidewall of the substrate 100. In some embodiments, the silicide layers 145 may include $CoSi_2$, $TiSi_2$, $WSi_2$, $NiSi_2$, $MoSi_2$, $TaSi_2$, PtSi, or the like. In some embodiments, the surface of the dielectric layer 102 is free of coverage of the silicide layers 145. Accordingly, a gap is present vertically between the first and second portions of the silicide layers 145.

The integrated circuit IC1 further includes a backside via 150 adjacent to the source/drain epitaxy structures 140 and the gate structures 120. In some embodiments, the gate structures 120 extend along the first direction (e.g., the X direction), while the backside via 150 extends along a second direction (e.g., the Y direction) substantially perpendicular to the first direction. In some embodiments, the backside via 150 may be a conductive material, and may be made of metal, such as copper (Cu), aluminum (Al), ruthenium (Ru), cobalt (Co), molybdenum (Mo), nickel (Ni), tungsten (W), or the like.

In the cross-sectional view of FIG. 1B, in which FIG. 1B is a cross-sectional view of the source/drain epitaxy structures 140, the backside via 150 includes a first portion 150A and a second portion 150B connected to the first portion 150A, in which the first portion 150A and the second portion 150B are laterally between two source/drain epitaxy structures 140 along the first direction (e.g., the X direction). The second portion 150B of the backside via 150 is in contact with the silicide layers 145, and is therefore electrically connected to at least one epitaxy structure 140 (e.g., the epitaxy structure 140 on the left side of FIG. 1B). In some embodiments, the second portion 150B of the backside via 150 is in contact with the sidewall of the dielectric layer 102. In some embodiments, the top surface of the first portion 150A is lower than the top surface of the second portion 150B. In some embodiments, the first portion 150A and the second portion 150B may be made of the same material. In some other embodiments, the first portion 150A and the second portion 150B may be made of different materials, and may include a distinguishable interface therebetween.

In the cross-sectional view of FIG. 1C, which is a cross-sectional view of the gate structure 120 along the C-C cut as illustrated in FIG. 1A, the backside via 150 includes a third portion 150C adjacent to portions of the gate structure 120. For example, the gate structure 120 shown in FIG. 1C crosses the third portion 150C of the backside via 150, such that the third portion 150C of the backside via 150 is at least under a portion of the gate structure 120. In some embodiments, the third portion 150C of the backside via 150 has the same material as the first portion 150A of the backside via 150 of FIG. 1C.

In the cross-sectional view of FIG. 1D, which is a cross-sectional view of gate spacers 130, the backside via 150 includes a fourth portion 150D adjacent to the semiconductor layers 103. In some embodiments, the fourth portion 150D of the backside via 150 has the same material as the first portion 150A of the backside via 150 of FIG. 1C.

Referring to FIGS. 1B to 1D, the first and second portions 150A, 150B of the backside via 150 has a total width W1, the third portion 150C of the backside via 150 has a width W2, and the fourth portion 150D of the backside via 150 has a width W3, in which the width W1 is greater than the widths W2 and W3. That is, along the first direction (e.g., X direction), the width W1 of the backside via 150 in a cross-sectional view cut on the source/drain epitaxy structures 140 is greater than the width W2 of the backside via 150 in a cross-sectional view cut on the gate structure 120, and is also greater than the width W3 of the backside via 150 in a cross-sectional view cut on the gate spacers 130. In some embodiments, the width W2 is substantially equal to the width W3.

In the cross-sectional view of FIG. 1B, the integrated circuit IC1 further includes a first dielectric spacer 160. In some embodiments, the first dielectric spacer 160 has an inverted L-shape cross-section. For example, the first dielectric spacer 160 may include a vertical portion 160V-1 and a horizontal portion 160H, in which the vertical portion 160V-1 extends along the sidewall of the first portion 150A of the backside via 150, and the horizontal portion 160H-1 extends along the top surface of the first portion 150A of the backside via 150. In some embodiments, the horizontal portion 160H of the first dielectric spacer 160 is in contact with a sidewall of the second portion 150B of the backside via 150, while the top surface of the second portion 150B of the backside via 150 is free of coverage of the first dielectric spacer 160. In some embodiments, the first dielectric spacer 160 at least separates the backside via 150 from one epitaxy structure 140 (e.g., the epitaxy structure 140 on the right side of FIG. 1B). That is, along the first direction (e.g., X direction), the backside via 150 is between two source/drain epitaxy structures 140, and the backside via 150 is electrically connected to one epitaxy structure 140 through the silicide layer 145, and is separated from another one epitaxy structure 140 by the first dielectric spacer 160. In some embodiments, the first dielectric spacer 160 may be made of $SiO_2$, SiC, SiOC, SiCN, $Si_3N_4$, SiCNO, $TiO_2$, or other suitable dielectric materials.

In the cross-sectional view of FIG. 1C, the first dielectric spacer 160 has a horizontal portion 160H-2 extending along the top surface of the third portion 150C of the backside via 150. Moreover, the integrated circuit IC1 further includes a second dielectric spacer 165 having vertical portions 165V-1 disposed on opposite sidewalls of the third portion 150C of the backside via 150. In some embodiments, the vertical portions 165V-1 of the second dielectric spacer 165 are in contact with opposite sidewalls of the horizontal portion 160H-2 of the first dielectric spacer 160, respectively. Accordingly, the top surfaces of the vertical portions 165V-1 of the second dielectric spacers 165 are higher than the top surface of the third portion 150C of the backside via 150. In some embodiments, in the cross-sectional view of FIG. 1C, the horizontal portion 160H-2 of the first dielectric spacer 160 and the vertical portions 165V-1 of the second dielectric spacers 165 separate the third portion 150C of the backside via 150 from the gate structure 120. In some embodiments, the second dielectric spacers 165 may be made of $SiO_2$, SiC, SiOC, SiCN, $Si_3N_4$, SiCNO, $TiO_2$, other suitable dielectric materials, or combinations thereof. In some embodiments, the first dielectric spacer 160 and the second dielectric spacers 165 are made of different dielectric materials.

In the cross-sectional view of FIG. 1D, the first dielectric spacer 160 includes a horizontal portion 160H-3 extending along a top surface of the fourth portion 150D of the backside via 150. The first dielectric spacer 160 further includes vertical portions 160V-3 extending along sidewall surfaces of the semiconductor layers 104. In greater detail, the vertical portions 160V-3 of the first dielectric spacer 160 are in contact with the semiconductor layers 104, the semiconductor layers 103, the dielectric layer 102, and the substrate 100.

Moreover, the second dielectric spacer 165 includes a horizontal portion 165H-2 and vertical portions 165V-2. In some embodiments, the horizontal portion 165H-2 of the second dielectric spacer 165 is over the horizontal portion 160H-3 of the first dielectric spacer 160. That is, the horizontal portion 160H-3 of the first dielectric spacer 160 is vertically between the fourth portion 150D of the backside via 150 and the horizontal portion 165H-2 of the second dielectric spacer 165. The vertical portions 165V-2 are disposed on opposite sidewalls of the fourth portion 150D of the backside via 150. In some embodiments, the vertical portions 165V-2 of the second dielectric spacer 165 are in contact with opposite sidewalls of the horizontal portion 160H-3 of the first dielectric spacer 160, respectively. In some embodiments, the vertical portions 165V-2 of the second dielectric spacer 165 are in contact with the sidewalls of the gate spacers 130.

The integrated circuit IC1 further includes third dielectric spacers 163, in which one of the third dielectric spacers 163 is between the vertical portion 160V-3 of the first dielectric spacer 160 and the vertical portion 165V-2 of the second dielectric spacer 165. That is, the vertical portion 160V-3 of the first dielectric spacer 160 is separated from the vertical portion 165V-2 of second dielectric spacer 165 by the third dielectric spacer 163. In some embodiments, top surfaces of the third dielectric spacers 163 are in contact with the gate spacers 130. That is, the third dielectric spacers 163 are vertically below the gate spacers 130. In some embodiments, the third dielectric spacers 163 are absent in the cross-sectional views of FIGS. 1B and 1C. For example, the third dielectric spacers 163 are not vertically below the gate structures 120, as shown in FIG. 1C. In some embodiments, the third dielectric spacers 163 may be made of $SiO_2$, SiC, SiOC, SiCN, $Si_3N_4$, SiCNO, $TiO_2$, or other suitable dielectric materials. In some embodiments, the first dielectric spacer 160, the second dielectric spacer 165, and the third dielectric spacers 163 are made of at least two different dielectric materials.

The integrated circuit IC1 further includes a lower interlayer dielectric (ILD) layer 172 over the source/drain epitaxy structures 140 and laterally surrounding the gate structures 120, and an upper interlayer dielectric (ILD) layer 174 over the lower ILD layer 172 and covering the gate structures 120. In some embodiments, the lower and upper ILD layers 172 and 174 may be collectively referred to as ILD layer 170. In some embodiments, the lower and upper ILD layers 172 and 174 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bisbenzocyclobutenes (BCB), or polyimide. In some embodiments, a contact etch stop layer (CESL) (not shown) may be optionally formed between the lower ILD layer 172 and the source/drain epitaxy structures 140. The CESL may include material different from the lower ILD layer 172, thus resulting in different etch selectivity between CESL and the lower ILD layer 172. In some embodiments, the CESL includes silicon nitride, silicon oxynitride or other suitable materials.

The integrated circuit IC1 further includes a plurality of source/drain contacts 175 disposed over the source/drain epitaxy structures 140, respectively. As shown in the cross-sectional view of FIG. 1B, the source/drain contacts 175 extend through the ILD layer 170 to the top surfaces of the silicide layers 145, and are electrically connected to the corresponding source/drain epitaxy structures 140. In some embodiments, the source/drain contacts 175 may include a liner and a filling metal. The liner is between filling metal and the underlying source/drain epitaxy structures 140. In some embodiments, the liner assists with the deposition of filling metal and helps to reduce out-diffusion of filling metal through the ILD layer 170. In some embodiments, the liner includes titanium (Ti), titanium nitride (TiN), tantalum (Ta), tantalum nitride (TaN), or another suitable material. The filling metal includes a conductive material, such tungsten (W), copper (Cu), aluminum (Al), ruthenium (Ru), cobalt (Co), molybdenum (Mo), nickel (Ni), or other suitable conductive material.

The integrated circuit IC1 further includes a backside dielectric layer 180 disposed on the back side of the substrate 100, and backside metal lines 190 in the backside dielectric layer 180. In the cross-sectional view of FIGS. 1A and 1B, at least one backside metal line 190 extends along and is in contact with the backside surface of the substrate 100, the backside surface of the backside via 150, and the backside surface of the first dielectric spacer 160. In some embodiments, the backside metal line 190 is electrically connected to at least one epitaxy structure 140 (e.g., the epitaxy structure 140 on the left side of FIG. 1B) through the backside via 150 and the silicide layers 145, and is also electrically connected to the source/drain contact 175 through the backside via 150. In some embodiments, the material of the backside dielectric layer 180 may be similar to the lower and upper ILD layers 172 and 174. In some embodiments, the backside metal lines 190 may include copper (Cu), aluminum (Al), ruthenium (Ru), cobalt (Co), molybdenum (Mo), nickel (Ni), tungsten (W), or the like.

In some embodiments, one or more of the backside metal lines 190 may act as one or more backside power rails (e.g., VDD and/or VSS power rails) at the backside of the substrate 100, and thus the backside metal lines 190 can be interchangeably referred to as backside power line or backside power rail in this context. In some embodiments when the backside metal line 190 acts as a backside power rail, the corresponding epitaxy structure 140 (e.g., the epitaxy structure 140 on the left side of FIG. 1B) electrically coupled to the backside power rail 190 acts as a source epitaxy structure, and the corresponding source/drain contact 175 (e.g., the source/drain contact 175 on the left side of FIG. 1B) electrically coupled to the source epitaxy structure 140 can be referred to as a source contact.

FIGS. 2 to 26C illustrate a method in various stages of fabricating the integrated circuit IC1 of FIGS. 1A to 1D in accordance with some embodiments of the present disclosure.

Figure 2:
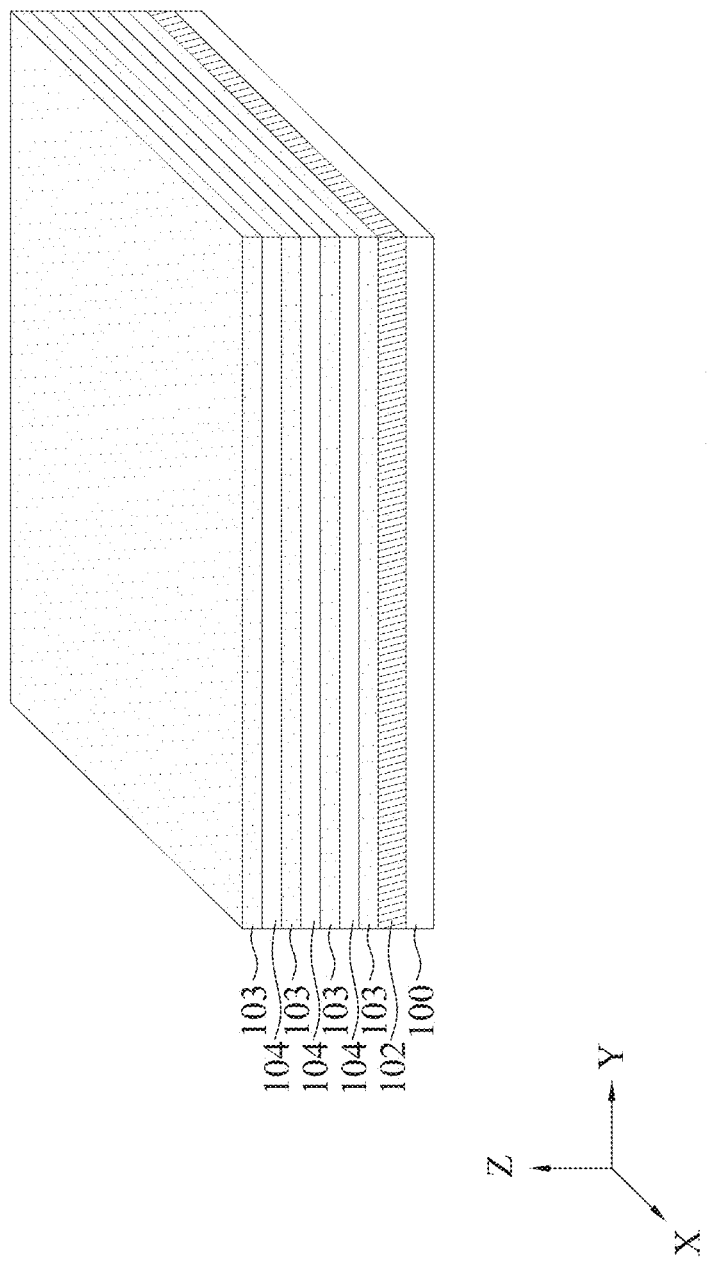
FIGS. 2 to 26C illustrate a method in various stages of fabricating an integrated circuit in accordance with some embodiments of the present disclosure.

Reference is made to FIG. 2. Shown there is a substrate 100. In some embodiments, the substrate 100 may include semiconductor material, such as silicon. Next, a dielectric layer 102 is formed over the substrate 100. In some embodiments, the dielectric layer 102 may be formed by suitable deposition process.

A plurality of semiconductor layers 103 and semiconductor layers 104 are alternately deposited over the substrate 100. The semiconductor layers 103 and the semiconductor layers 104 have different materials and/or components, such that the semiconductor layers 103 and the semiconductor layers 104 have different etching selectivity. In some embodiments, the semiconductor layers 103 are made from SiGe. The germanium percentage (atomic percentage concentration) of the semiconductor layers 103 is in the range between about 10 percent and about 20 percent, while higher or lower germanium percentages may be used. It is appreciated, however, that the values recited throughout the description are examples, and may be changed to different values. For example, the semiconductor layers 103 may be $Si_xGe_y$, e.g., $Si_{0.8}Ge_{0.2}$ or $Si_{0.9}Ge_{0.1}$, in which the relative proportion of Si and Ge may vary between embodiments and within layers, and the disclosure is not limited thereto. The semiconductor layers 104 may be pure silicon layers that are free from germanium. The semiconductor layers 104 may also be substantially pure silicon layers, for example, with a germanium percentage lower than about 1 percent. In some embodiments, the semiconductor layers 103 have a higher germanium atomic percentage concentration than the semiconductor layers 104. The semiconductor layers 103 and 104 may be formed by chemical vapor deposition (CVD), molecular beam epitaxy (MBE), or other suitable process(es). In some embodiments, the semiconductor layers 103 and 104 are formed by an epitaxy growth process, and thus the semiconductor layers 103 and 104 can also be referred to as epitaxial layers in this content.

Figure 3:
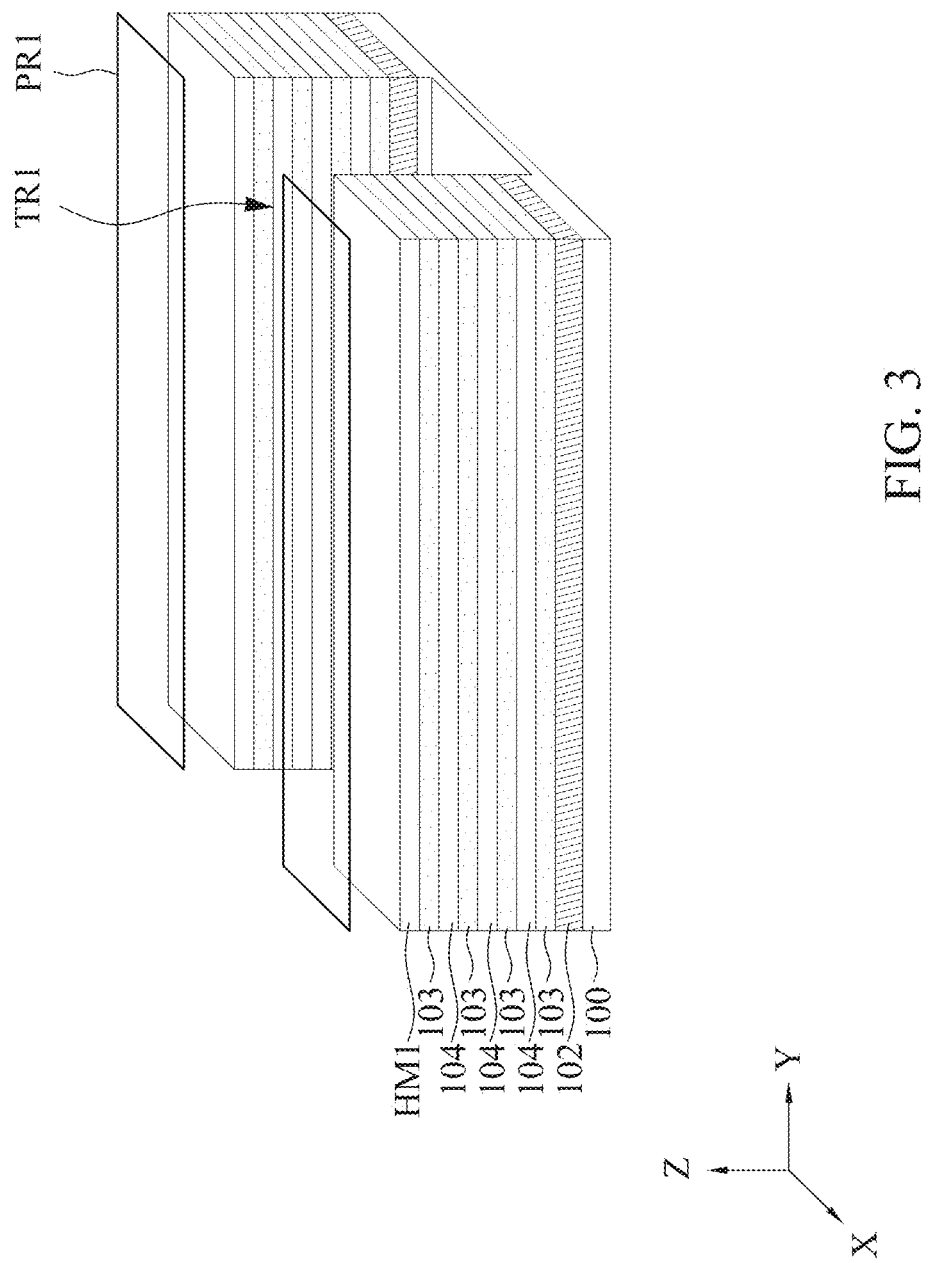

Reference is made to FIG. 3. A hard mask HM1 is formed over the substrate 100 and covering the topmost one of the semiconductor layers 103. In some embodiments, the hard mask HM1 is formed of silicon nitride, for example, using low-pressure chemical vapor deposition (LPCVD) or plasma enhanced chemical vapor deposition (PECVD). The hard mask HM1 serves as a hard mask during subsequent patterning operations. In some embodiments, a pad layer may be optionally formed prior to forming the hard mask HM1. The pad layer a may be a thin film having silicon oxide formed, for example, using a thermal oxidation operation. The pad layer may act as an adhesion layer between the semiconductor layer 103 and the hard mask HM1.

A photoresist layer PR1 is formed over the hard mask HM1. In some embodiments, the photoresist layer PR1 may be formed by suitable photolithography process. Next, an etching process is performed, through the photoresist layer PR1, to remove portions of the hard mask HM1, the semiconductor layers 103, 104, the dielectric layer 102, and the substrate 100, so as to form a trench TR1 in the hard mask HM1, the semiconductor layers 103, 104, the dielectric layer 102, and the substrate 100. In some embodiments, the trench TR1 exposes sidewalls of the hard mask HM1, the semiconductor layers 103, 104, the dielectric layer 102, and the substrate 100, and exposes a top surface of the substrate 100.

In some embodiments, the etching process may include wet etch, dry etch, or combinations thereof.

Figure 4A:
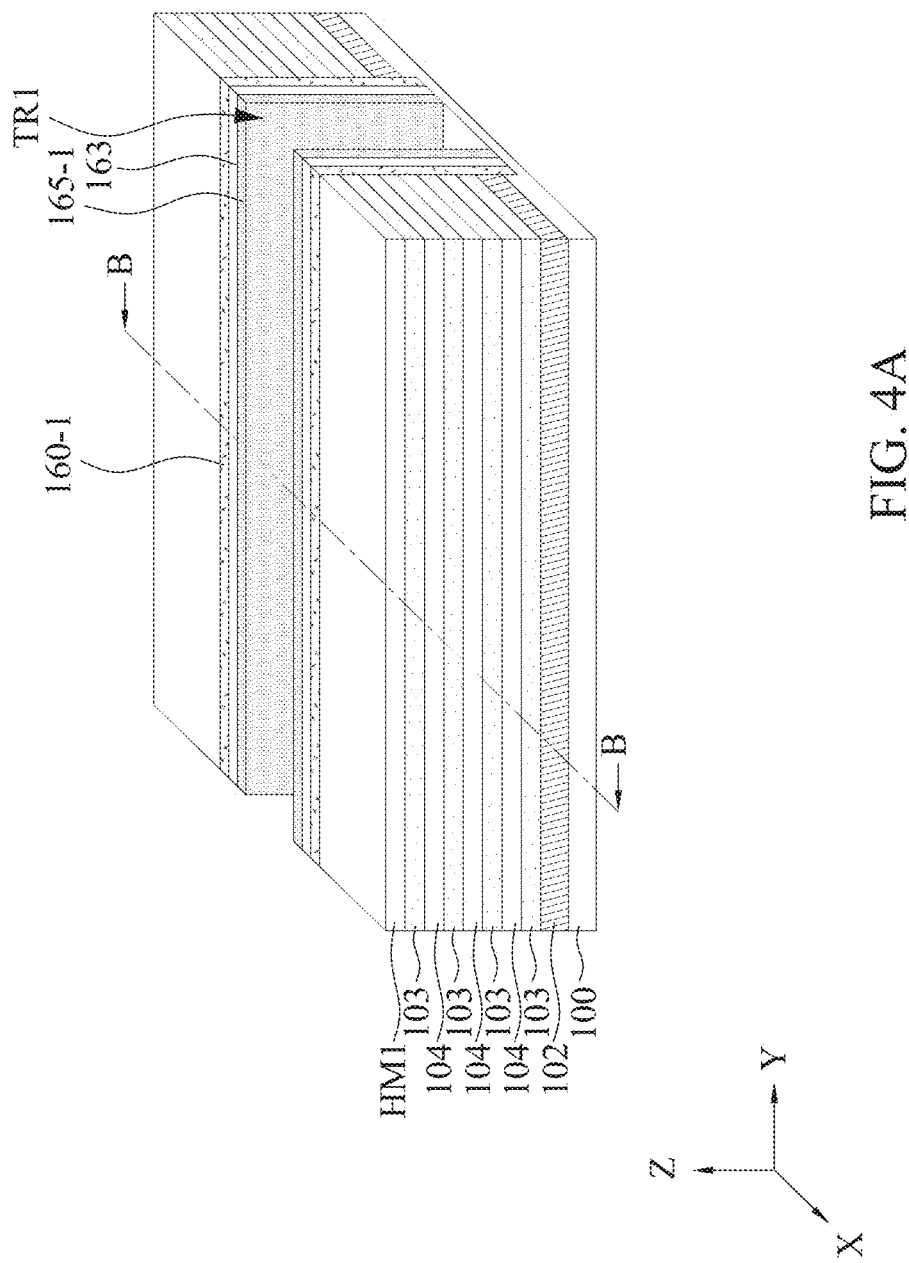
Figure 4B:
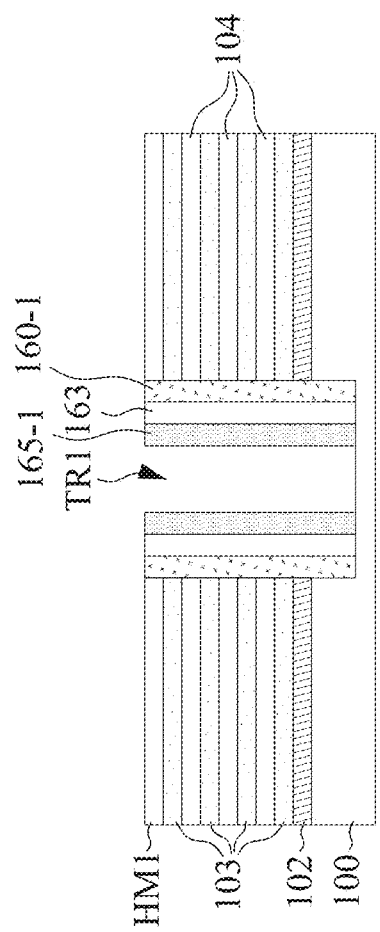

Reference is made to FIGS. 4A and 4B, in which FIG. 4B is a cross-sectional view along line B-B of FIG. 4A. Dielectric spacers 160-1, 163, 165-1 are formed in the trench TR1. In some embodiments, the dielectric spacers 160-1 line the sidewall surfaces of the hard mask HM1, the semiconductor layers 103, 104, the dielectric layer 102, and the substrate 100. The third dielectric spacers 163 line the sidewalls of the dielectric spacers 160-1, and the dielectric spacers 165-1 line the sidewalls of the third dielectric spacers 163. After the dielectric spacers 160-1, 163, 165-1 are formed, a portion of the top surface of the substrate 100 is exposed by the dielectric spacers 160-1, 163, 165-1. In some embodiments, each of the dielectric spacers 160-1, 163, 165-1 has a substantially linear shape. In some embodiments, each of the dielectric spacers 160-1, 163, 165-1 may be formed by, for example, depositing a dielectric material blanket over the substrate, followed by an etching process to remove horizontal portions of the dielectric material and leave the vertical portions of the dielectric material in the trench TR1. In some embodiments, the dielectric spacers 160-1, 163, 165-1 may be made of $SiO_2$, SiC, SiOC, SiCN, $Si_3N_4$, SiCNO, $TiO_2$, or other suitable dielectric materials. In some embodiments, the dielectric spacers 160-1, 163, 165-1 are formed from at least two different materials so as to provide etching selectivity between the structures. In some embodiments, for example, the first and third dielectric spacers 160-1, 163 are made of different materials, in some embodiments the second and third dielectric spacers 165-1, 163, are made of different materials, and in some embodiments the first and second dielectric spacers 160-1, 165-1 are made of different materials, and, in some embodiments, each of the first, second, and third dielectric spacers is made of a different material.

Figure 5A:
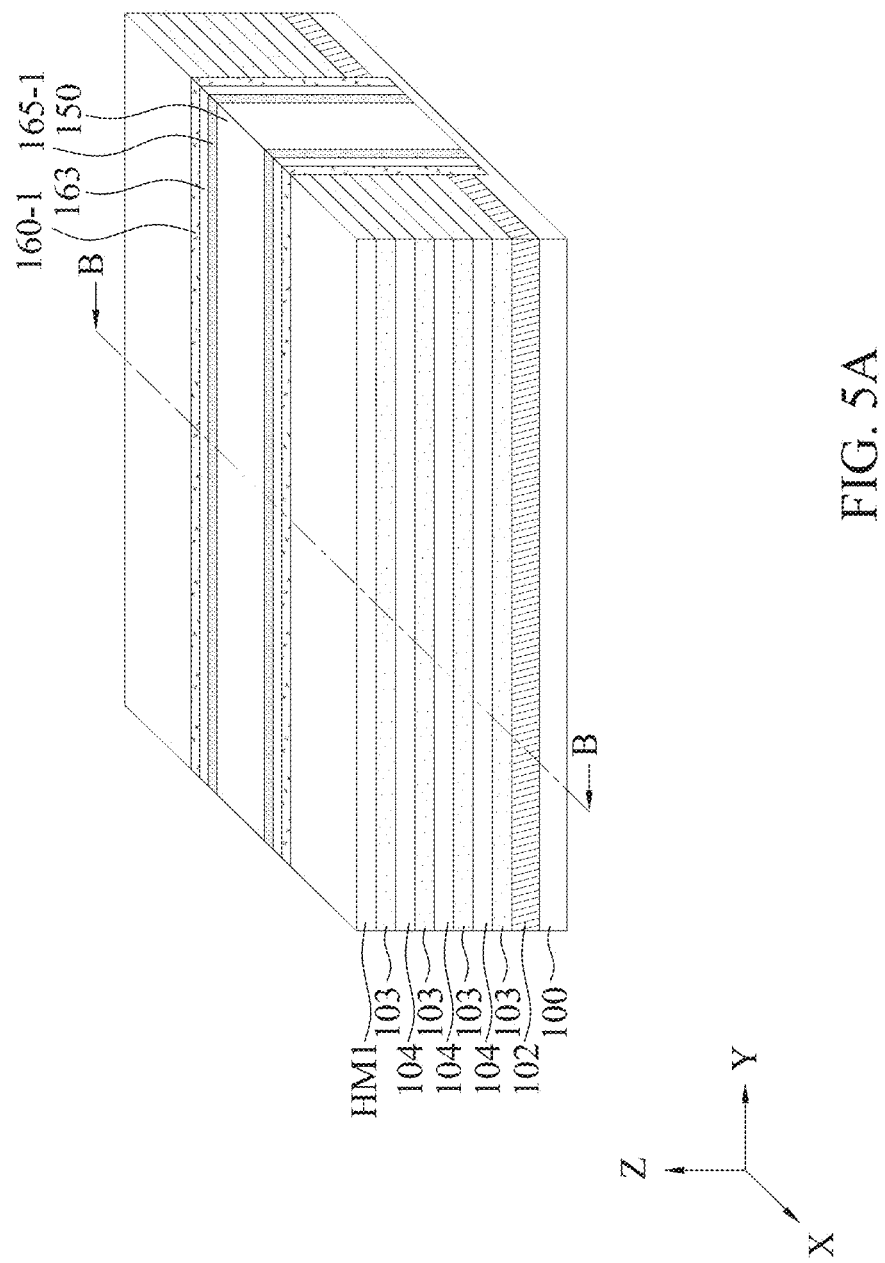
Figure 5B:
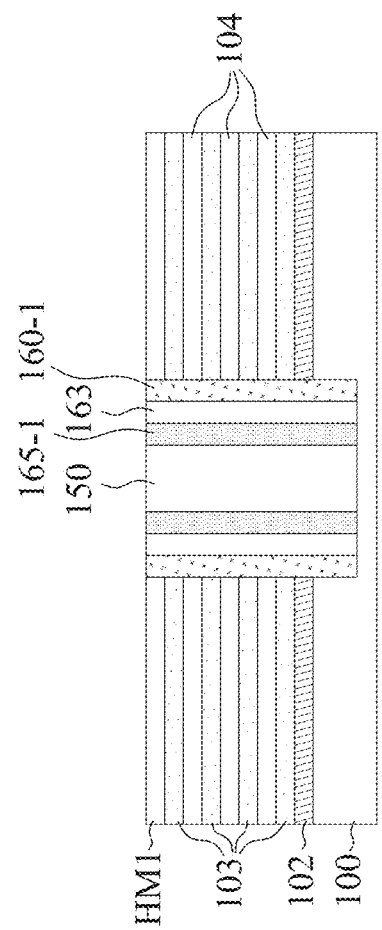

Reference is made to FIGS. 5A and 5B, in which FIG. 5B is a cross-sectional view along line B-B of FIG. 5A. A backside via 150 is formed in the trench TR1. In some embodiments, the backside via 150 is formed between the groupings of dielectric spacers 160-1, 163, 165-1, and fills the space between the dielectric spacers 165-1 provided on opposing sidewalls whereby the pair of dielectric spacers 165-1 line opposite sidewalls of the backside via 150, respectively. In some embodiments, the backside via 150 may be a conductive material, and may be made of metal, such as copper (Cu), aluminum (Al), ruthenium (Ru), cobalt (Co), molybdenum (Mo), nickel (Ni), tungsten (W), or the like. In some embodiments, the backside via 150 may be formed by, for example, depositing a conductive material over the substrate 100 and filling the trench TR1, followed by a CMP process to remove excess conductive material until top surface of the hard mask HM1 is exposed. Accordingly, the remaining portion of the conductive material in the trench TR1 is referred to as backside via 150.

Figure 6A:
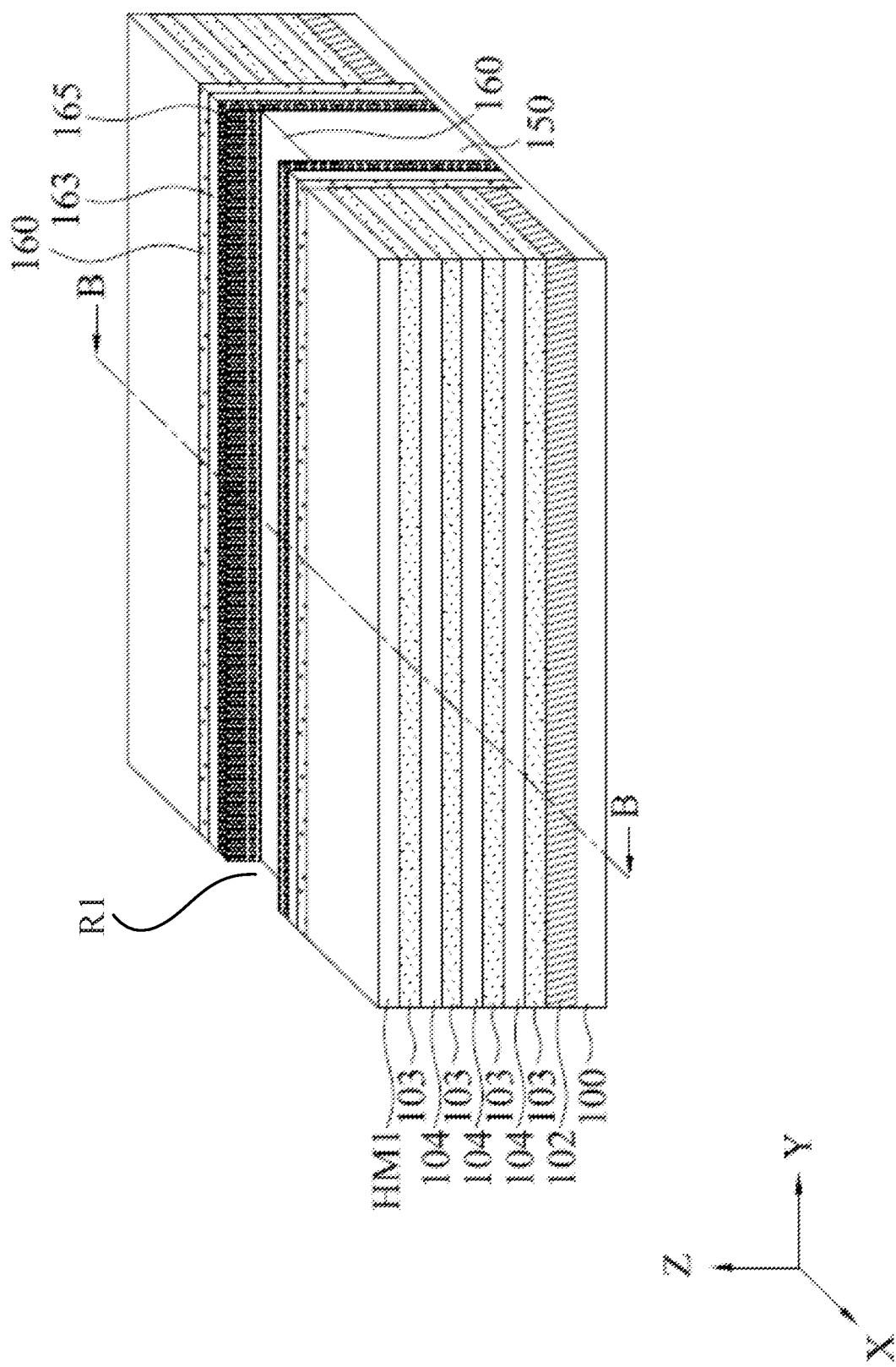
Figure 6B:
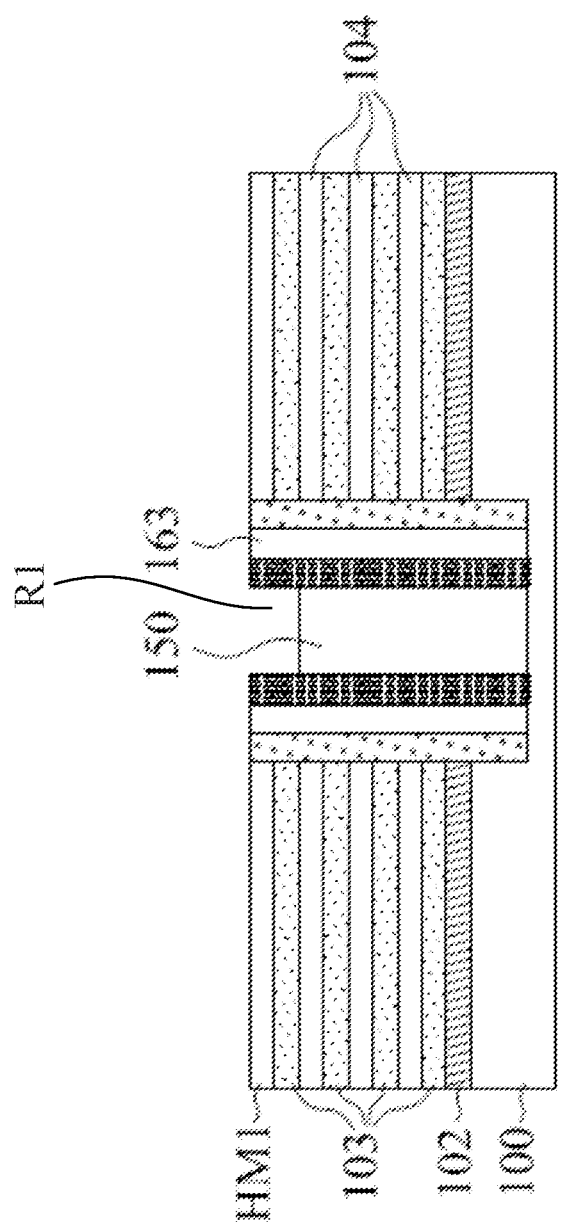

Reference is made to FIGS. 6A and 6B, in which FIG. 6B is a cross-sectional view along line B-B of FIG. 6A. The backside via 150 is etched back to form a recess R1 between the dielectric spacers 165-1. That is, the etching back process is performed to lower the top surface of the backside via 150 to a level lower than top surfaces of the dielectric spacers 160-1, 163, 165-1. In some embodiments, the etching process may include wet etch, dry etch, or combinations thereof.

Figure 7A:
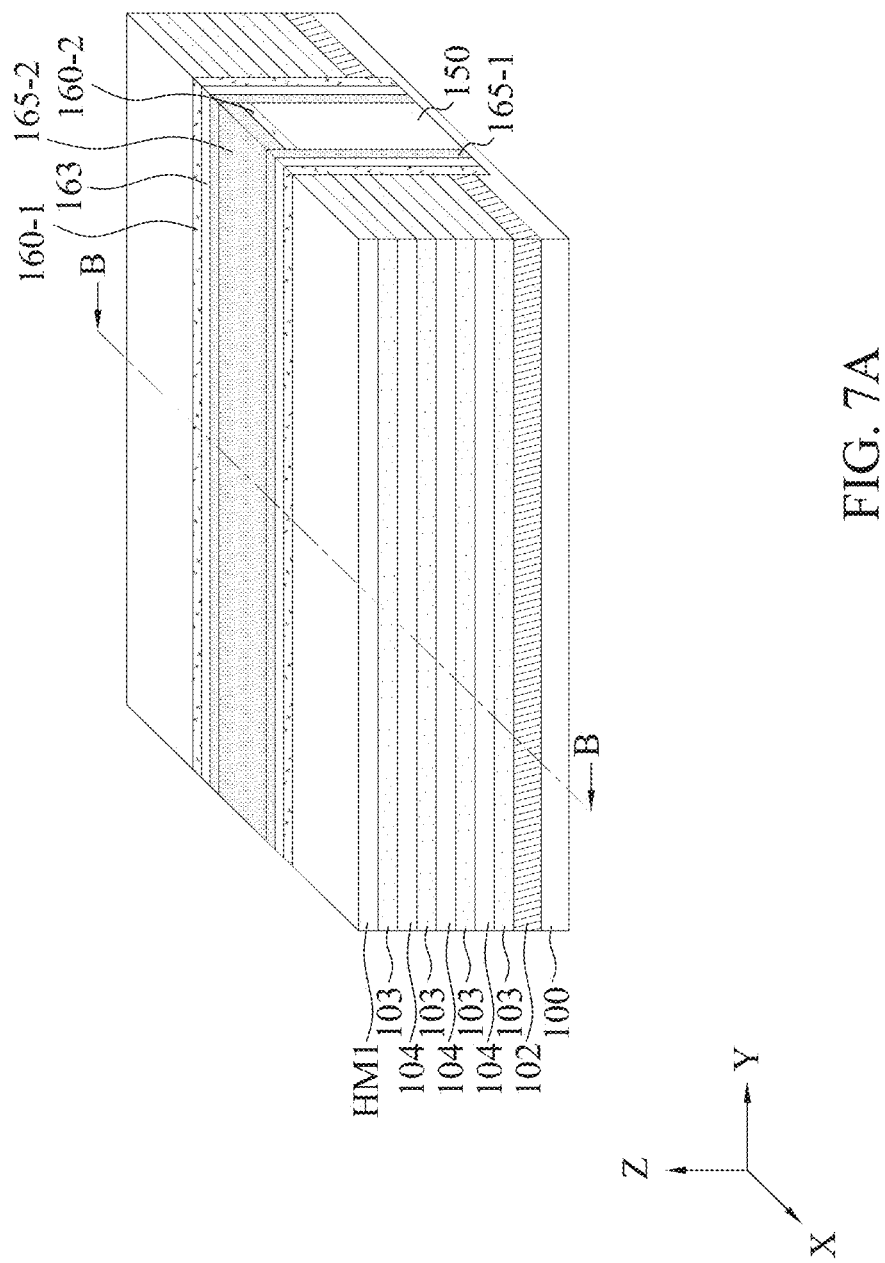
Figure 7B:
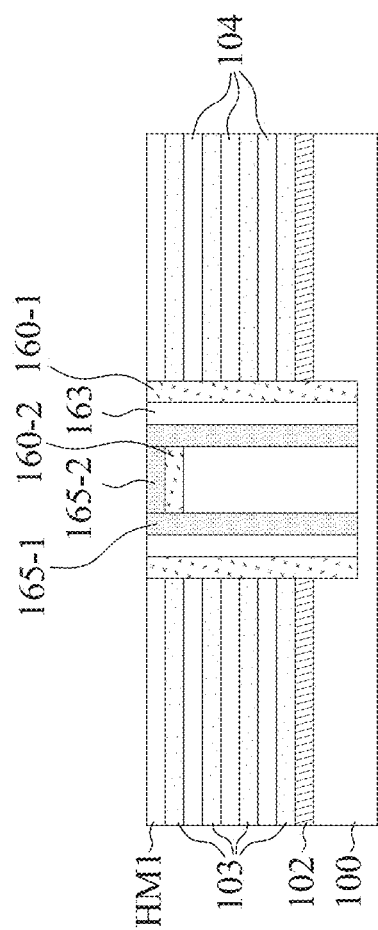

Reference is made to FIGS. 7A and 7B, in which FIG. 7B is a cross-sectional view along line B-B of FIG. 7A. A dielectric cap 160-2 is formed in the recess R1 (see FIGS. 6A and 6B) and caps the etched back backside via 150, and a dielectric cap 165-2 is formed in the recess R1 and over the dielectric cap 160-2. In some embodiments, the dielectric cap 160-2 is made of the same material as the dielectric spacer 160-1, and the dielectric cap 165-2 is made of the same material as the dielectric spacer 165-1, respectively. In some embodiments, the dielectric cap 160-2 may be formed by, for example, depositing a dielectric material over the substrate 100 and filling the recess R1, optionally performing a CMP process to level the top surface of the dielectric material with the top surface of the hard mask HM1, and then performing an etching back process to lower the top surface of the dielectric material to a level lower than the top surfaces of the dielectric spacers 160-1, 163, 165-1. In some embodiments, the dielectric spacer 160-1 may be recessed by the etching back process, because the dielectric cap 160-2 includes the same material as the dielectric spacer 160-1. In some embodiments, the dielectric cap 165-2 may be formed by, for example, depositing a dielectric material filling the recess R1 and over the dielectric cap 160-2, and performing a CMP process to level the top surface of the dielectric material with the top surface.

Figure 8A:
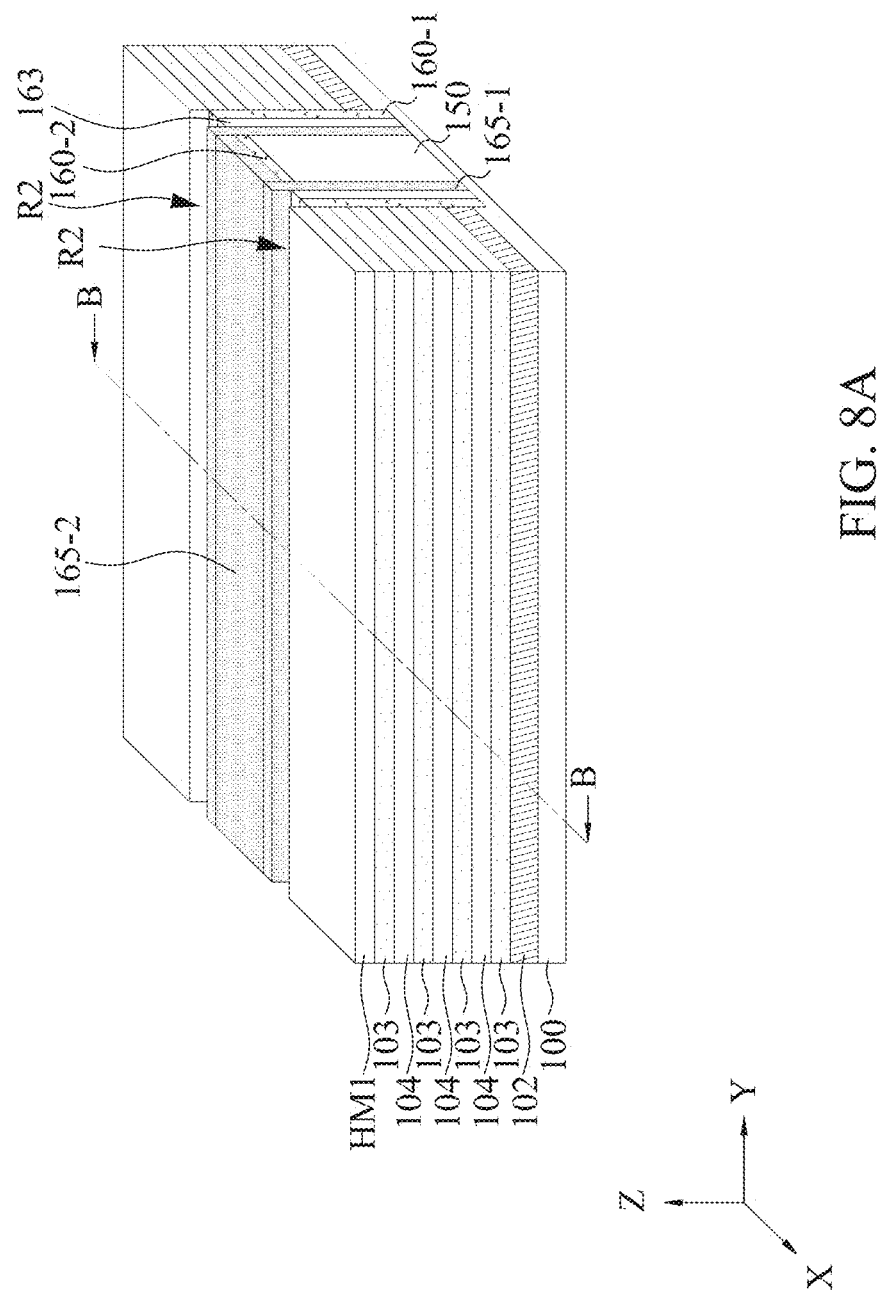
Figure 8B:
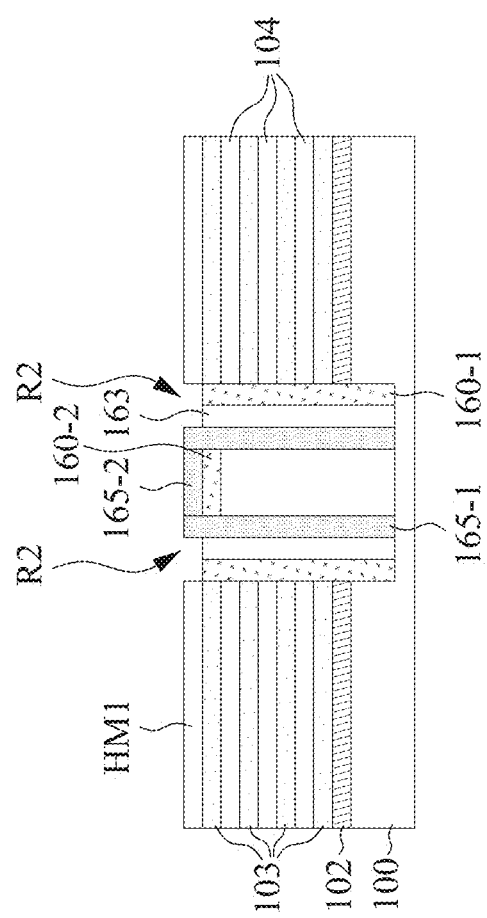

Reference is made to FIGS. 8A and 8B, in which FIG. 8B is a cross-sectional view along line B-B of FIG. 8A. The dielectric spacers 160-1 and 163 are etched back to form recesses R2. That is, the etching back process is performed to lower the top surfaces of the dielectric spacers 160-1 and 163 to a level lower than top surfaces of the dielectric spacers 165-1 and the hard mask HM1. In some embodiments, the etching process may include wet etch, dry etch, or combinations thereof.

Figure 9A:
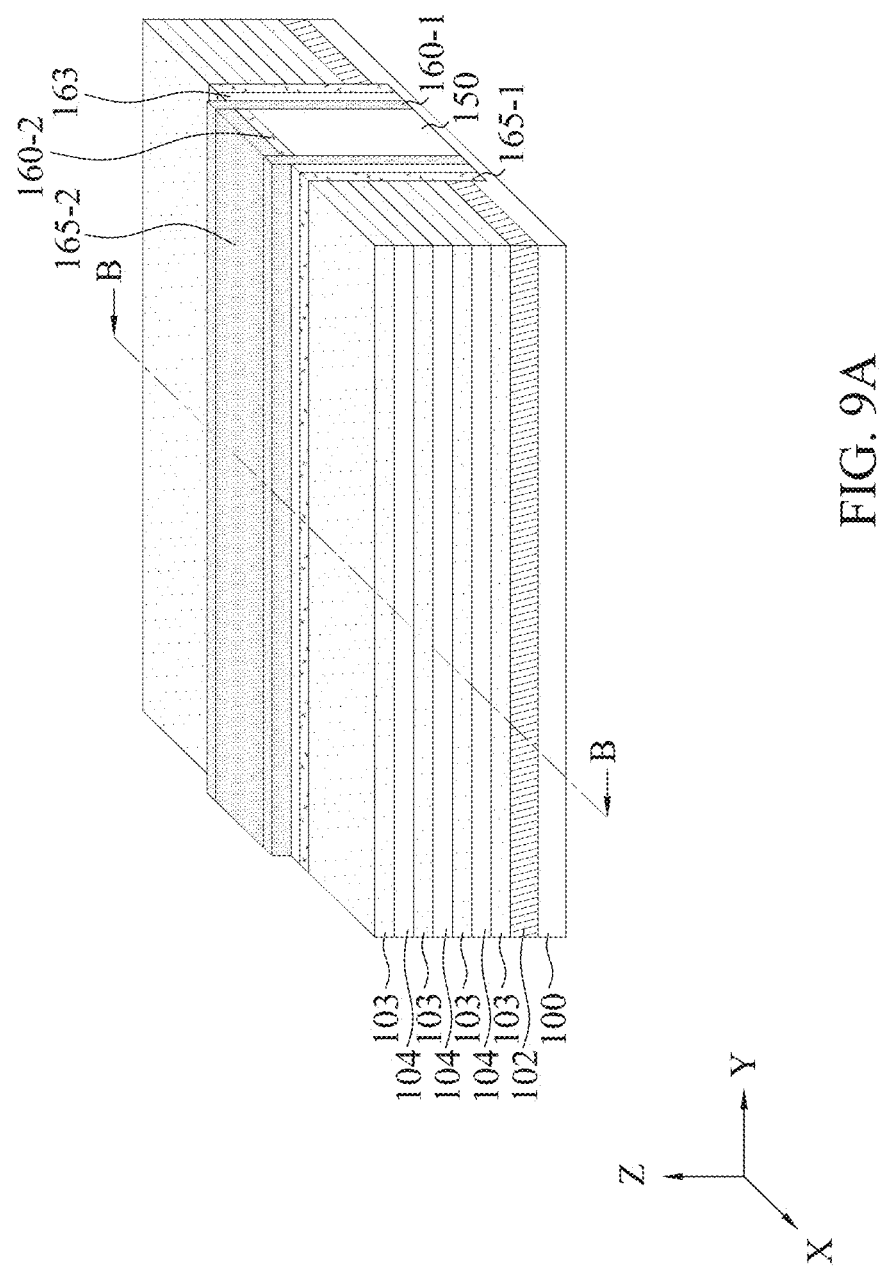
Figure 9B:
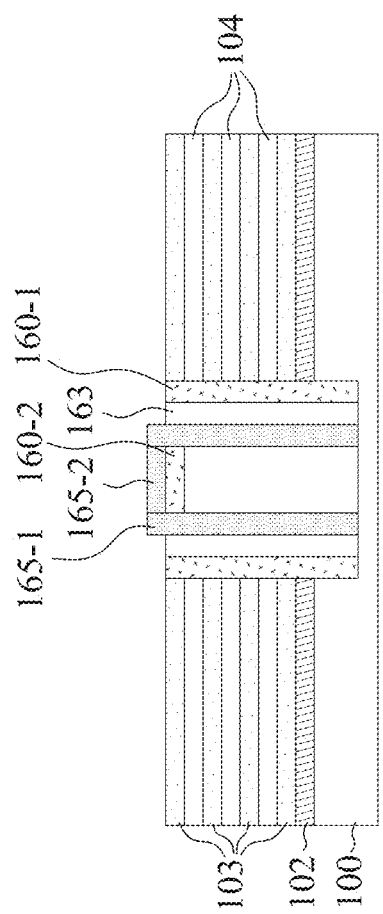

Reference is made to FIGS. 9A and 9B, in which FIG. 9B is a cross-sectional view along line B-B of FIG. 9A. The hard mask HM1 is removed to expose the topmost semiconductor layers 103. After the hard mask HM1 is removed, the dielectric spacers 165-1 and 165-2 protrude from top surfaces of the topmost semiconductor layers 103. In some embodiments the hard mask HM1 may be removed by etching process, such as wet etch, dry etch, or combinations thereof.

Figure 10:
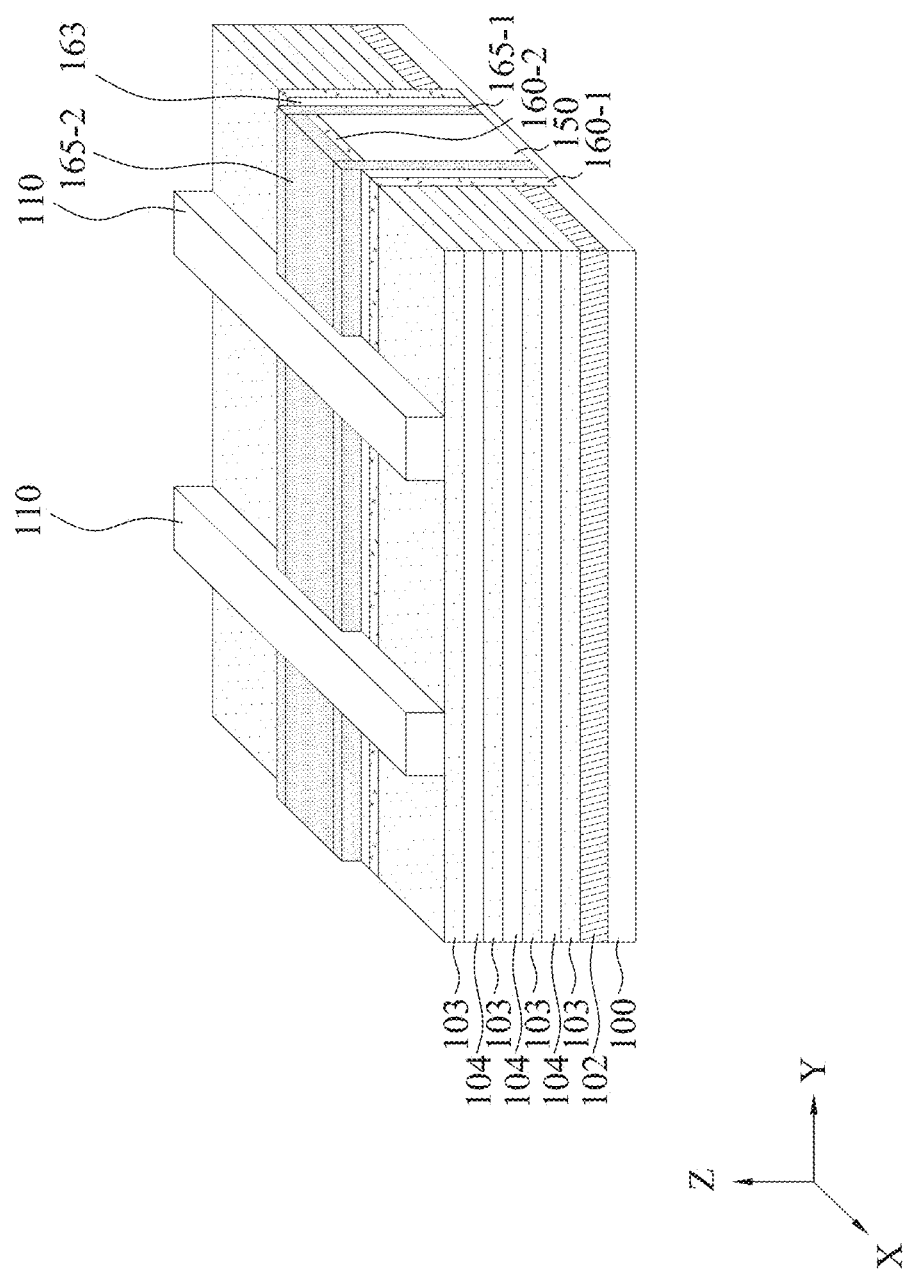

Reference is made to FIG. 10. Dummy gate structures 110 are formed over the substrate and over the semiconductor layers 103, 104. In some embodiments, the dummy gate structures 110 extend across the dielectric spacer 165-1 and the dielectric cap 165-2. For example, the dummy gate structures 110 are in contact with sidewalls and top surfaces of the dielectric spacers 165-1, and are in contact with the top surface of the dielectric cap 165-2. In some embodiments, the dummy gate structures 110 may be formed by, for example, depositing a dummy gate material over the substrate 100, followed by a patterning process.

In some embodiments, the dummy gate structures 110 may include a gate dielectric layer and a dummy gate electrode over the gate dielectric layer. In some embodiments, the gate dielectric layer may be, for example, silicon oxide, silicon nitride, a combination thereof, or the like, and may be deposited or thermally grown according to acceptable techniques. The gate dielectric layer may be formed by suitable process, such as chemical vapor deposition (CVD), physical vapor deposition (PVD), atomic layer deposition (ALD), or any suitable process. The dummy gate electrode may include polycrystalline-silicon (poly-Si) or poly-crystalline silicon-germanium (poly-SiGe). Further, the dummy gate electrode may be doped poly-silicon with uniform or non-uniform doping. The dummy gate electrode may be formed by a suitable deposition process, such as chemical vapor deposition (CVD), physical vapor deposition (PVD), atomic layer deposition (ALD), or any other suitable deposition process.

Figure 11:
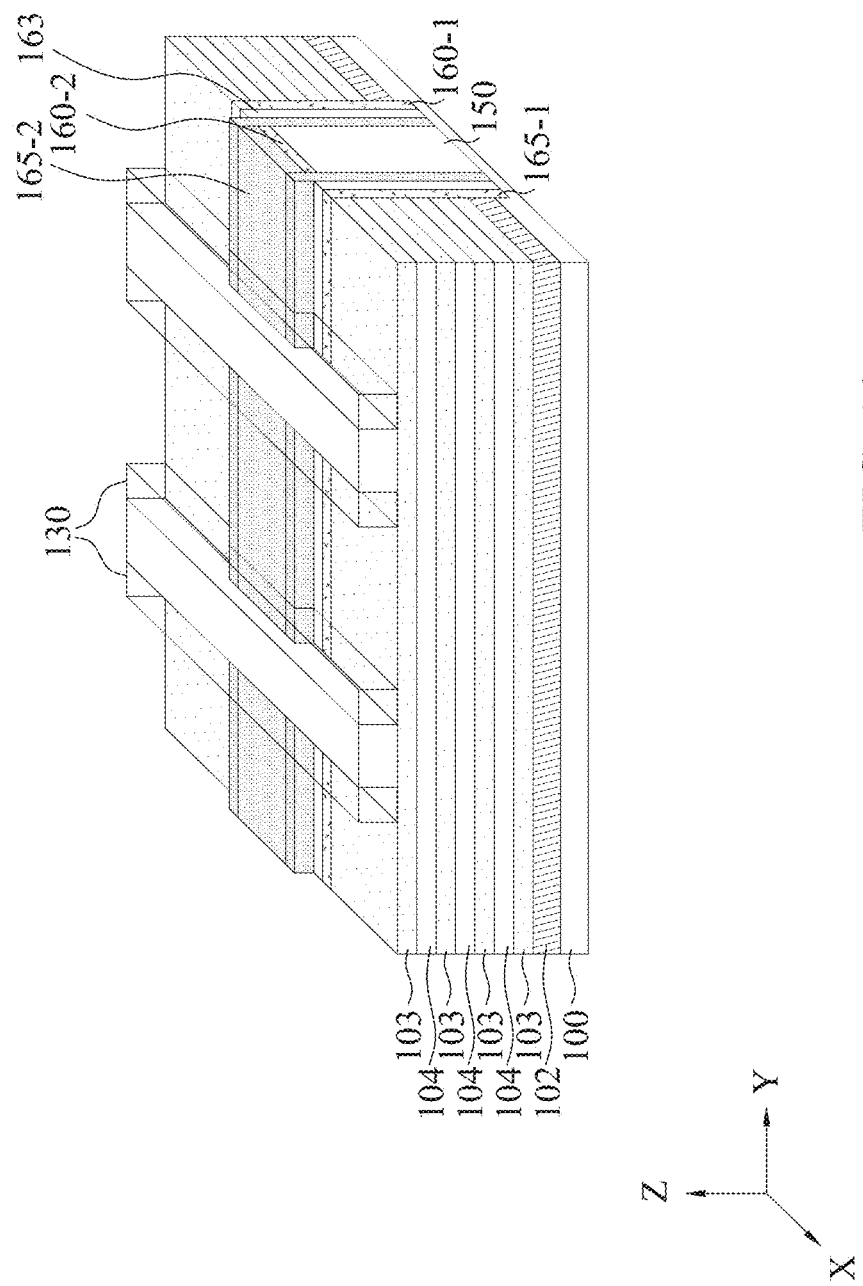

Reference is made to FIG. 11. Gate spacers 130 are formed on opposite sidewalls of the dummy gate structures 110. In some embodiments, the gate spacers 130 may be formed by, for example, depositing a gate spacer material blanket over the dummy gate structures 110, followed by an etching process to remove horizontal portions of the gate spacer material, such that vertical portions of the gate spacer material remain on sidewalls of the dummy gate structures 110.

Figure 12A:
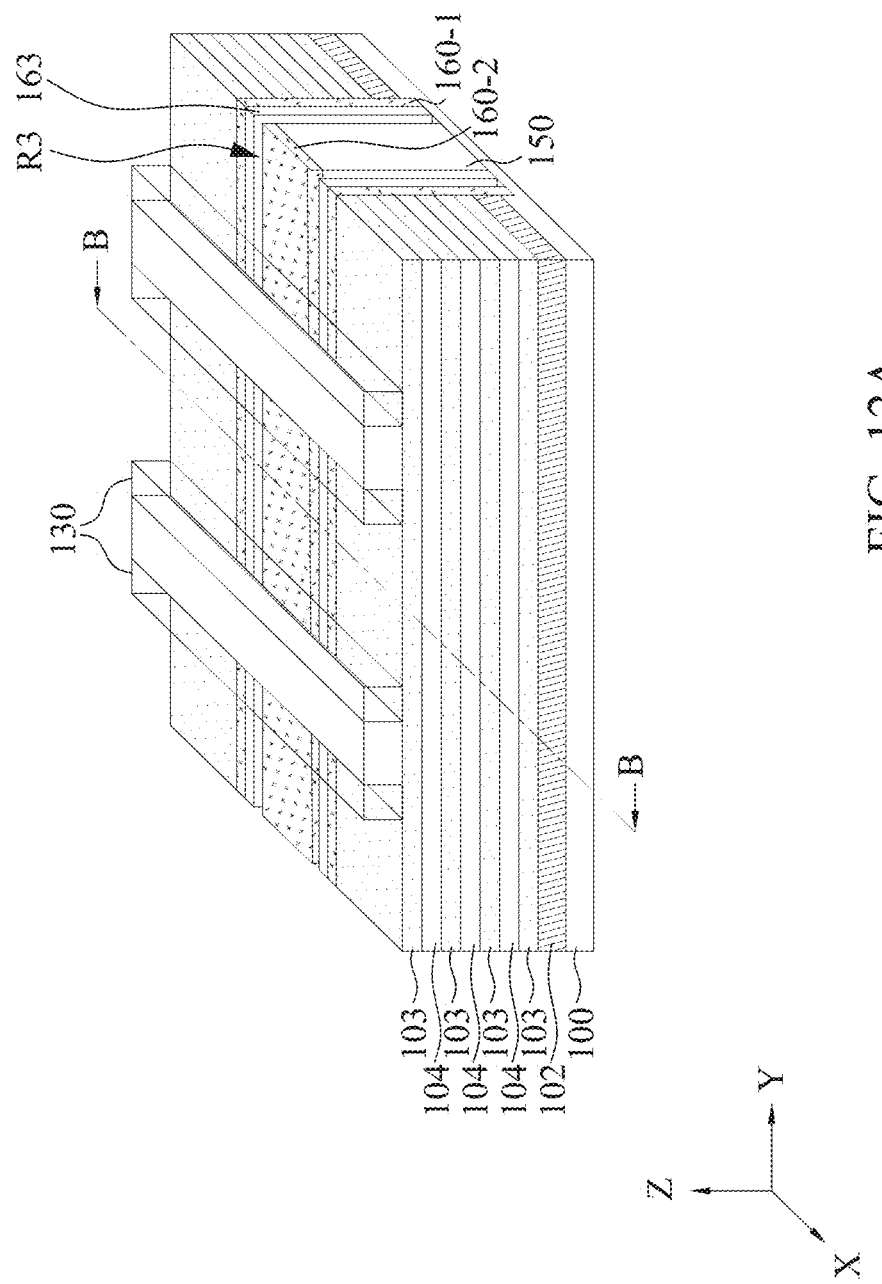
Figure 12B:
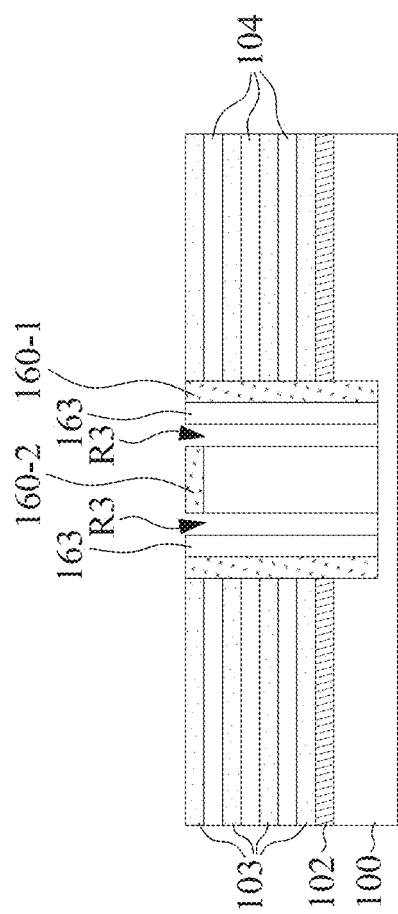

Reference is made to FIGS. 12A and 12B, in which FIG. 12B is a cross-sectional view along line B-B of FIG. 12A. An etching process is performed to remove the dielectric spacers 165-1 and the dielectric cap 165-2 exposed by the dummy gate structures 110 and the gate spacers 130 to form recesses R3. This etching step may uses a selective etching process that etches the material of dielectric spacers 165-1 and dielectric cap 165-2 at a faster etch rate than it etches other exposed materials (e.g., dielectric spacers 160-1, 163, dielectric cap 160-2, semiconductor layer 103, or dummy gate structures 110 and/or gate spacers 130). In some embodiments, each of the recesses R3 exposes a corresponding sidewall of the third dielectric spacer 163, a sidewall of the backside via 150, and a sidewall of the dielectric cap 160-2. In some embodiments, the selective etching process may include a wet etch, a dry etch, or combinations thereof.

Figure 13A:
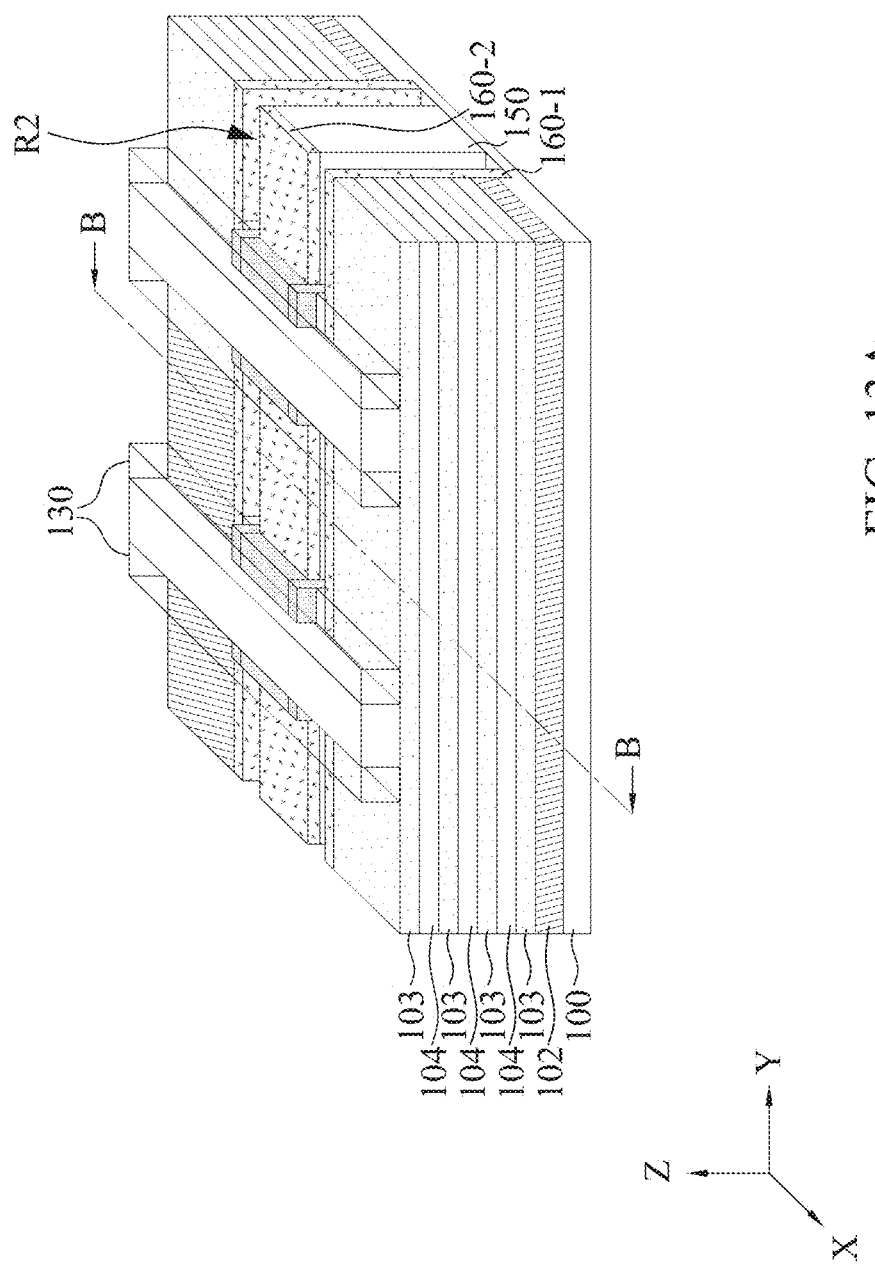
Figure 13B:
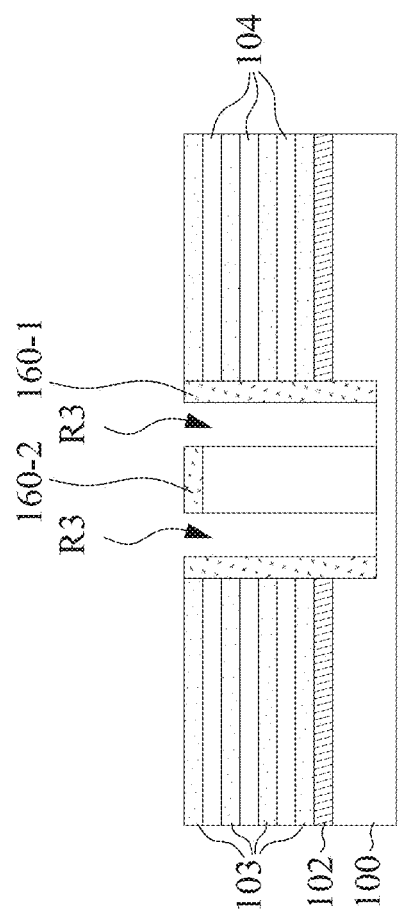

Reference is made to FIGS. 13A and 13B, in which FIG. 13B is a cross-sectional view along line B-B of FIG. 13A. An etching process is performed to remove the third dielectric spacers 163 to enlarge recesses R3. This etching step may uses a selective etching process that etches the material of third dielectric spacers 163 at a faster etch rate than it etches other exposed materials (e.g., dielectric spacers 160-1, dielectric cap 160-2, semiconductor layer 103, dummy gate structures 110 and/or gate spacers 130). In some embodiments, after the third dielectric spacers 163 are removed, each of the recesses R3 exposes sidewall of the dielectric spacer 160-1, sidewall of the backside via 150, and sidewall of the dielectric cap 160-2.

Figure 14A:
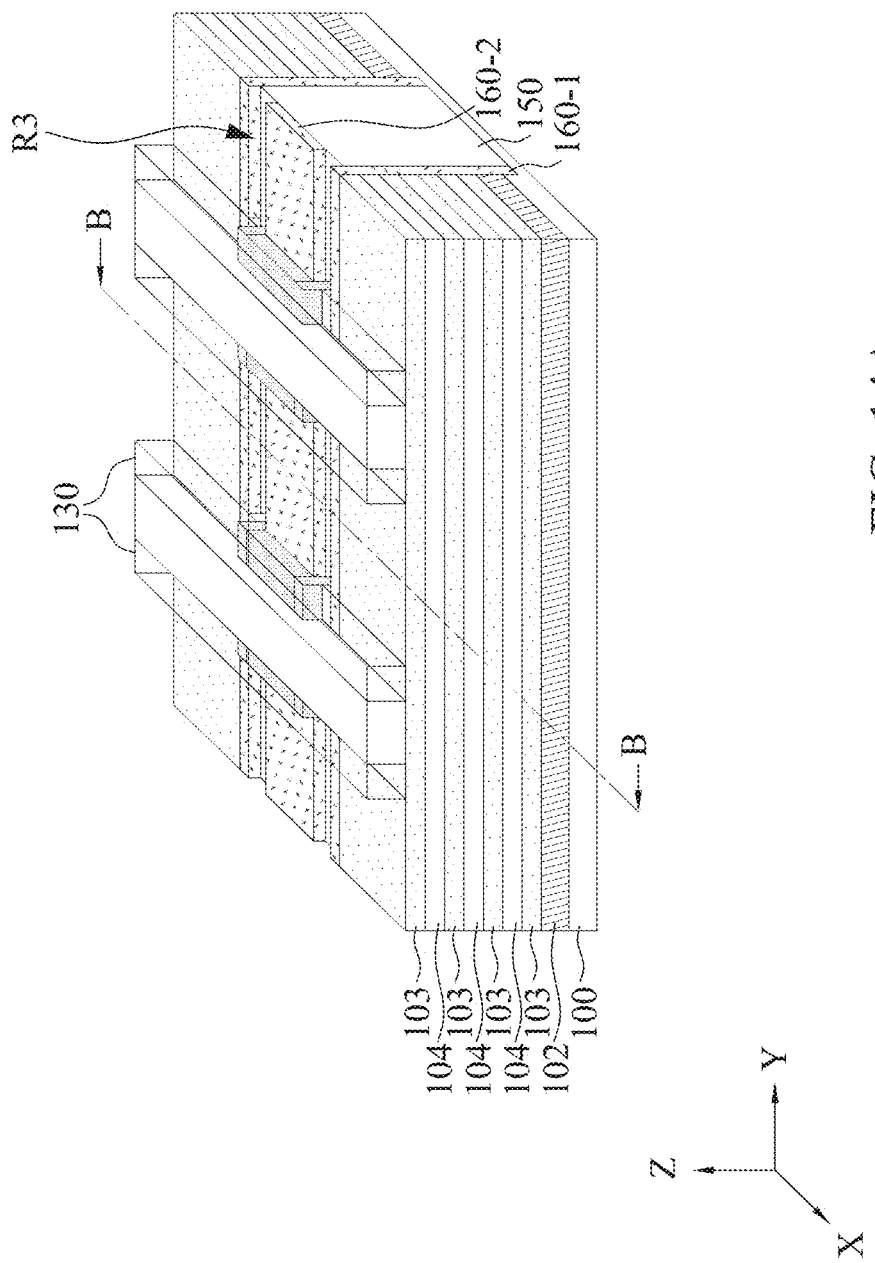
Figure 14B:
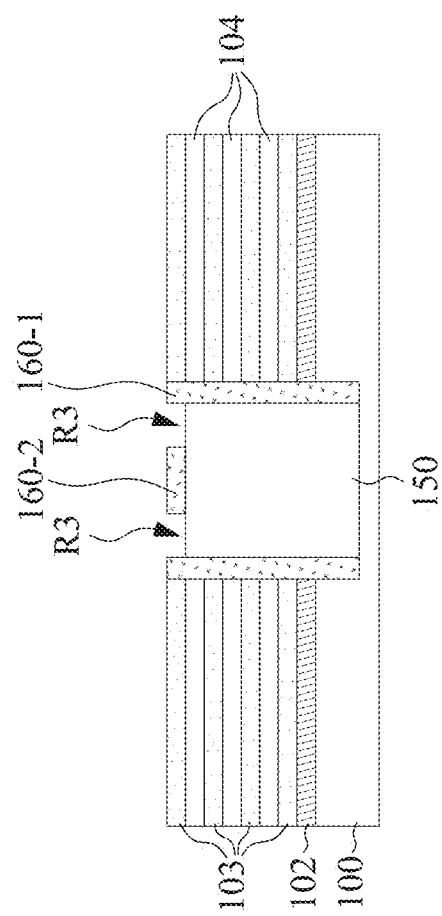

Reference is made to FIGS. 14A and 14B, in which FIG. 14B is a cross-sectional view along line B-B of FIG. 14A. The backside via 150 is expanded by filling a conductive material in the recesses R3. In some embodiments, the conductive material filled in the recesses R3 is the same as the material of the backside via 150. In some embodiments, the backside via 150 is expanded by, for example, depositing a conductive material over the substrate 100 and filling the recesses R3, followed by a selective etching back process to selectively etch the deposited conductive material, resulting in lowering the top surface of the conductive material to a level lower than the top surfaces of the dielectric spacers 160-1 and dielectric cap 160-2. In some embodiments, after the backside via 150 is expanded, top portions of the recesses R3 remain unfilled, due to the selective etching back process. Stated differently, time duration of the selective etching back process can be controlled in such a way that the resultant backside via 150 is pulled back to leave recesses R3 above the backside via 150.

Figure 15A:
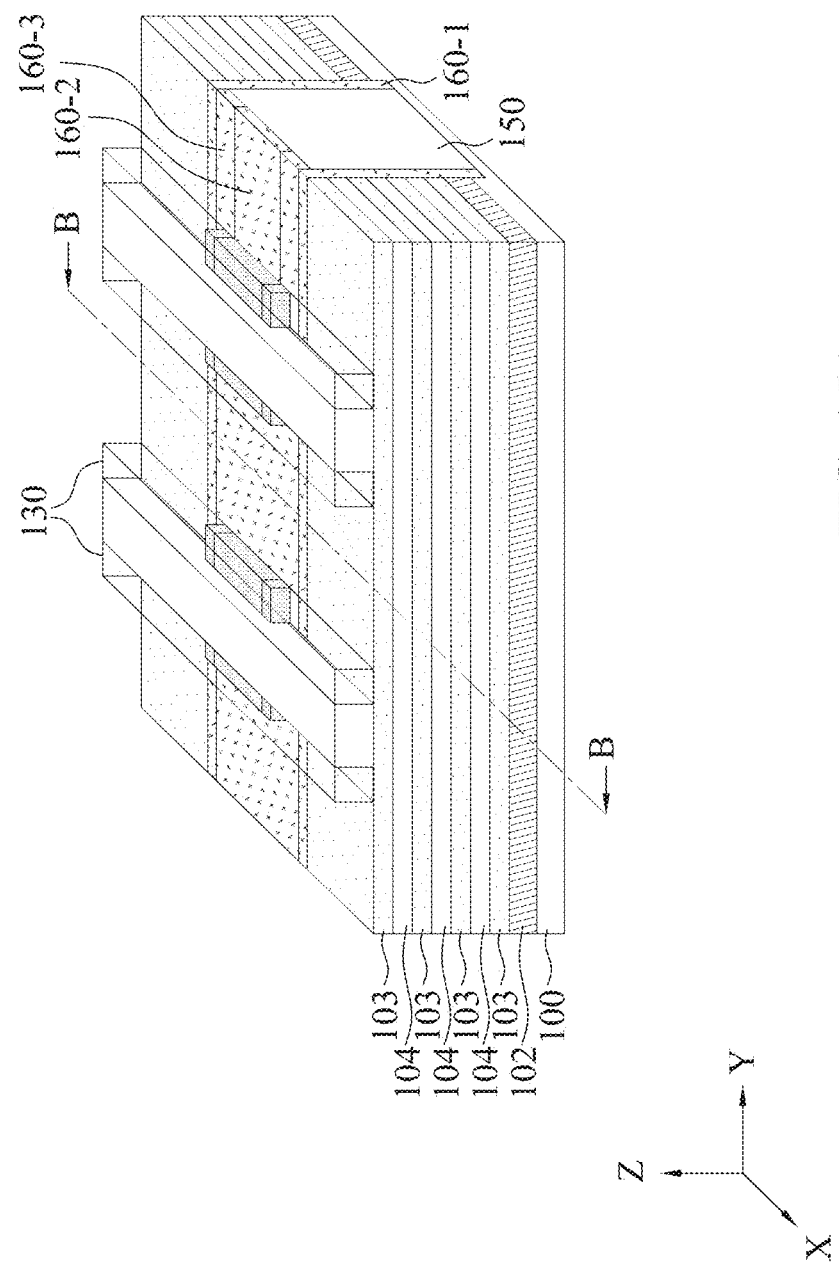
Figure 15B:
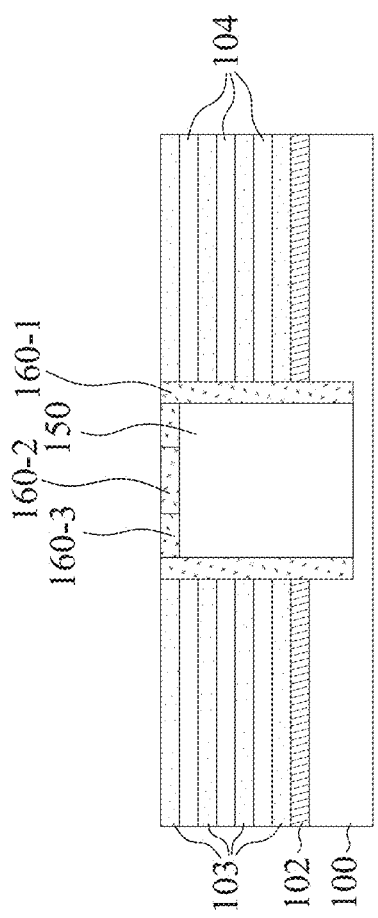

Reference is made to FIGS. 15A and 15B, in which FIG. 15B is a cross-sectional view along line B-B of FIG. 15A. Dielectric caps 160-3 are formed in the recesses R3. In some embodiments, the dielectric caps 160-3 are made of the same material as the dielectric spacers 160-1 and the dielectric cap 160-2. In some embodiments, the dielectric caps 160-3 may be formed by, for example, depositing a dielectric material over the substrate 100 and filling the recesses R3, followed by a planarization process (e.g., CMP) to planarize the deposited dielectric material with the dielectric spacers 160-1 and the dielectric cap 160-2.

Figure 16A:
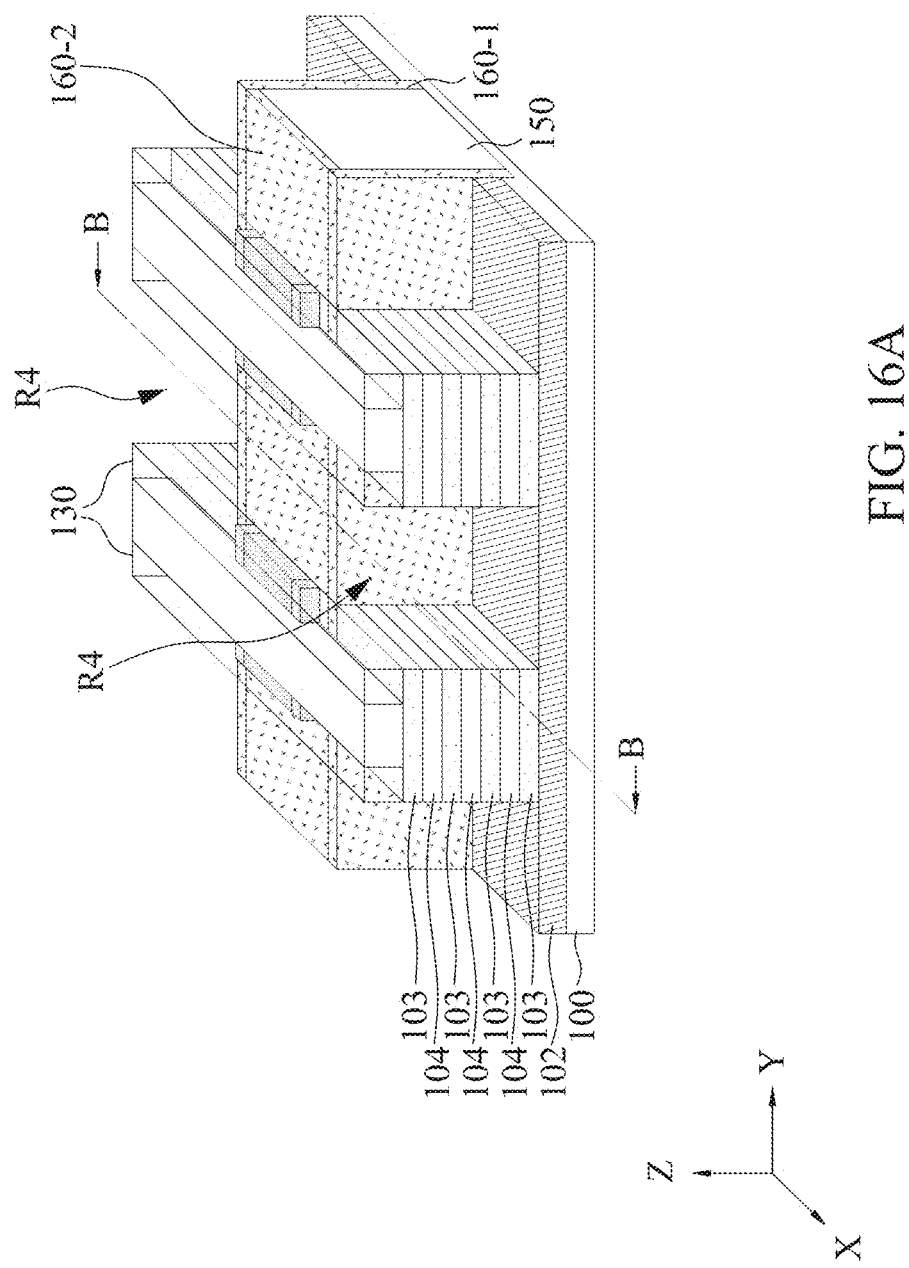
Figure 16B:
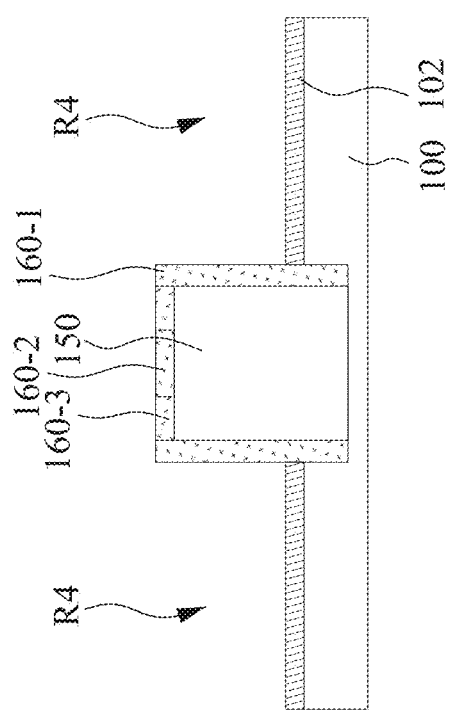

Reference is made to FIGS. 16A and 16B, in which FIG. 16B is a cross-sectional view along line B-B of FIG. 16A. An etching process is performed to remove portions of the semiconductor layers 103 and 104 exposed by the dummy gate structures 110 and the gate spacers 130 to form recesses R4. This etching step may use a selective etching process that etches the semiconductor layers 103 (e.g., SiGe layers) and semiconductor layers 104 (e.g., Si layers) at a faster etch rate than it etches other exposed materials (e.g., dielectric spacers 160-1, dielectric caps 160-2, 160-3, dummy gate structures 110, and/or gate spacers 130). In some embodiments each of the recesses R4 exposes the top surface of the dielectric layer 102. In some embodiments, the etching process may include wet etch, dry etch, or combinations thereof.

Figure 17A:
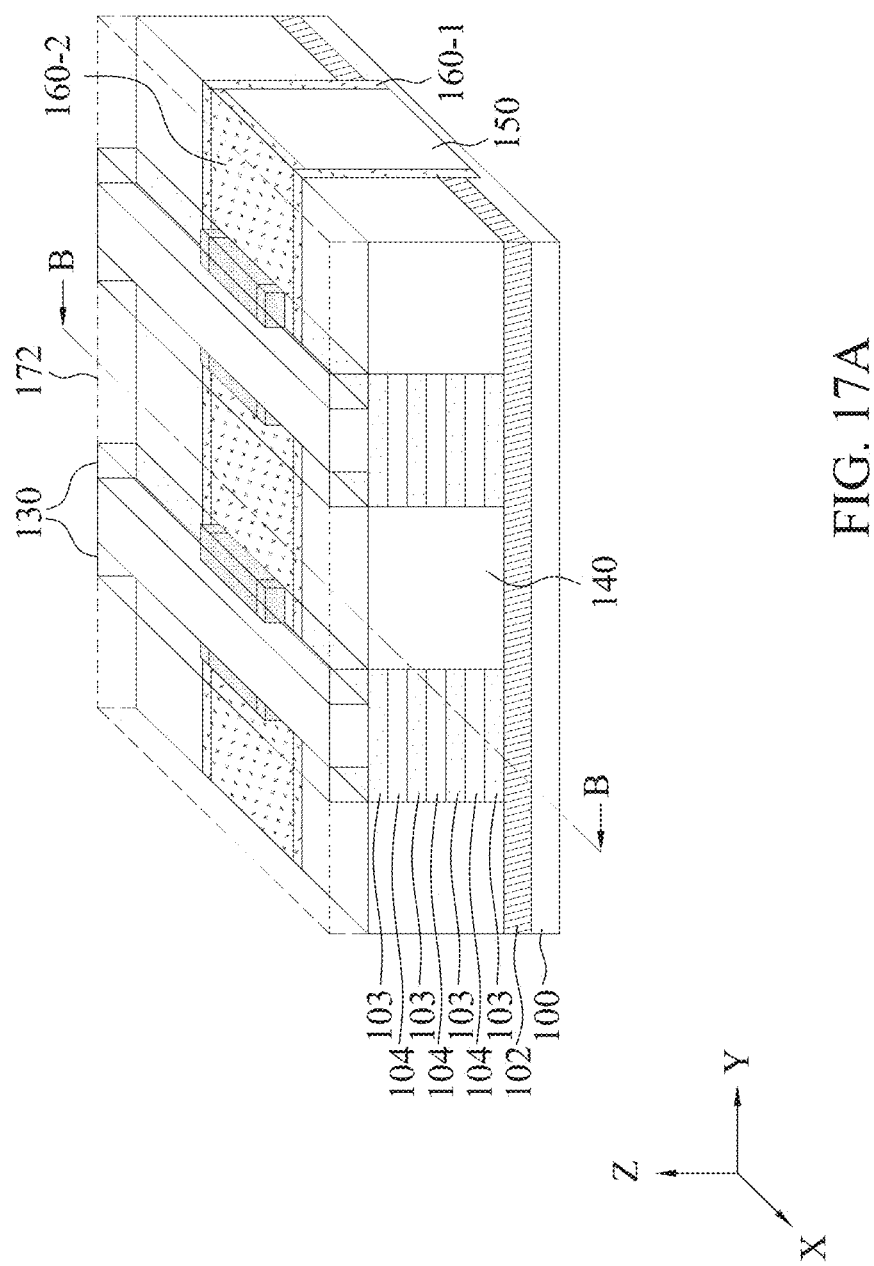
Figure 17B:
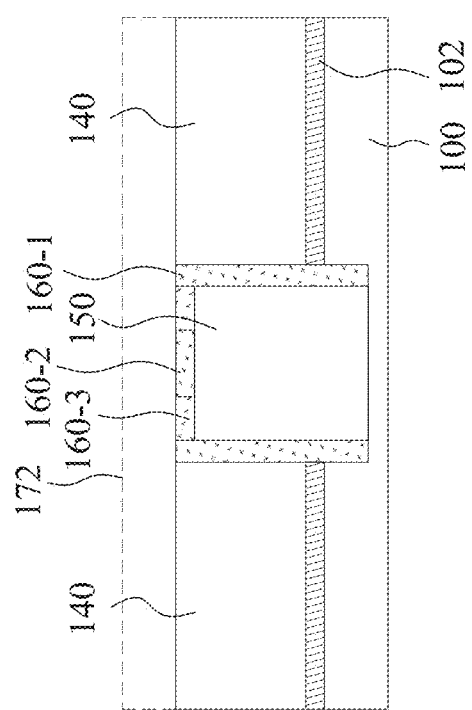

Reference is made to FIGS. 17A and 17B, in which FIG. 17B is a cross-sectional view along line B-B of FIG. 17A. Source/drain epitaxy structures 140 are formed in the recesses R4 and on opposite sides of the dummy gate structures 110. In some embodiments, each of the source/drain epitaxy structures 140 may be formed by selective epitaxial growth (SEG). The source/drain epitaxy structures 140 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxy structures 140 are not in-situ doped, an implantation process (i.e., a junction implant process) is performed to dope the source/drain epitaxy structures 140. In some exemplary embodiments, the source/drain epitaxy structures 140 in an NFET device include SiP, while those in a PFET device include GeSnB and/or SiGeSnB. Next, an interlayer dielectric (ILD) layer 172 is formed over the source/drain epitaxy structures 140. In some embodiments, the ILD layer 172 may be formed by, for example, depositing an ILD material layer over the substrate 100 and followed by a CMP process to remove excess ILD material layer until top surfaces of the dummy gate structures 110 are exposed.

Figure 18A:
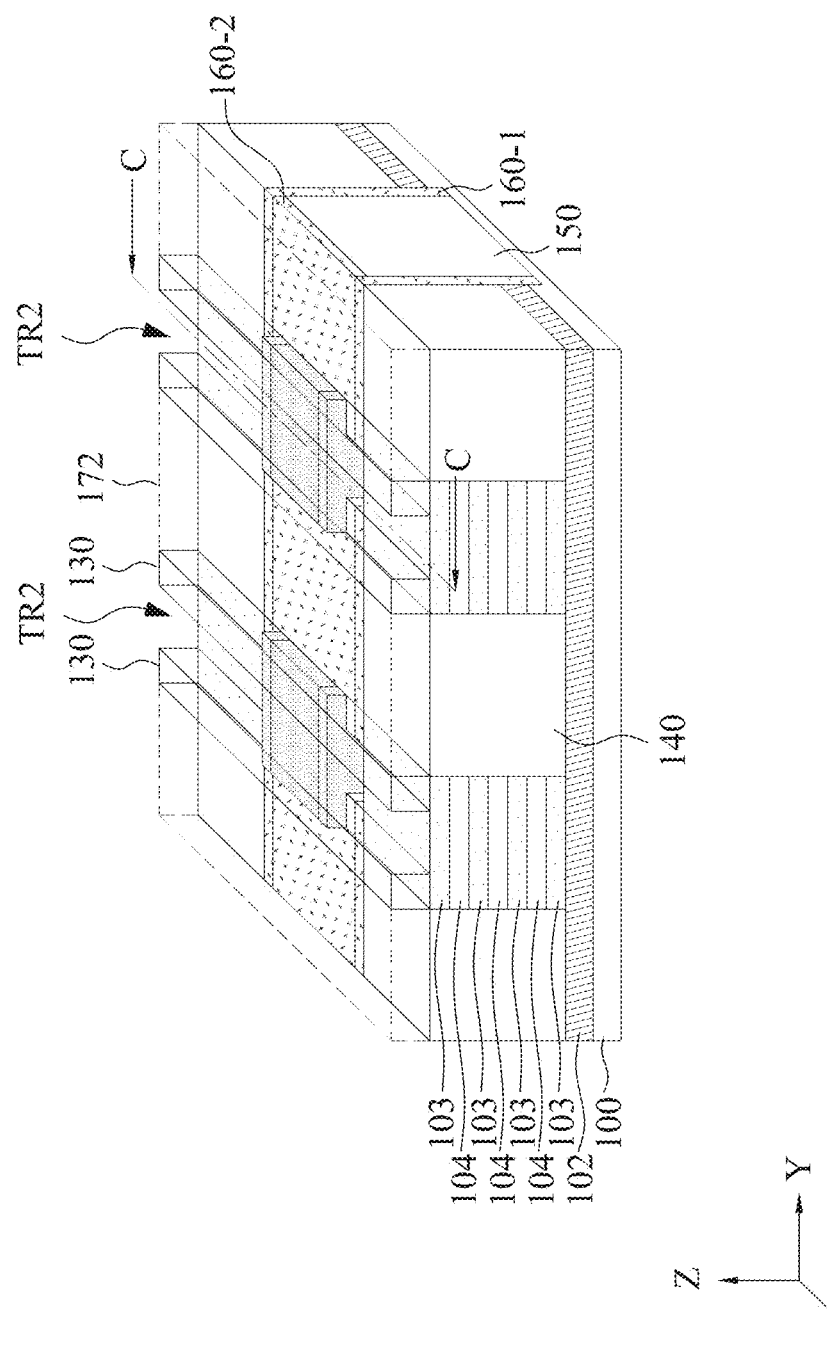
Figure 18B:
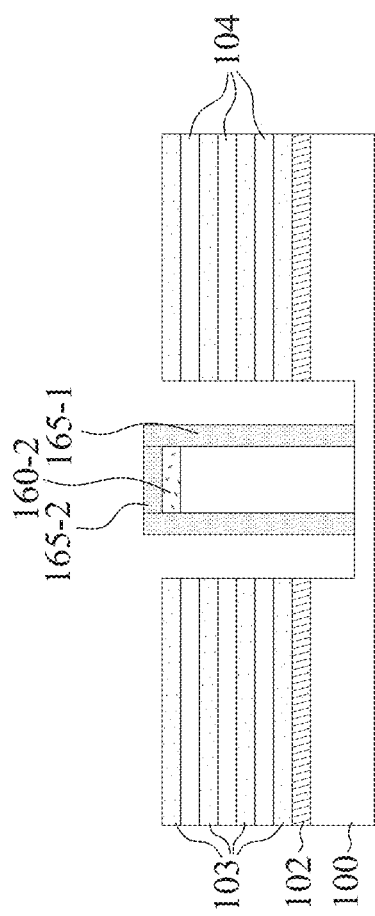

Reference is made to FIGS. 18A and 18B, in which FIG. 18B is a cross-sectional view along line C-C of FIG. 18A. The dummy gate structures 110, the dielectric spacers 160-1 and 163 are removed by suitable etching techniques to from trenches TR2 between corresponding gate spacers 130. As shown in FIG. 18B, each of the trenches TR2 at least exposes sidewalls of the semiconductor layers 103, 104, sidewalls of the dielectric layer 102, sidewalls of the substrate 100, and sidewalls of the dielectric spacers 165-1, due to removal of the dielectric spacers 160-1, 163 that are previously covered by dummy gate structures 110. This etching step may include one or more selective etching processes. For example, the etching step first performs a first selective etching process that etches the dummy gate structures 110 at a faster etch rate than it etches other materials (e.g., gate spacers 130, dielectric spacers 165-1, dielectric cap 165-2, ILD layer 172 and/or semiconductor layer 103). Subsequently, the etching step performs a second selective etching process that etches the dielectric spacers 160-1, 163 at a faster rate than it etches other materials (e.g., semiconductor materials 103, 104, gate spacers 130, dielectric layer 102, dielectric spacers 165-1, and dielectric cap 165-2). In some embodiments, the selective etching processes may include wet etch, dry etch, or combinations thereof.

Figure 19A:
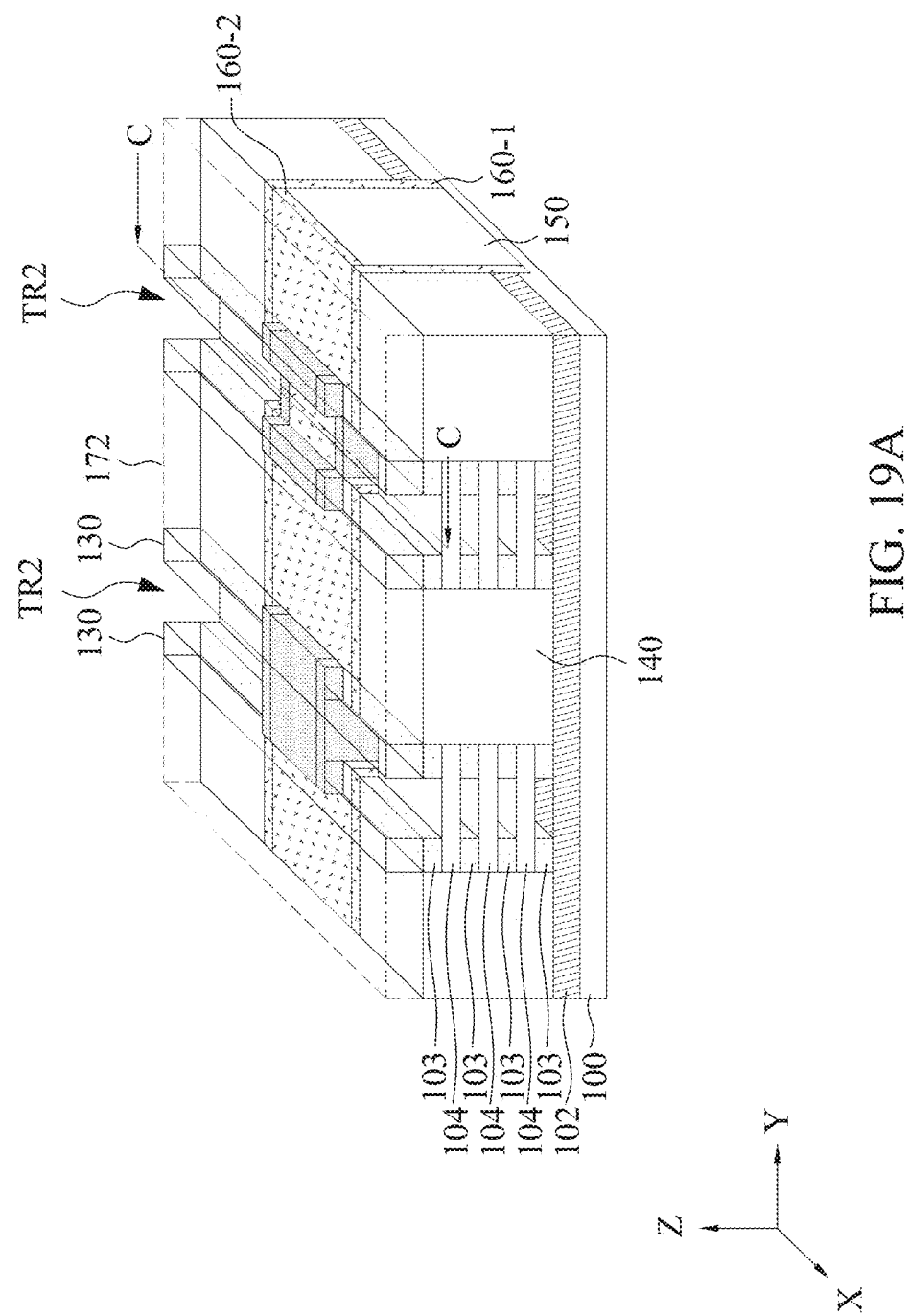
Figure 19B:
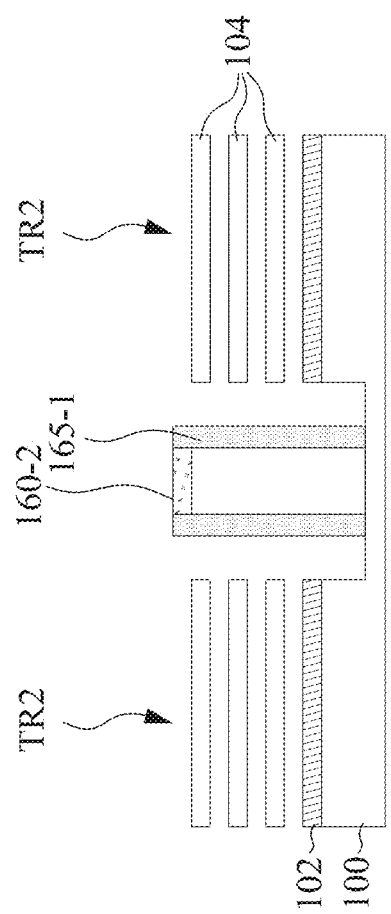

Reference is made to FIGS. 19A and 19B, in which FIG. 19B is a cross-sectional view along line C-C of FIG. 19A. The semiconductor layers 103 (e.g., SiGe layers) are removed through the trenches TR2. In some embodiments, the etching process may include wet etch, dry etch, or combinations thereof. During the etching process for removing the semiconductor layers 103, the semiconductor layers 104 have higher etching resistance to the etching process than the semiconductor layers 103, such that the semiconductor layers 104 remain substantially intact after the semiconductor layers 103 are removed. As a result of selectively removing the semiconductor layers 103, the semiconductor layers 104 become nanosheets suspended over the substrate 100. This step is also called a channel release process. In some embodiments, a dielectric cap 165-2 and corresponding dielectric spacers 165-1 exposed in a trench TR2 (e.g., right-side trench TR2 in FIG. 19A) are etched back before or after the channel release process. Etching back the dielectric cap 165-2 and dielectric spacers 165-1 from the trench TR2 allows for forming a continuous gate structure in this trench TR2 in subsequent processing as illustrated in FIG. 20B. On the other hand, leaving the dielectric cap 165-2 and dielectric spacers 165-1 in a trench TR2 (e.g., left-side trench TR2) allows for forming separate gate structures in that trench TR2 in subsequent processing as illustrated in FIG. 20B.

Figure 20A:
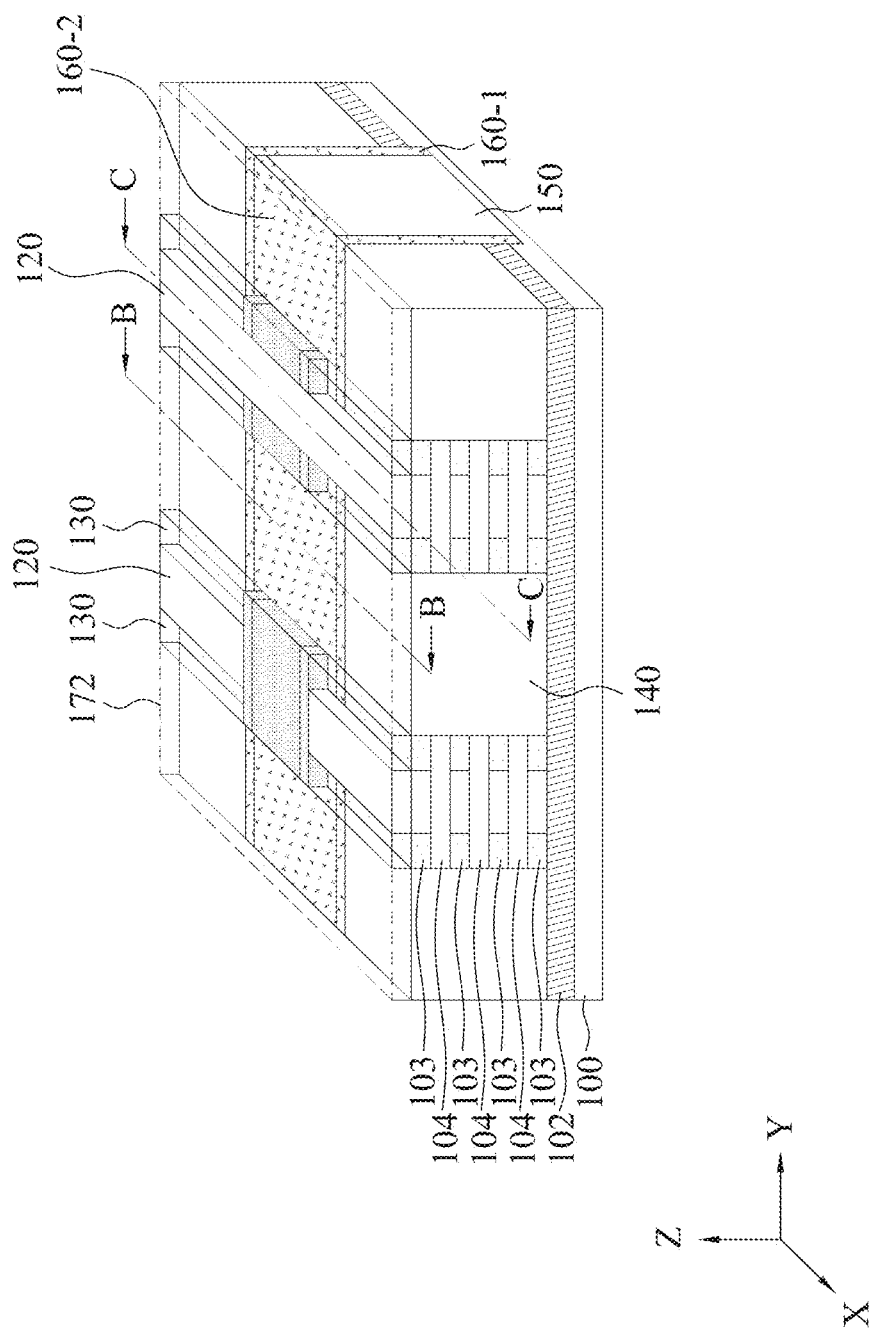
Figure 20B:
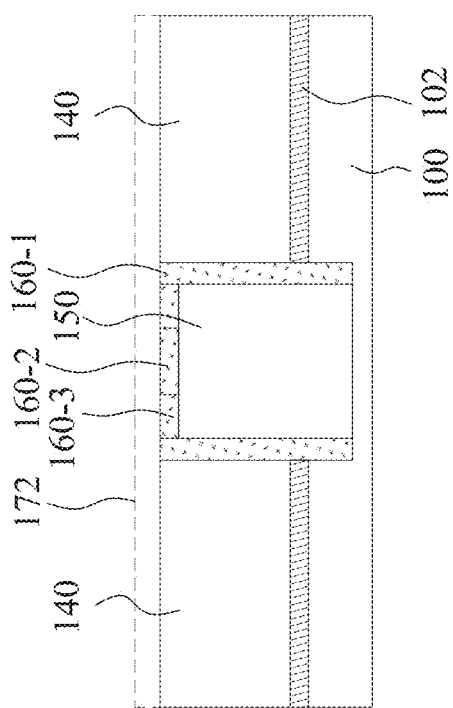
Figure 20C:
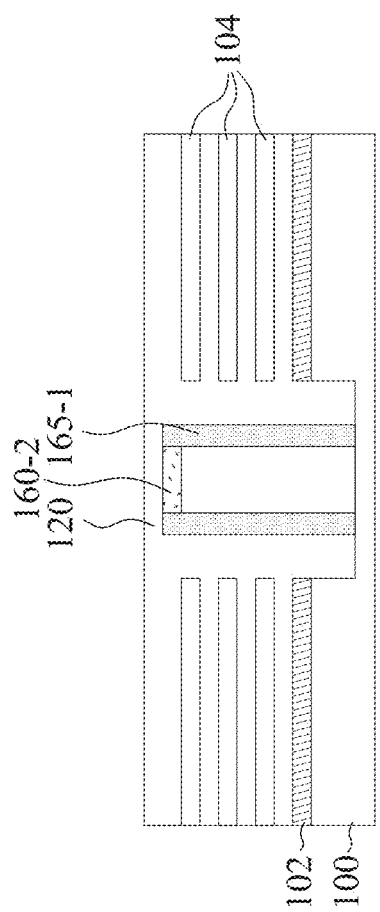

Reference is made to FIGS. 20A to 20C, in which FIG. 20B is a cross-sectional view along line B-B of FIG. 20A, and FIG. 20C is a cross-sectional view along line C-C of FIG. 20A. Gate structures 120 are formed in the trenches TR2. In some embodiments, the gate structures 120 may be formed by, for example, forming gate materials, such as gate dielectric layer, work function metal layer, and filling metal, in the trenches TR2, followed by a CMP process until top surface of the ILD layer 172 is exposed. The gate dielectric layer, the work function metal layer, and the filling metal may be formed by PVD, CVD, ALD, or other suitable deposition processes.

Figure 21A:
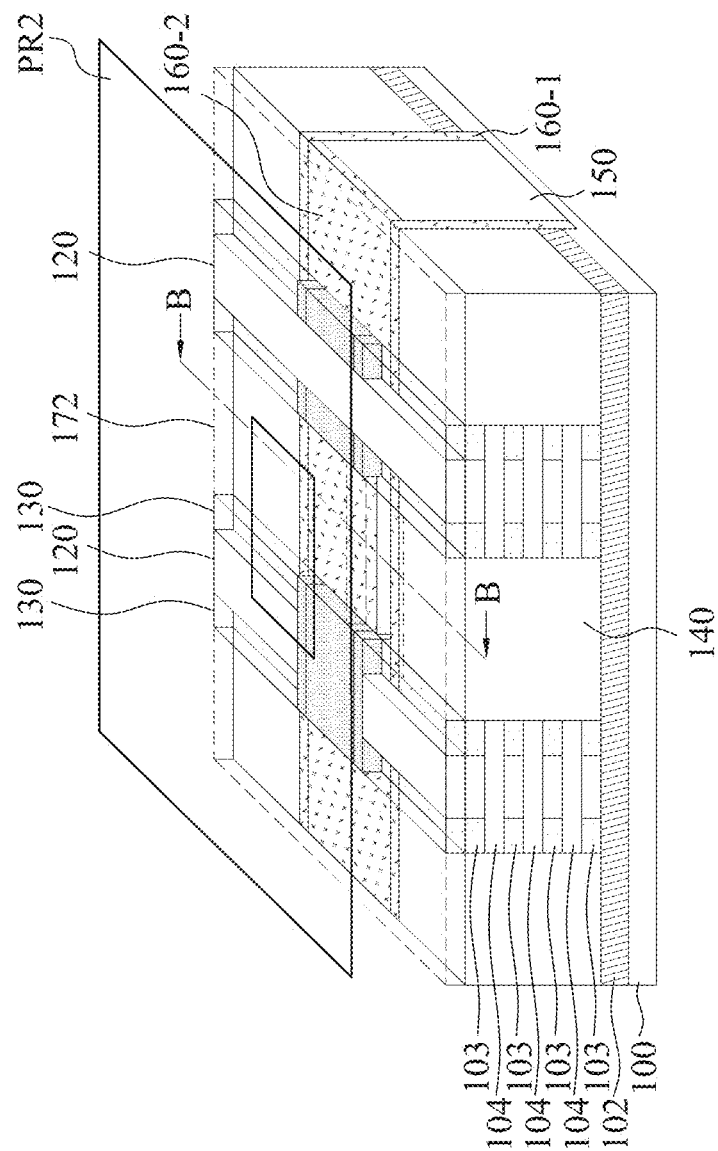
Figure 21B:
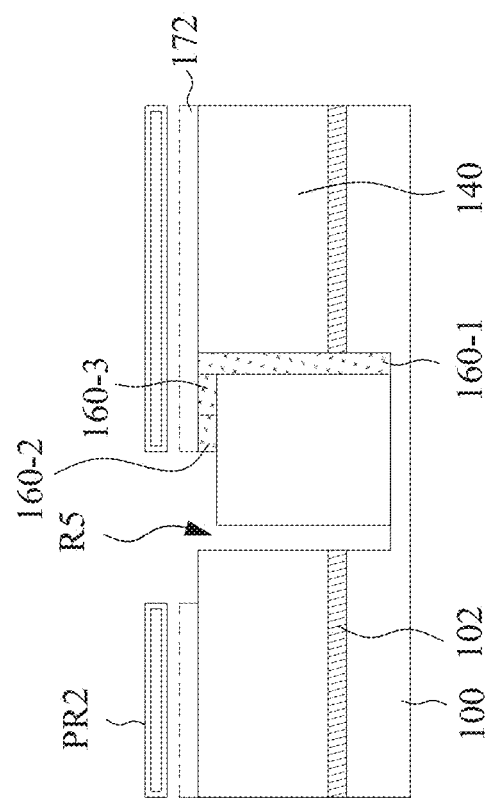

Reference is made to FIGS. 21A and 21B, in which FIG. 21B is a cross-sectional view along line B-B of FIG. 21A. A patterned photoresist resist layer PR2 is formed over the substrate 100, and a portion of the ILD layer 172 is removed through the opening of the patterned photoresist resist layer PR2. In some embodiments, the portion of the ILD layer 172 may be removed by an etching process, such as wet etch, dry etch, or combinations thereof.

Next, portions of the dielectric spacers 160-1 and dielectric caps 160-2, 160-3 are removed through the opening of the patterned photoresist resist layer PR2 to form a recess R5. In some embodiments, the portions of the dielectric spacers 160-1 and dielectric caps 160-3 may be removed by an etching process, such as wet etch, dry etch, or combinations thereof. In some embodiments, the remaining portion of the dielectric spacers 160-1 contributes the vertical portion 160V-1 of the first dielectric spacer 160 discussed in FIG. 1B, and the remaining portions of the dielectric caps 160-2, 160-3 contribute the horizontal portion 160H-1 of the first dielectric spacer 160 discussed in FIG. 1B.

Figure 22A:
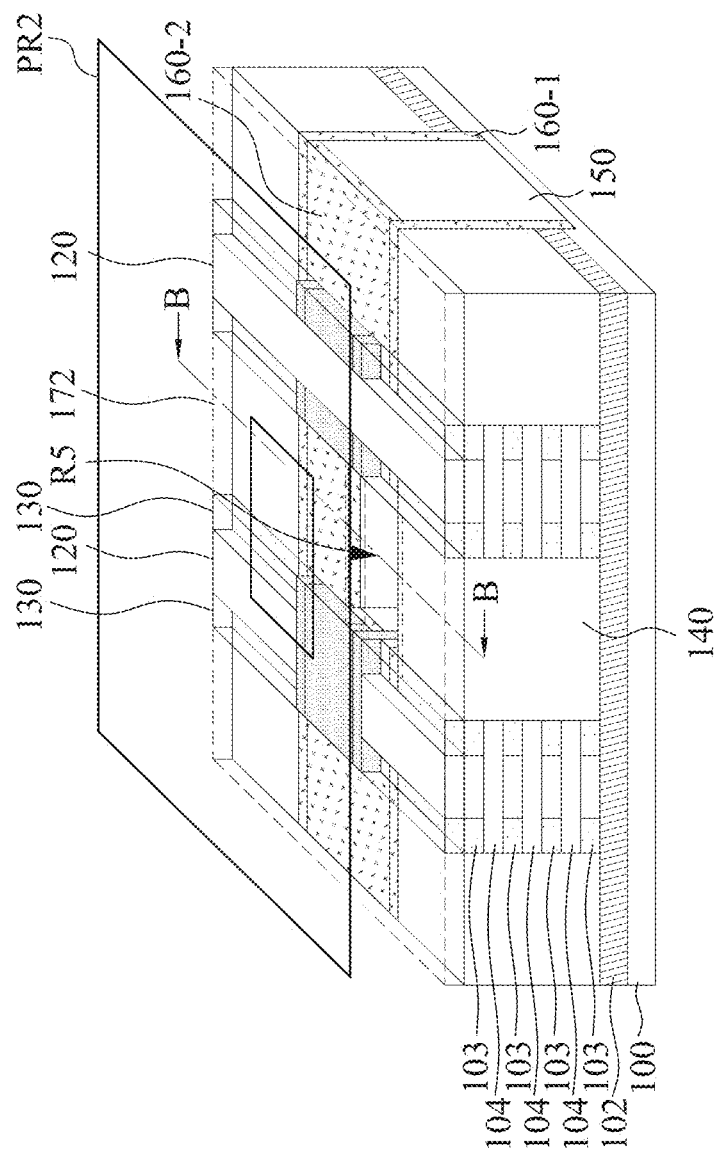
Figure 22B:
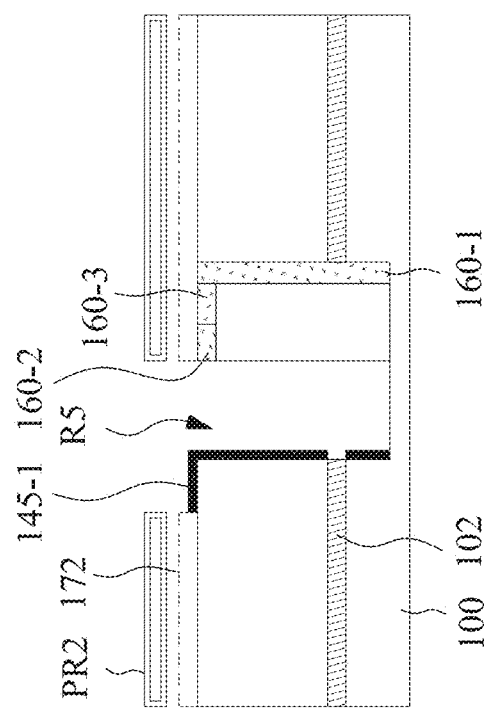

Reference is made to FIGS. 22A and 22B, in which FIG. 22B is a cross-sectional view along line B-B of FIG. 22A. A portion of the backside via 150 is removed through the opening of the patterned photoresist resist layer PR2. In some embodiments, the portion of the backside via 150 may be removed by an etching process, such as wet etch, dry etch, or combinations thereof. In some embodiments, the remaining portion of the backside via 150 is labeled as 150A.

Next, silicide layers 145-1 are formed on the exposed surfaces of the epitaxy structure 140 and the substrate 100. The formation (silicidation process) of silicide layers 145-1 may include, for example, depositing a metal layer, such as by sputtering, over the substrate 100 and then performing an annealing process, such as a rapid thermal annealing (RTA) treatment. The metal layer overlying the surfaces of the source/drain epitaxy structures 140 and the substrate 100 may be reacted with silicon (Si) of the source/drain epitaxy structures 140 and the substrate 100 and converted into metal silicide. Non-reacted metal layer is then removed. The silicide layers 145-1 may have higher growing rate on the exposed surfaces of the epitaxy structure 140 and the substrate 100 than on the exposed surface of the dielectric layer 102. In some embodiments, the silicide layers 145-1 would not form on the exposed surface of the dielectric layer 102.

Figure 23A:
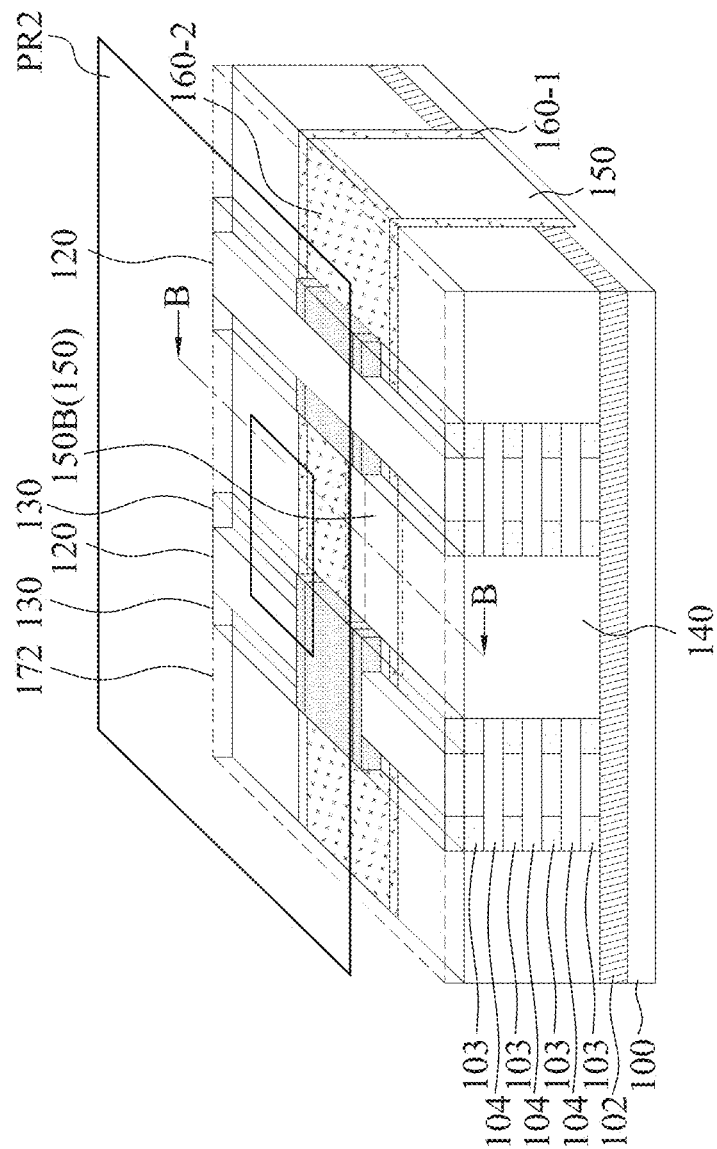
Figure 23B:
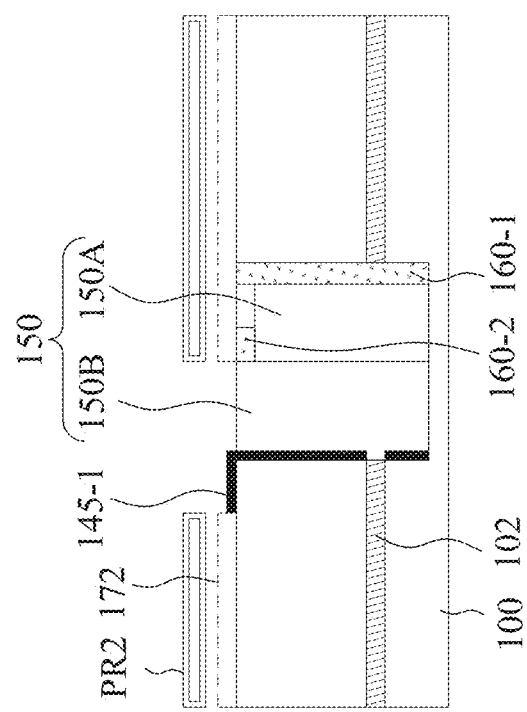

Reference is made to FIGS. 23A and 23B, in which FIG. 23B is a cross-sectional view along line B-B of FIG. 23A. A conductive material 150B is formed in the recess R5. In some embodiments, the conductive material 150B has the same material as the remaining first portion 150A of the backside via 150, and thus can act as a second portion 150B of the backside via 150, as discussed in FIGS. 1B to 1D. In some embodiments, the conductive material 150B may be formed by, for example, depositing a conductive layer over the substrate 100 and filling the recess R5, followed by an etching back process to lower a top surface of the conductive layer to a desire position.

Figure 24A:
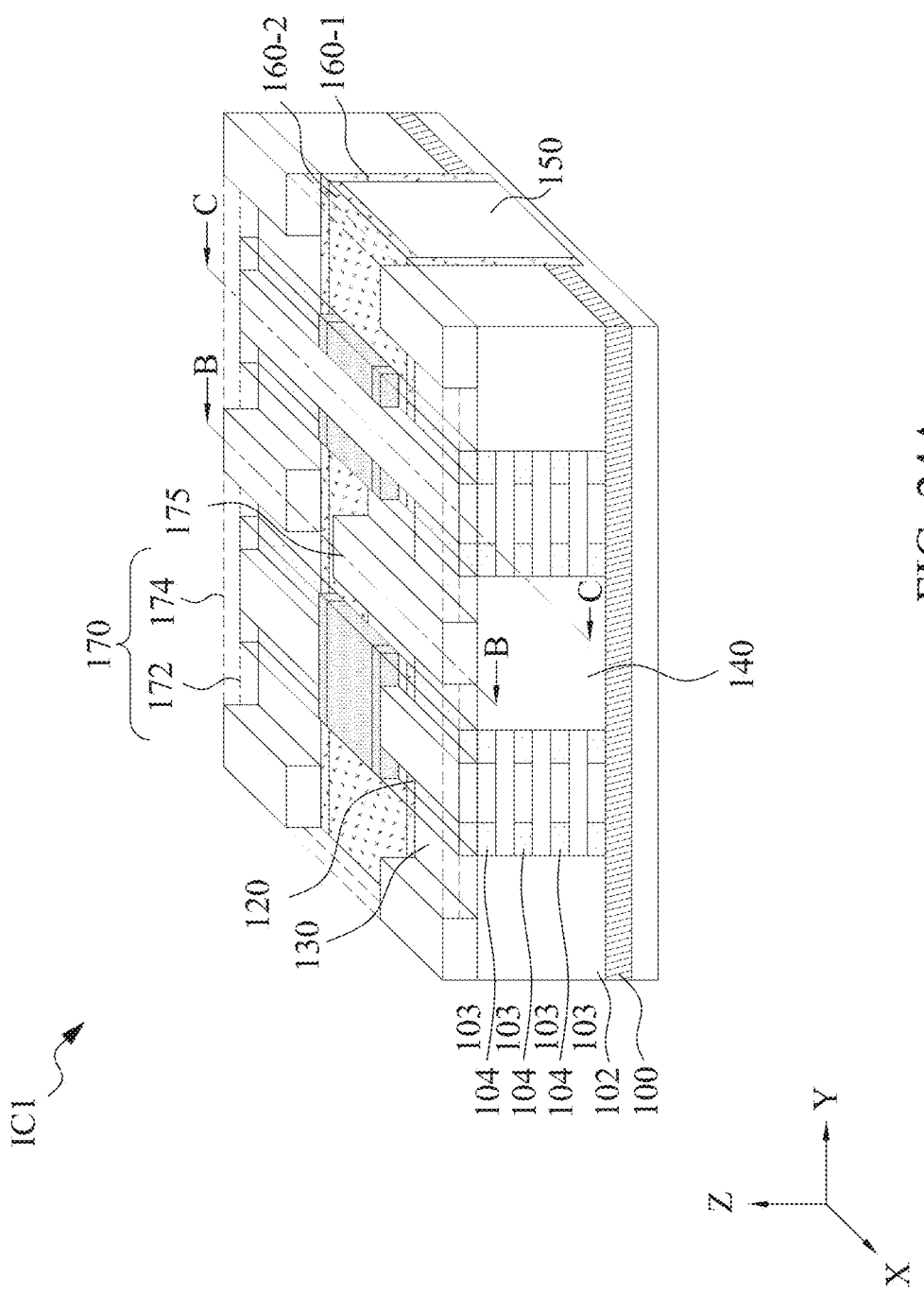
Figure 24B:
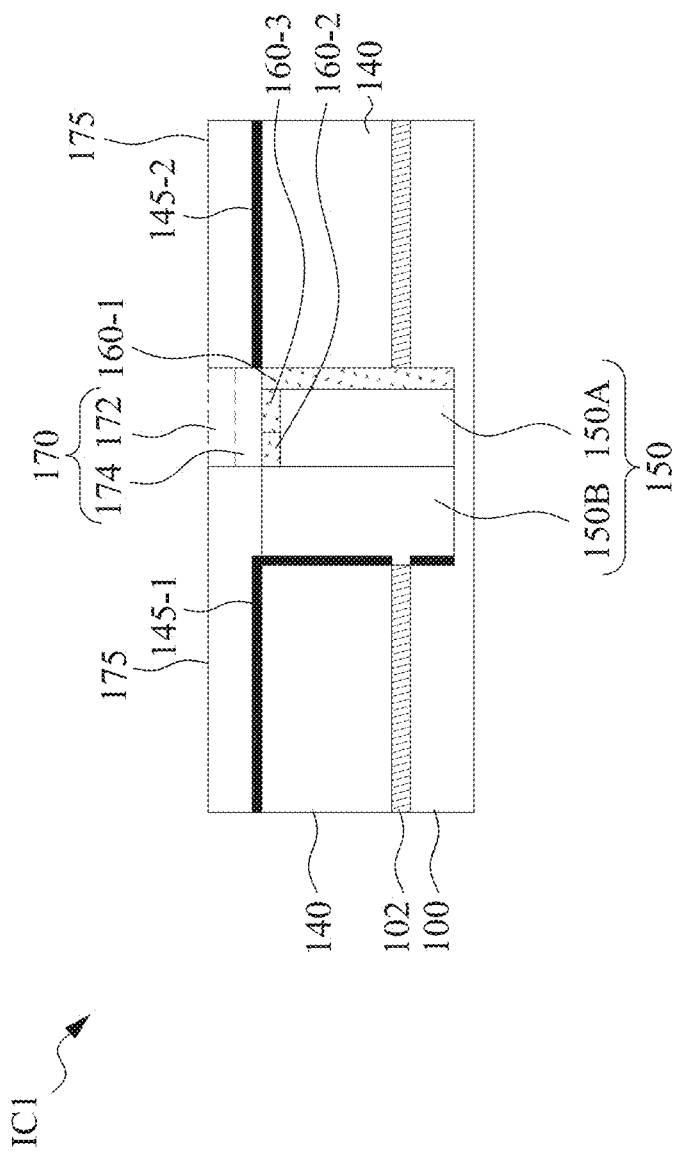
Figure 24C:
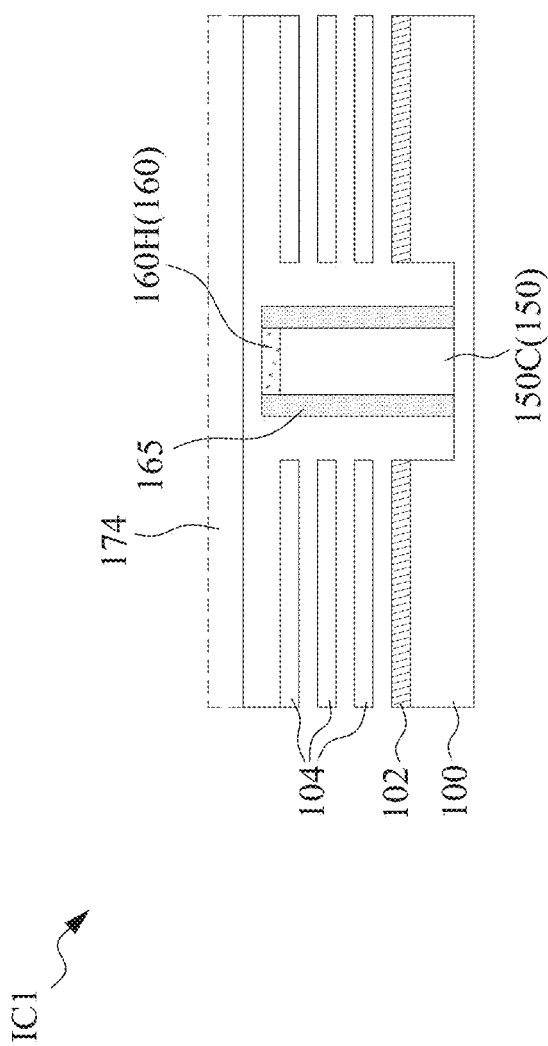

Reference is made to FIGS. 24A to 24C, in which FIG. 24B is a cross-sectional view along line B-B of FIG. 24A, and FIG. 24C is a cross-sectional view along line C-C of FIG. 24A. An interlayer dielectric layer 174 is formed over the substrate 100 and covering the ILD layer 172. Next, source/drain contacts 175 are formed extending through the ILD layers 172 and 174, and are electrically connected to the source/drain epitaxy structures 140, respectively. In some embodiments, at least one source/drain contact 175 is in contact with the top surface of the backside via 150. The source/drain contacts 175 may be formed by, for example, pattering the ILD layers 172 and 174 to form openings, filling conductive material in the openings, followed by a CMP process to remove excess conductive material until top surface of the ILD layer 174 is exposed. In some embodiments, prior to filling the conductive material into the openings, a silicidation process may be performed to form silicide layers 145-2 over the exposed surfaces of the source/drain epitaxy structures 140. The formation of the silicide layers 145-2 may be similar to the silicide layers 145-1. In some embodiments, the silicide layers 145-1 and 145-2 can be collective referred to as silicide layers 145.

Figure 25A:
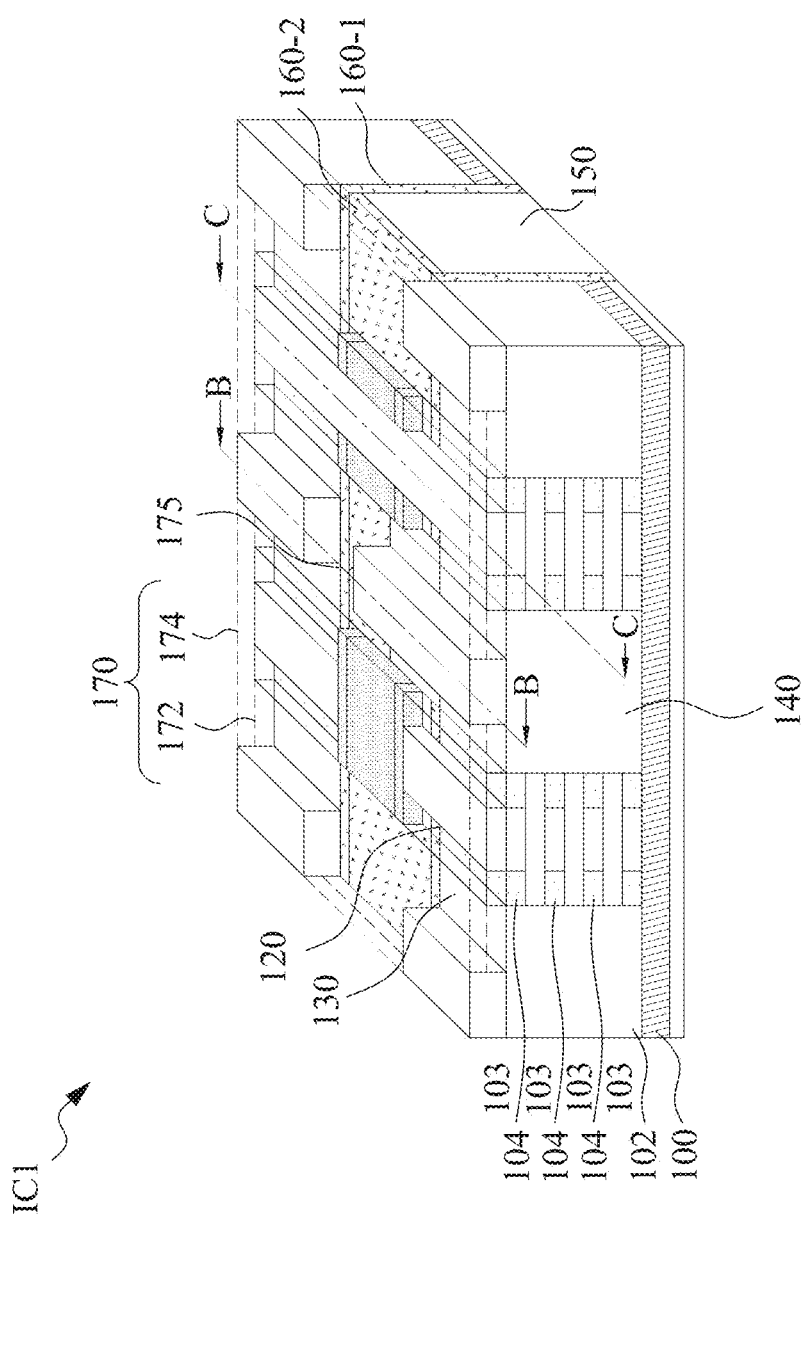
Figure 25B:
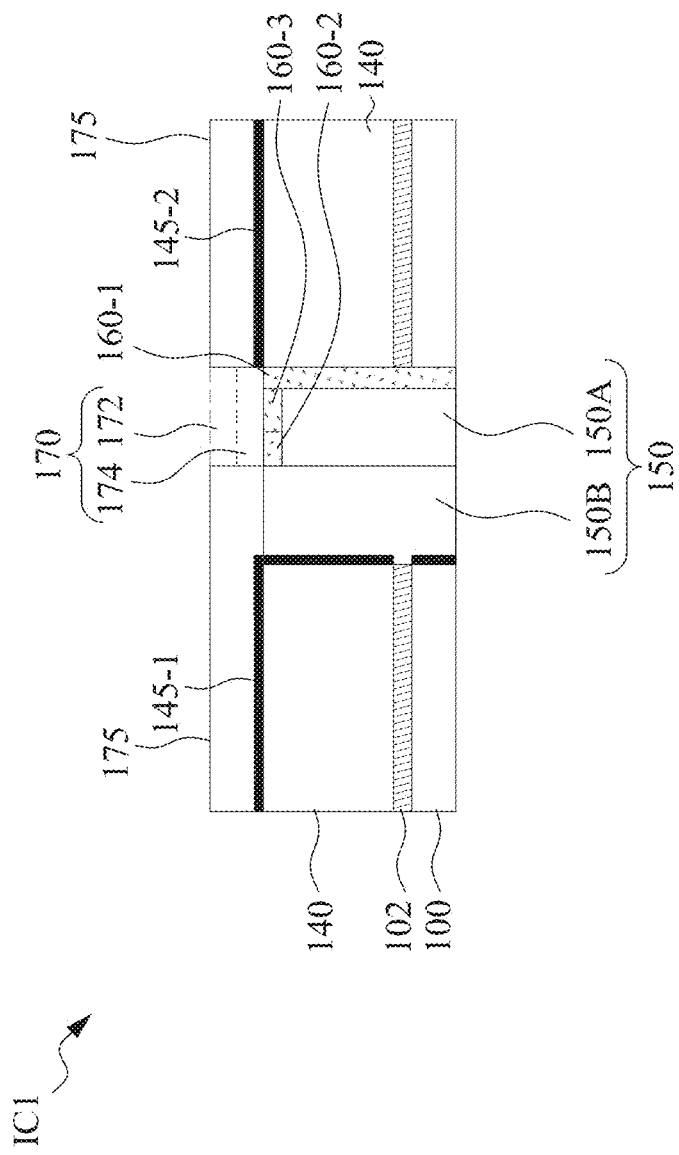
Figure 25C:
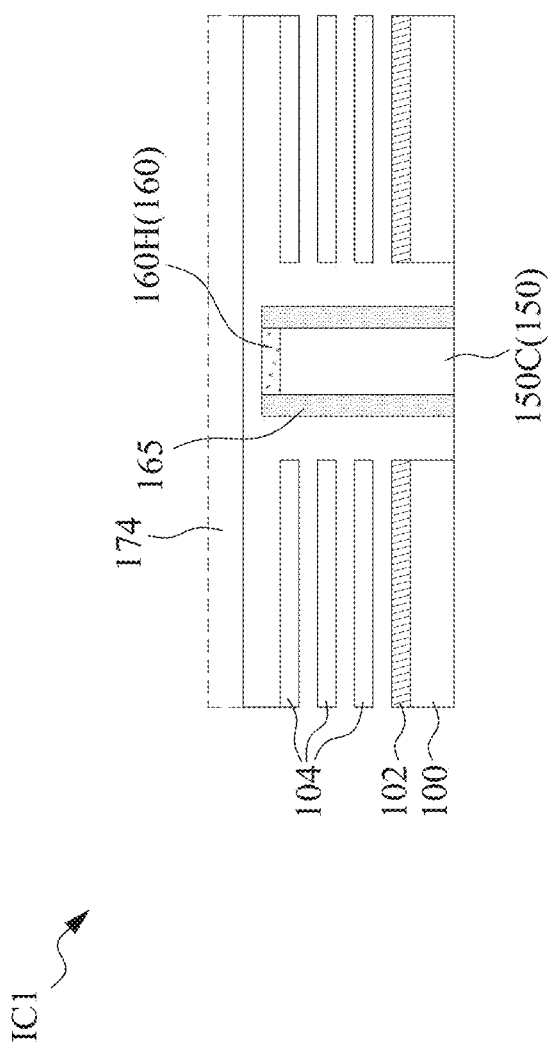

Reference is made to FIGS. 25A to 25C, in which FIG. 25B is a cross-sectional view along line B-B of FIG. 25A, and FIG. 25C is a cross-sectional view along line C-C of FIG. 25A. A CMP process is performed on the backside of the substrate 100, so as to remove portions of the substrate 100 until the backside via 150 is exposed.

Figure 26A:
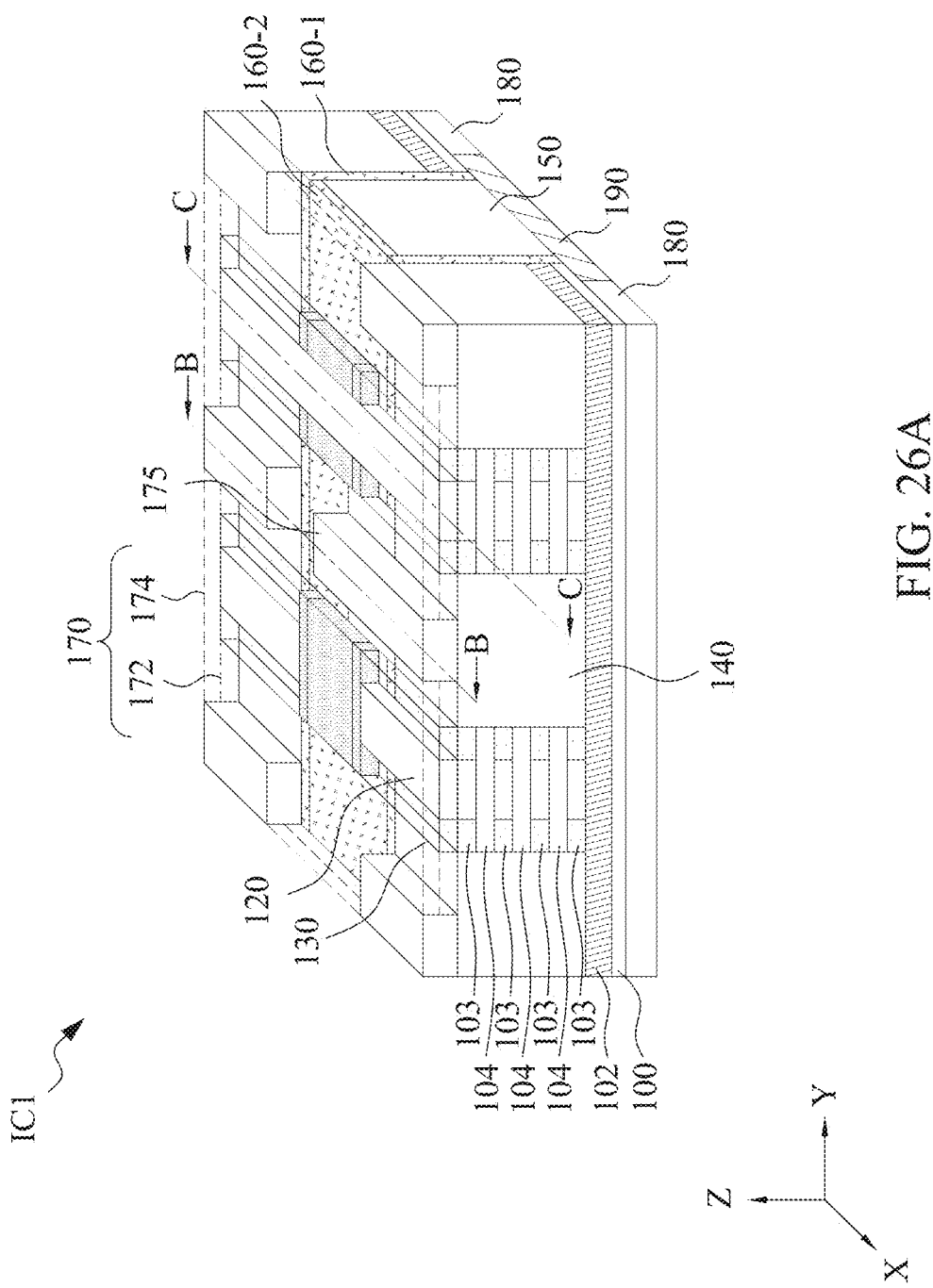
Figure 26B:
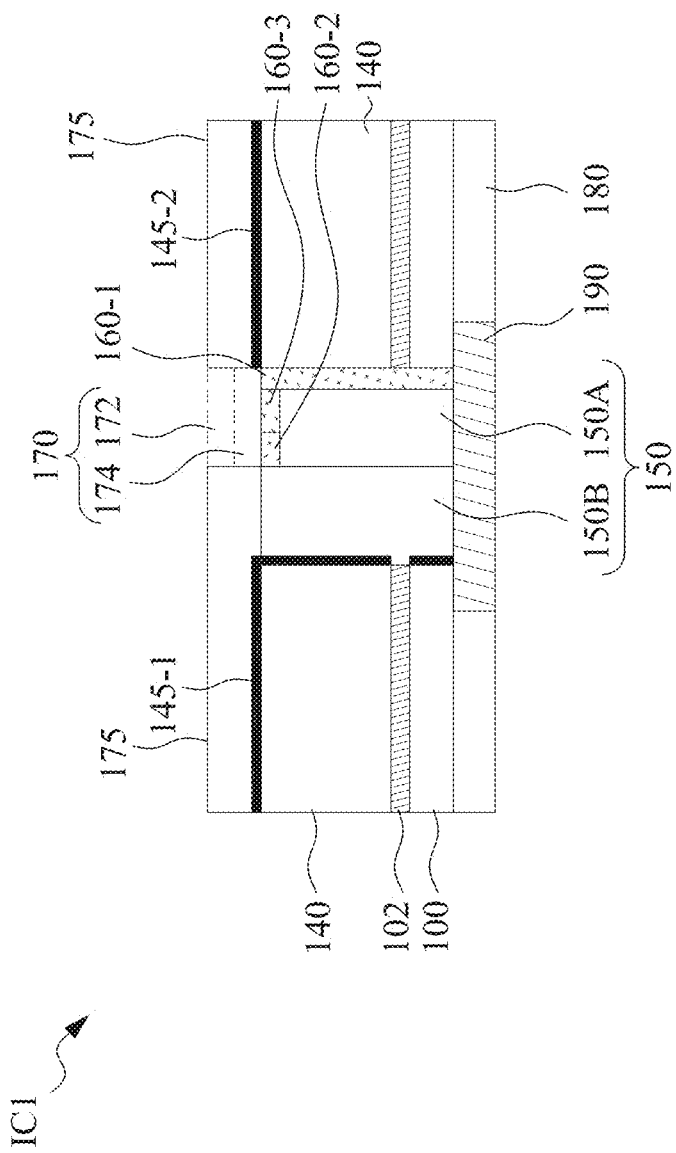
Figure 26C:
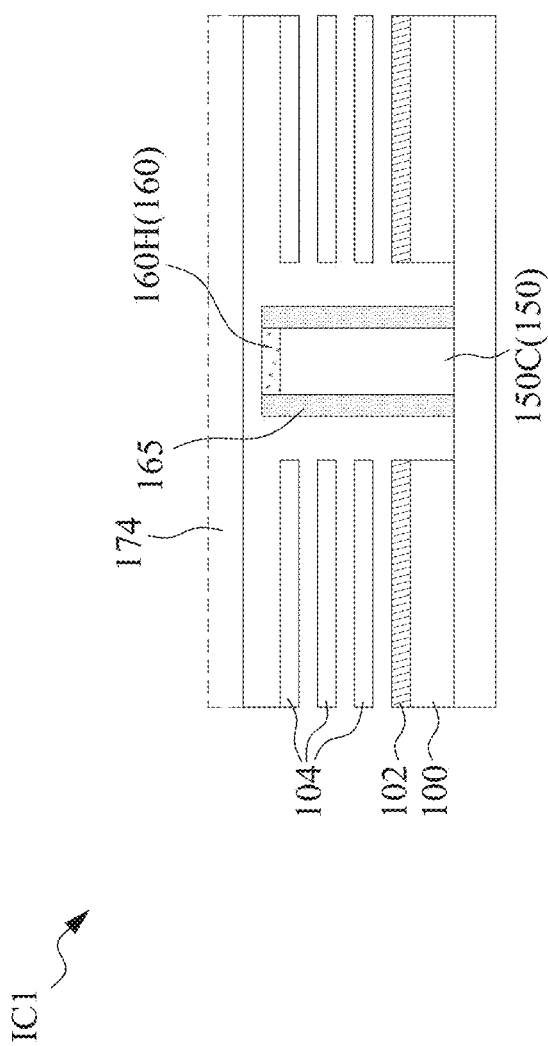

Reference is made to FIGS. 26A to 26C, in which FIG. 26B is a cross-sectional view along line B-B of FIG. 26A, and FIG. 26C is a cross-sectional view along line C-C of FIG. 26A. A backside dielectric layer 180 is formed on the backside of the substrate 100, and backside metal lines 190 are formed in the backside dielectric layer 180. In some embodiments, the backside dielectric layer 180 may be deposited by PVD, CVD, ALD, or other suitable deposition processes. The backside metal lines 190 may be formed by patterning the backside dielectric layer 180 to form openings and filling conductive material in the openings.

In some embodiments, portions of the third dielectric spacers 163 may remain under the gate spacers 130 after the processes described in FIGS. 2 to 26C, and the resulting structure can be seen at FIG. 1D.

Figure 27B:
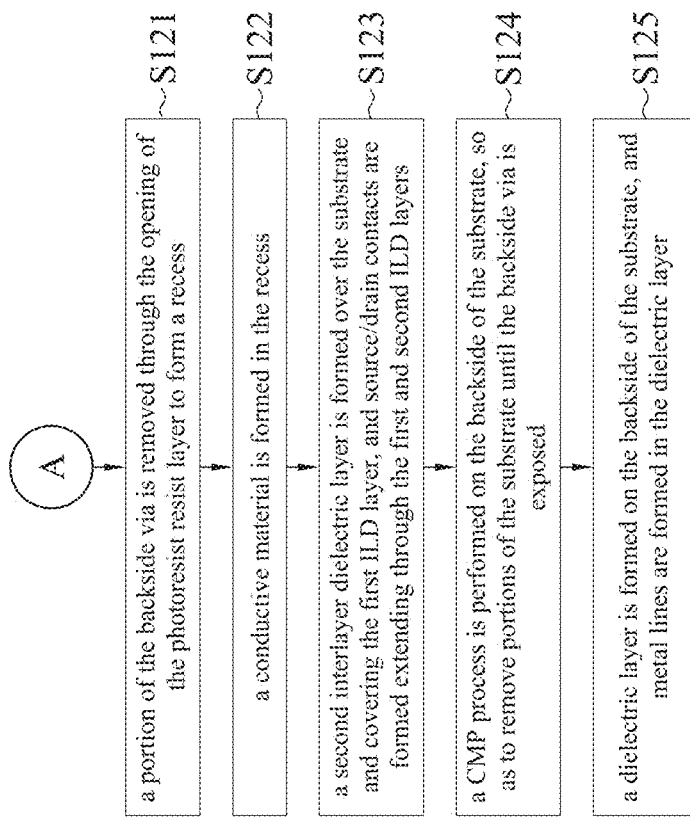

FIGS. 27A and 27B illustrate a method M1 of manufacturing an integrated circuit in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, a plurality of first semiconductor layers and second semiconductor layers are alternately deposited over a substrate. FIG. 2 illustrates schematic views of some embodiments corresponding to act in block S101.

At block S102, a hard mask is formed over a topmost second semiconductor layer, and the first semiconductor layers and second semiconductor layers are patterned to form a trench. FIG. 3 illustrates schematic views of some embodiments corresponding to act in block S102.

At block S103, first, second, and third dielectric spacers are formed in the trench. FIGS. 4A and 4B illustrate schematic views of some embodiments corresponding to act in block S103.

At block S104, a backside via is formed in the trench. FIGS. 5A and 5B illustrate schematic views of some embodiments corresponding to act in block S104.

At block S105, the backside via is etched back to form a recess. FIGS. 6A and 6B illustrate schematic views of some embodiments corresponding to act in block S105.

At block S106, a first dielectric cap is formed in the recess, and a third dielectric cap is formed over the first dielectric cap. FIGS. 7A and 7B illustrate schematic views of some embodiments corresponding to act in block S106.

At block S107, the first and second dielectric spacers are etched back. FIGS. 8A and 8B illustrate schematic views of some embodiments corresponding to act in block S107.

At block S108, the hard mask is removed. FIGS. 9A and 9B illustrate schematic views of some embodiments corresponding to act in block S108.

At block S109, dummy gate structures are formed over the substrate. FIG. 10 illustrates a schematic view of some embodiments corresponding to act in block S109.

At block S110, gate spacers are formed on opposite sidewalls of the dummy gate structures. FIG. 11 illustrates schematic views of some embodiments corresponding to act in block S110.

At block S111, the third dielectric spacers and the second dielectric cap exposed by the dummy gate structures and the gate spacers are removed to from recesses. FIGS. 12A and 12B illustrate schematic views of some embodiments corresponding to act in block S111.

At block S112, second dielectric spacers are removed to enlarge the recesses. FIGS. 13A and 13B illustrate schematic views of some embodiments corresponding to act in block S112.

At block S113, a conductive material is filled in the recesses to expand the backside via. FIGS. 14A and 14B illustrate schematic views of some embodiments corresponding to act in block S113.

At block S114, third dielectric caps are formed in the recesses. FIGS. 15A and 15B illustrate schematic views of some embodiments corresponding to act in block S114.

At block S115, an etching process is performed to remove portions of the first and second semiconductor layers exposed by the dummy gate structures and the gate spacers to form recesses. FIGS. 16A and 16B illustrate schematic views of some embodiments corresponding to act in block S115.

At block S116, epitaxy structures are formed in the recesses, and a first interlayer dielectric layer is formed over the epitaxy structures. FIGS. 17A and 17B illustrate schematic views of some embodiments corresponding to act in block S116.

At block S117, the dummy gate structures and first and second dielectric spacers between the gate spacers are removed to form gate trenches. FIGS. 18A and 18B illustrate schematic views of some embodiments corresponding to act in block S117.

At block S118, the second semiconductor layers are removed through the gate trenches. FIGS. 19A and 19B illustrate schematic views of some embodiments corresponding to act in block S118.

At block S119, metal gate structures are formed in the gate trenches. FIGS. 20A to 20C illustrate schematic views of some embodiments corresponding to act in block S119.

At block S120, a photoresist resist layer is formed over the substrate, a portion of the first ILD layer is removed through an opening of the photoresist resist layer, and portions of the first dielectric spacers, first dielectric cap, and third dielectric caps are removed. FIGS. 21A and 21B illustrate schematic views of some embodiments corresponding to act in block S120.

At block S121, a portion of the backside via is removed through the opening of the photoresist resist layer to form a recess. FIGS. 22A and 22B illustrate schematic views of some embodiments corresponding to act in block S121.

At block S122, a conductive material is formed in the recess. FIGS. 23A and 23B illustrate schematic views of some embodiments corresponding to act in block S122.

At block S123, a second interlayer dielectric layer is formed over the substrate and covering the first ILD layer, and source/drain contacts are formed extending through the first and second ILD layers. FIGS. 24A to 24C illustrate schematic views of some embodiments corresponding to act in block S123.

At block S124, a CMP process is performed on the backside of the substrate, so as to remove portions of the substrate until the backside via is exposed. FIGS. 25A to 25C illustrate schematic views of some embodiments corresponding to act in block S124.

At block S125, a dielectric layer is formed on the backside of the substrate, and metal lines are formed in the dielectric layer. FIGS. 26A to 26C illustrate schematic views of some embodiments corresponding to act in block S125.

Figure 28A:
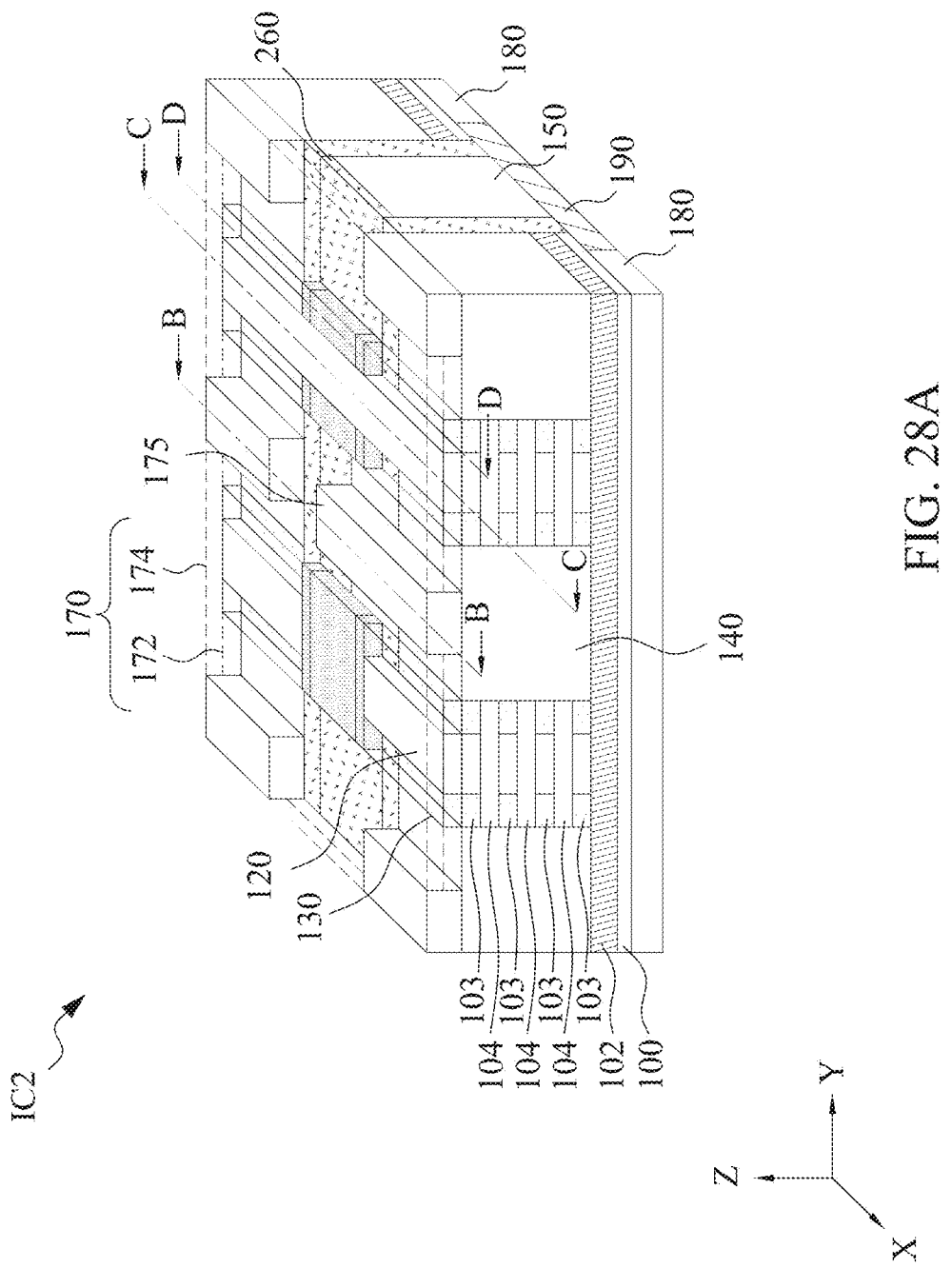
FIGS. 28A to 28E are schematic views of an integrated circuit in accordance with some embodiments of the present disclosure.
Figure 28B:
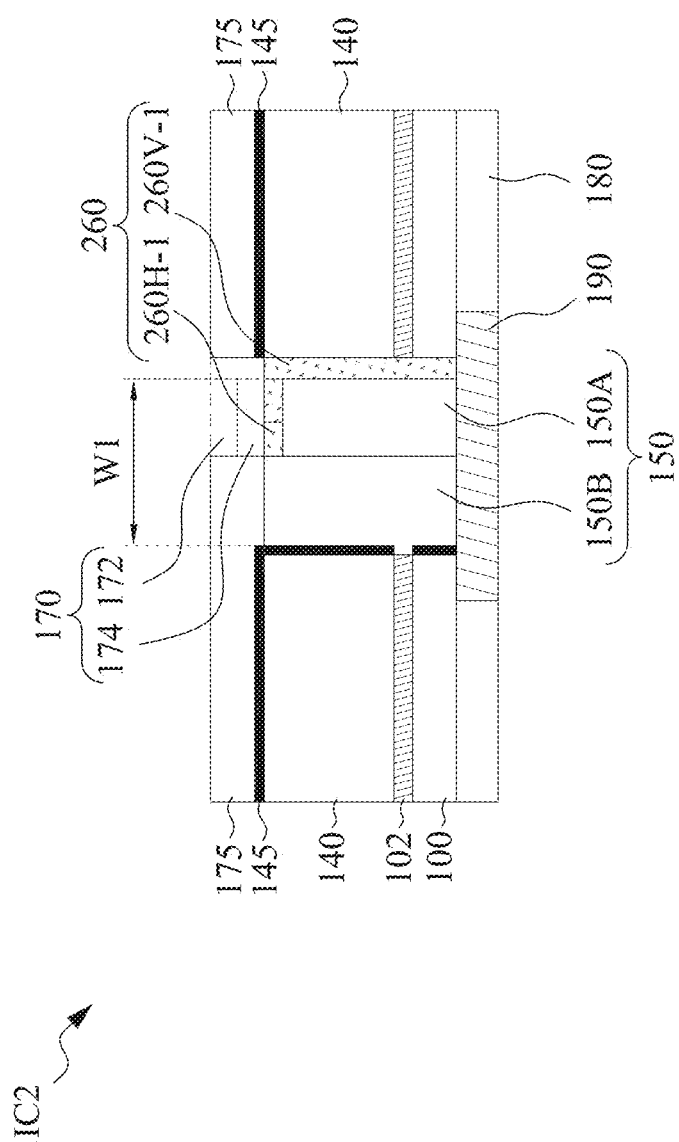
Figure 28C:
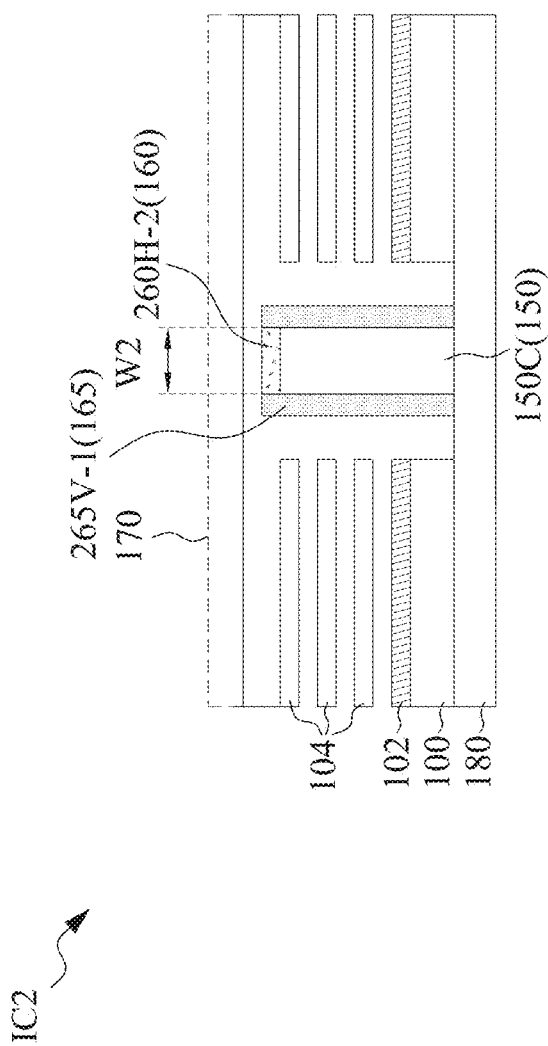
Figure 28D:
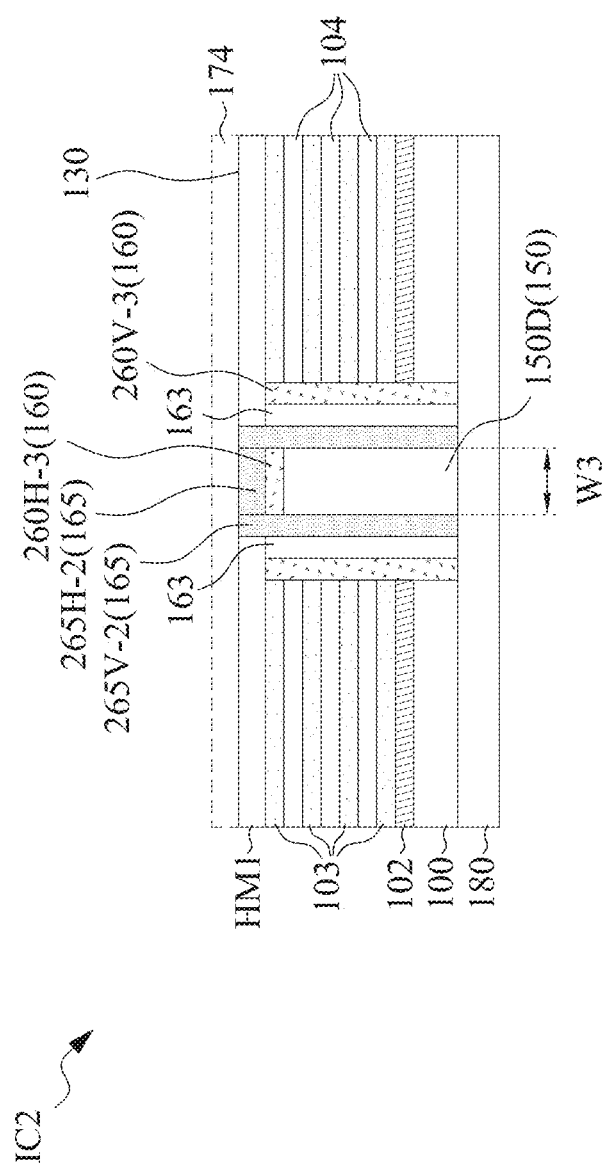
Figure 28E:
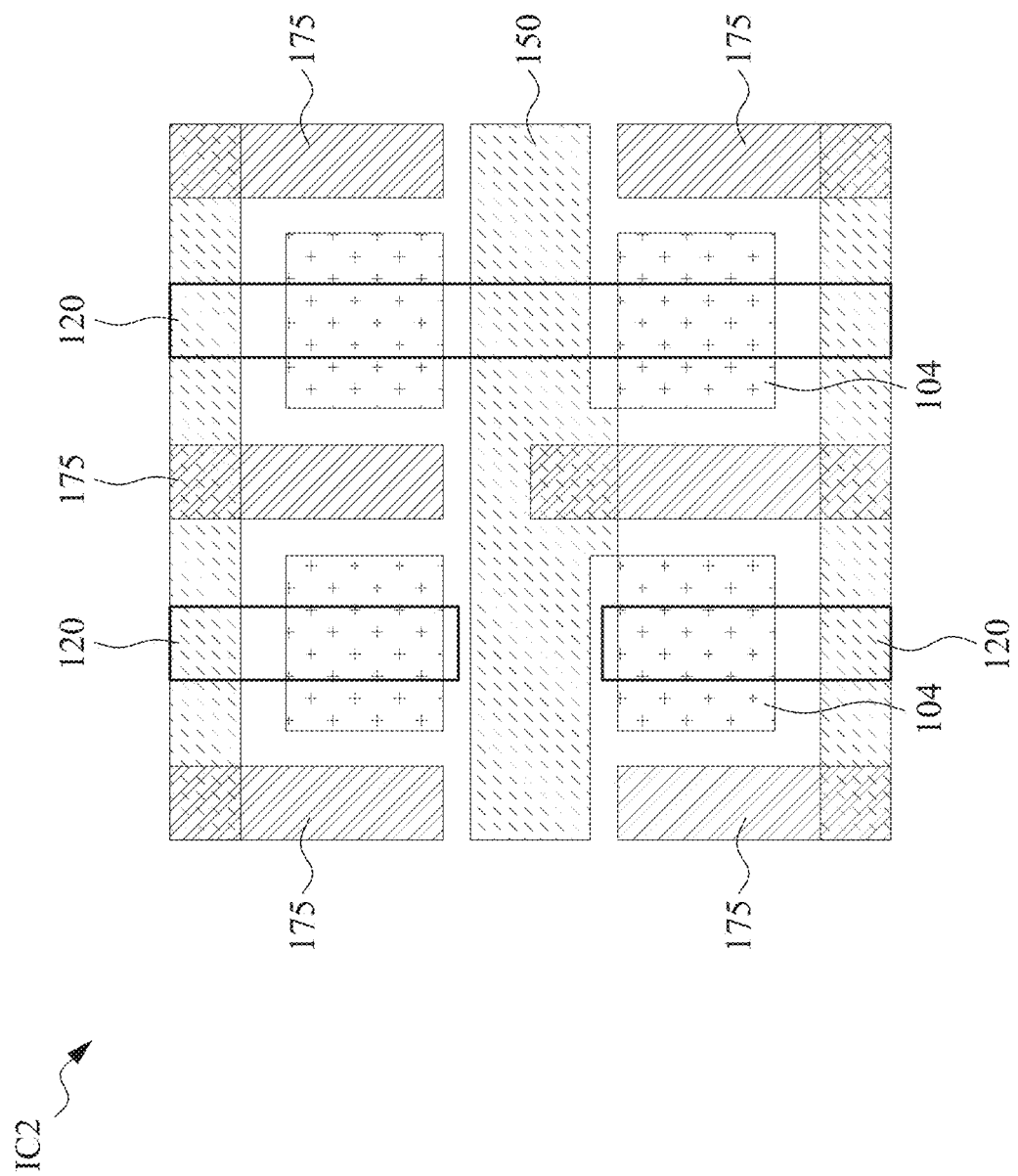

FIGS. 28A to 28E are schematic views of an integrated circuit IC2 in accordance with some embodiments of the present disclosure, in which FIG. 28A is a perspective view of an integrated circuit IC1, FIG. 28B is a cross-sectional view along line B-B of FIG. 28A, FIG. 28C is a cross-sectional view along line C-C of FIG. 28A, FIG. 28D is a cross-sectional view along line D-D of FIG. 28A, and FIG. 28E is a top view of FIG. 28A. It is noted that some elements in FIGS. 28A to 28D are not illustrated in FIG. 28E for simplicity. It is noted that some elements of FIGS. 28A to 28D are similar to those described in FIGS. 1A to 1D, such elements are labeled the same, and relevant structural details will not be repeated for brevity. Similar to the integrated circuit IC1 of FIGS. 1A to 1D, the integrated circuit IC2 of FIGS. 28A to 28D includes a first dielectric spacer 260 and a second dielectric spacer 265.

In the cross-sectional view of FIG. 28B, the first dielectric spacer 260 includes a horizontal portion 260H-1 and a vertical portion 260V-1. On the other hand, in the cross-sectional view of FIG. 28C, the first dielectric spacer 260 has a horizontal portion 260H-2, and the second dielectric spacer 265 has vertical portions 265V-1. It is noted that the structural relationships of elements in FIGS. 28B and 28C are similar to those described in FIGS. 1B and 1C, and thus relevant details will not be repeated for brevity.

In the cross-sectional view of FIG. 28D, the first dielectric spacer 260 has a horizontal portion 260H-3 and vertical portions 260V-3, and the second dielectric spacer 265 has a horizontal portion 265H-2 and vertical portions 265V-2. FIG. 28D is different from FIG. 1D, in that there is no dielectric spacer (e.g., the third dielectric spacer 163 in FIG. 1D) between the vertical portion 260V-3 of the first dielectric spacer 260 and the vertical portion 260V-2 of the second dielectric spacer 265. That is, the vertical portion 260V-3 of the first dielectric spacer 260 is in contact with the vertical portion 260V-2 of the second dielectric spacer 265. In some embodiments, the vertical portion 260V-3 of the first dielectric spacer 260 in FIG. 28D is wider than the vertical portion 260V-1 of the first dielectric spacer 260 in FIG. 28B.

FIGS. 29 to 52C illustrate a method in various stages of fabricating the integrated circuit IC2 of FIGS. 28A to 28D in accordance with some embodiments of the present disclosure. It is noted that some processes of FIGS. 29 to 52C are similar to those described in FIGS. 2 to 26C, and thus relevant details will not be repeated for brevity.

Figure 29:
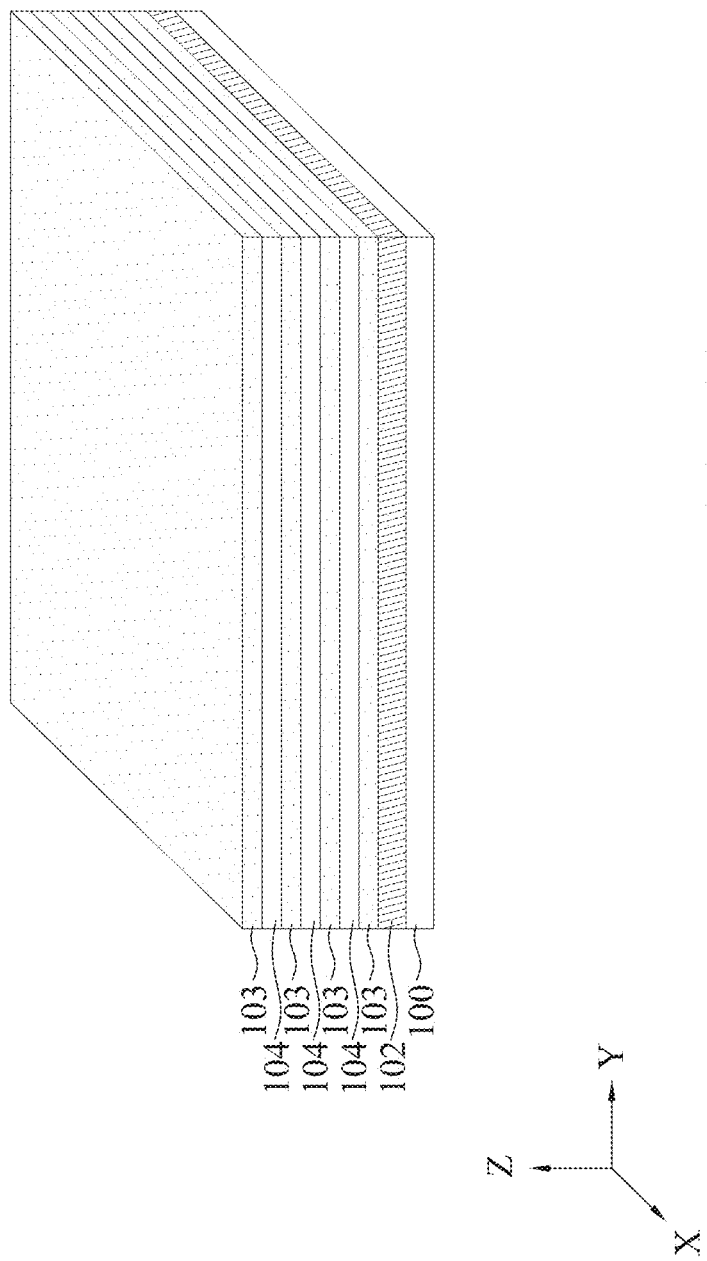
FIGS. 29 to 52C illustrate a method in various stages of fabricating an integrated circuit in accordance with some embodiments of the present disclosure.

Reference is made to FIG. 29. A dielectric layer 102 is formed over a substrate 100, and a plurality of semiconductor layers 103 and semiconductor layers 104 are alternately deposited over the substrate 100.

Figure 30:
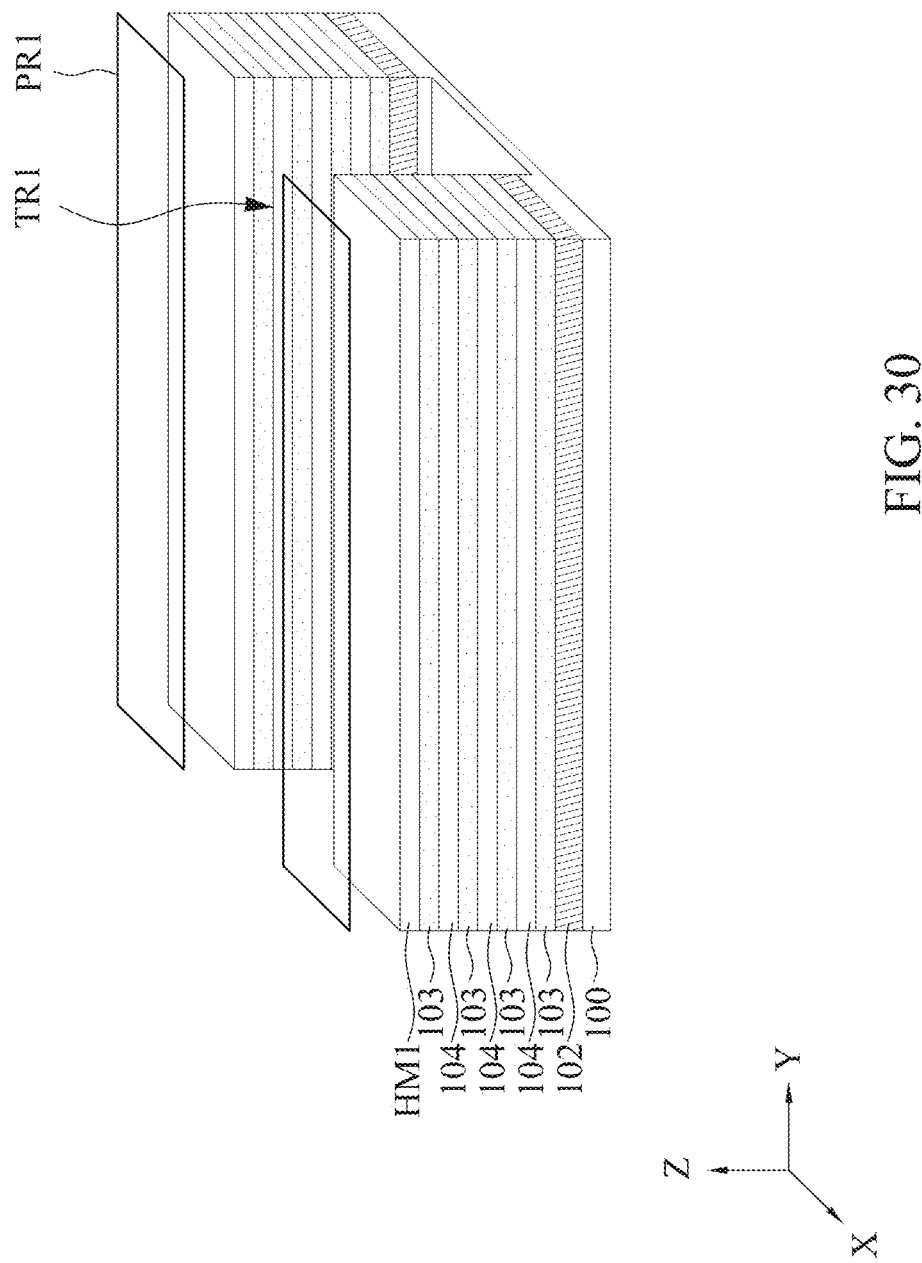

Reference is made to FIG. 30. A hard mask HM1 is formed over the substrate 100 and covering the topmost one of the semiconductor layers 103. A photoresist layer PR1 is formed over the hard mask HM1. Next, an etching process is performed, through the photoresist layer PR1, to remove portions of the hard mask HM1, the semiconductor layers 103, 104, the dielectric layer 102, and the substrate 100, so as to form a trench TR1 in the hard mask HM1, the semiconductor layers 103, 104, the dielectric layer 102, and the substrate 100.

Figure 31A:
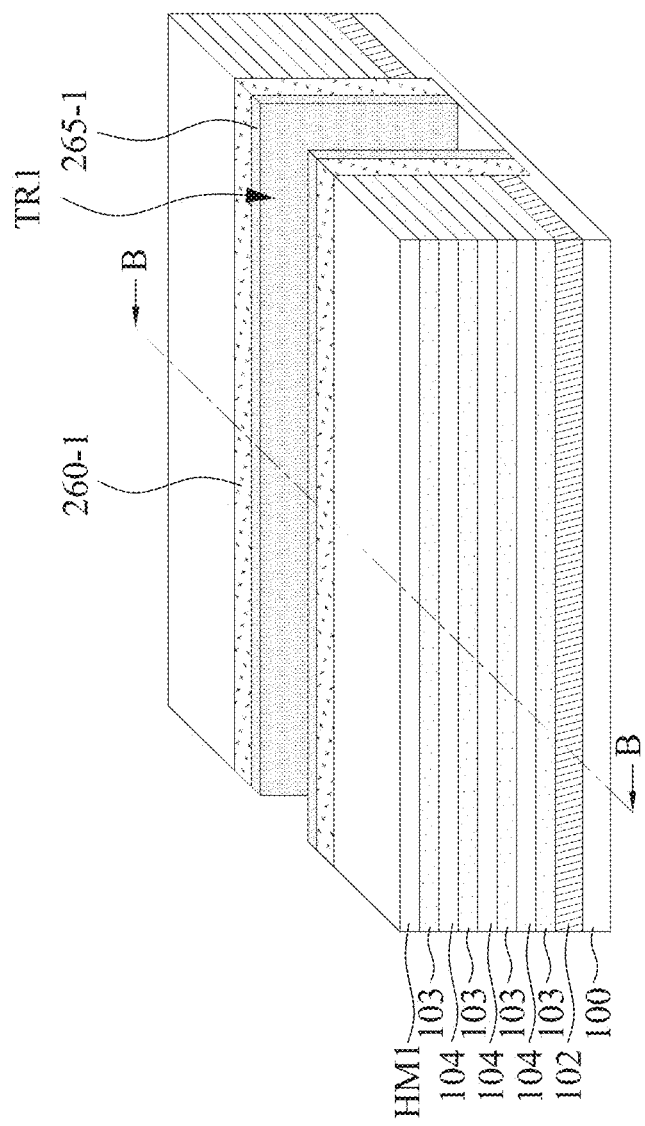
Figure 31B:
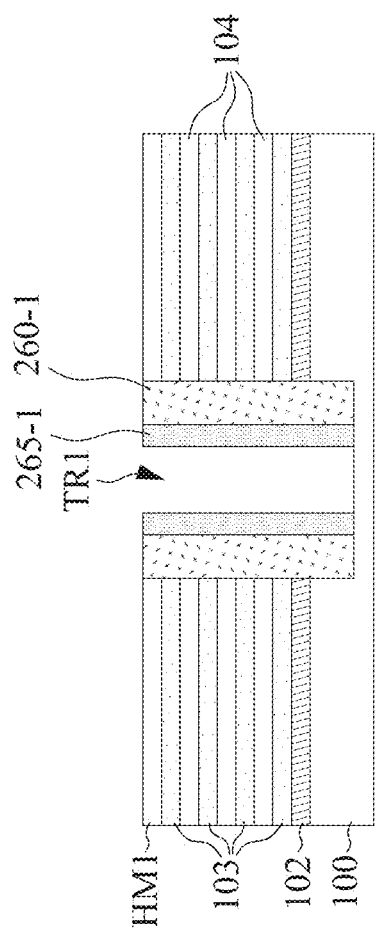

Reference is made to FIGS. 31A and 31B, in which FIG. 31B is a cross-sectional view along line B-B of FIG. 31A. Dielectric spacers 260-1 and 265-1 are formed in the trench TR1. In the cross-sectional view of FIG. 31B, the dielectric spacers 260-1 are formed to have a lateral width wider than the dielectric spacers 265-1. The dielectric spacers 260-1 and 265-1 may be formed by a similar method as the dielectric spacers 160-1 and 165-1 of FIGS. 4A and 4B.

Figure 32A:
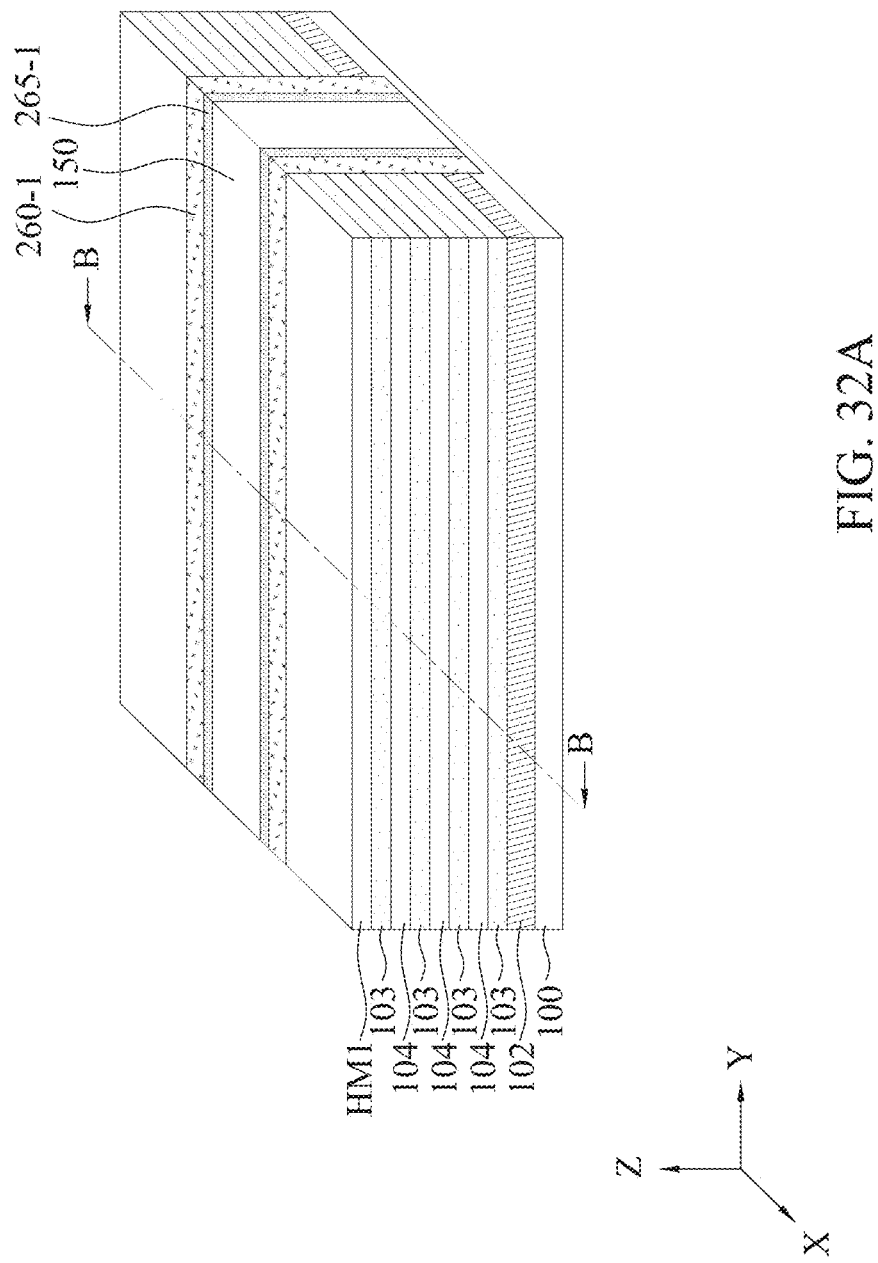
Figure 32B:
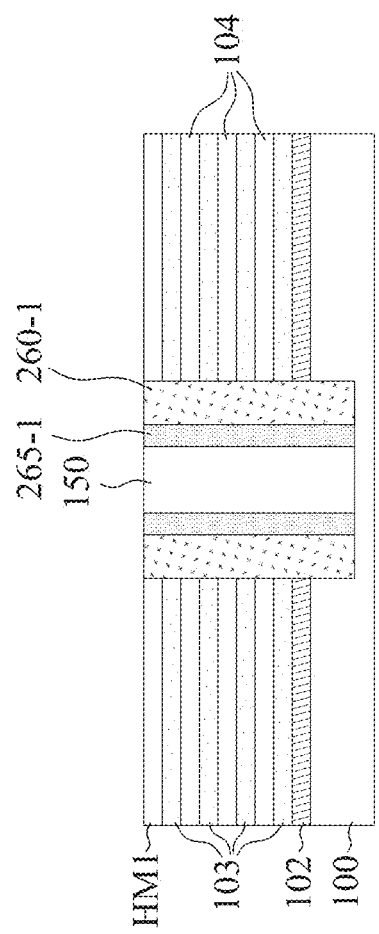

Reference is made to FIGS. 32A and 32B, in which FIG. 32B is a cross-sectional view along line B-B of FIG. 32A. A backside via 150 is formed in the trench TR1.

Figure 33A:
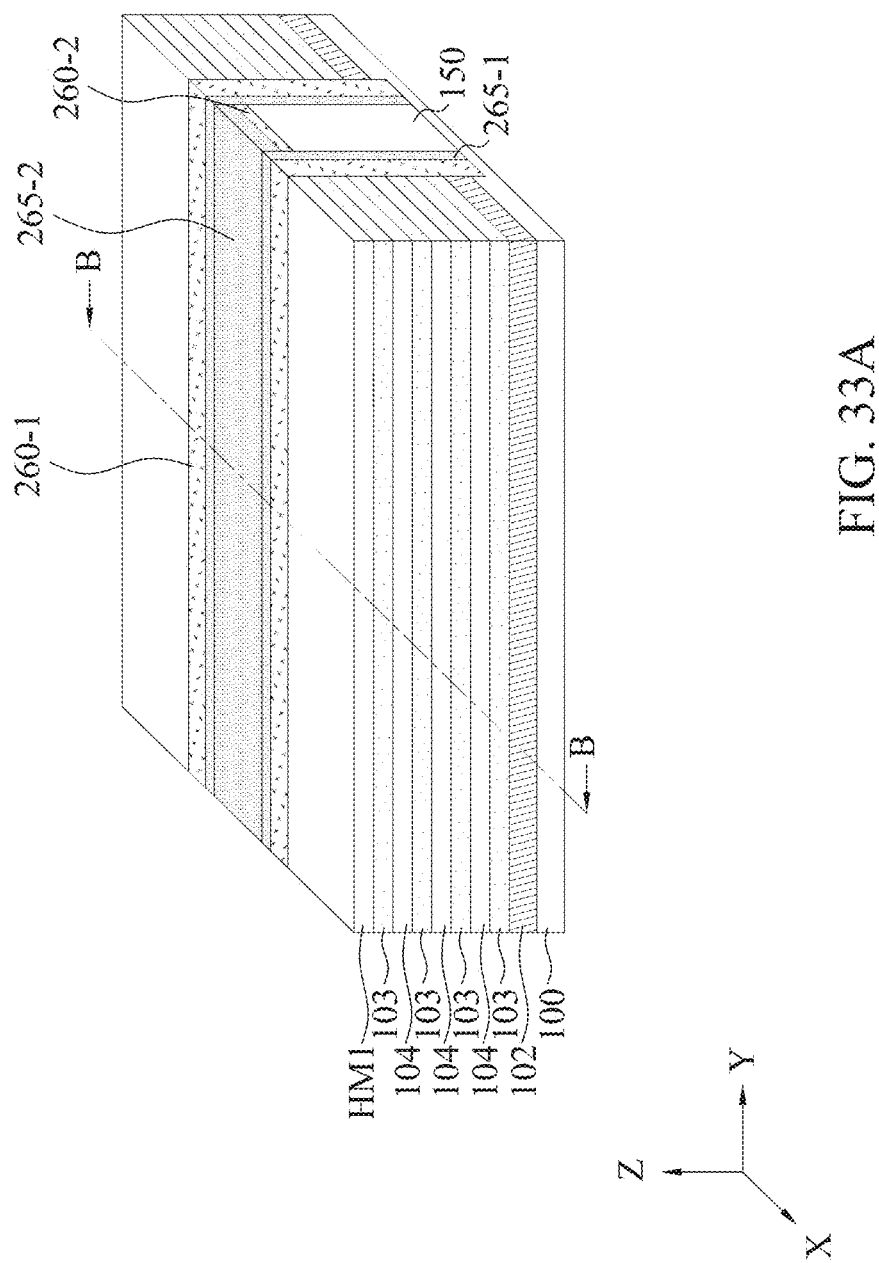
Figure 33B:
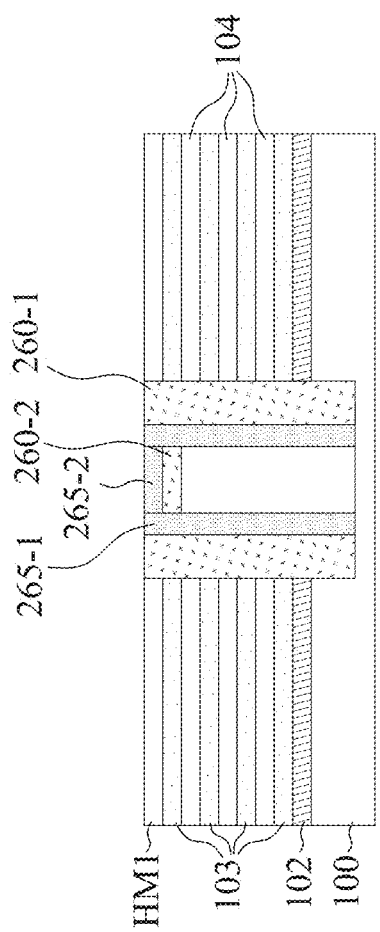

Reference is made to FIGS. 33A and 33B, in which FIG. 33B is a cross-sectional view along line B-B of FIG. 33A. The backside via 150 is etched back. Next, a dielectric cap 260-2 is formed over the backside via 150, and a dielectric cap 265-2 is formed over the dielectric cap 260-2. The process described in FIGS. 33A and 33B is similar to those described in FIGS. 6A to 7B.

Figure 34A:
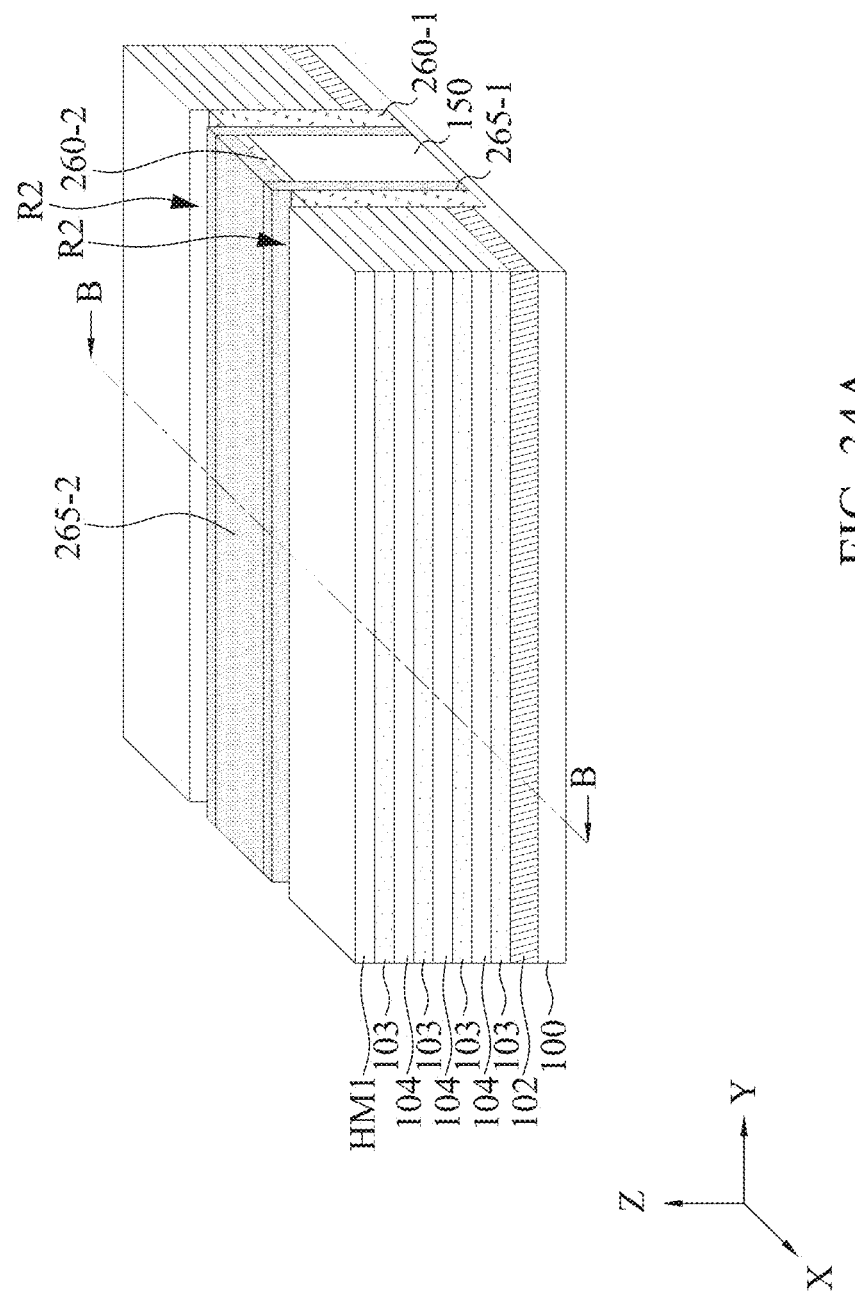
Figure 34B:
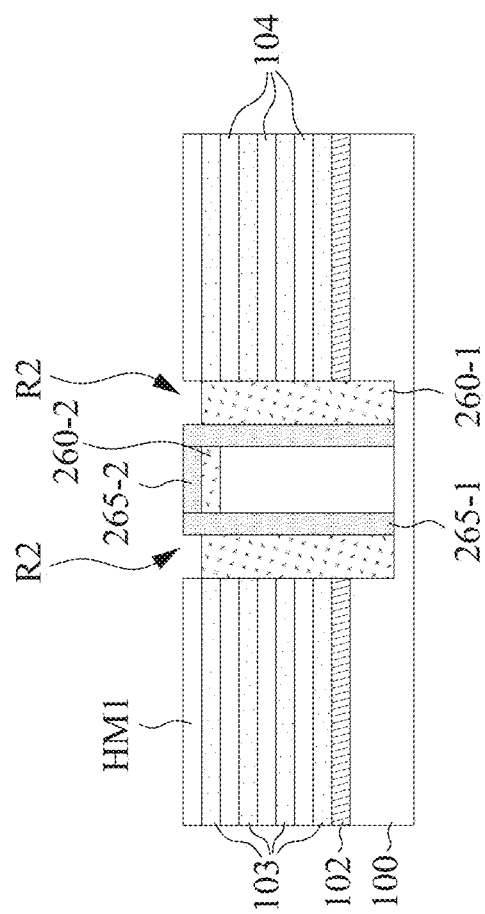

Reference is made to FIGS. 34A and 34B, in which FIG. 34B is a cross-sectional view along line B-B of FIG. 34A. The dielectric spacers 260-1 are etched back to form recesses R2.

Figure 35A:
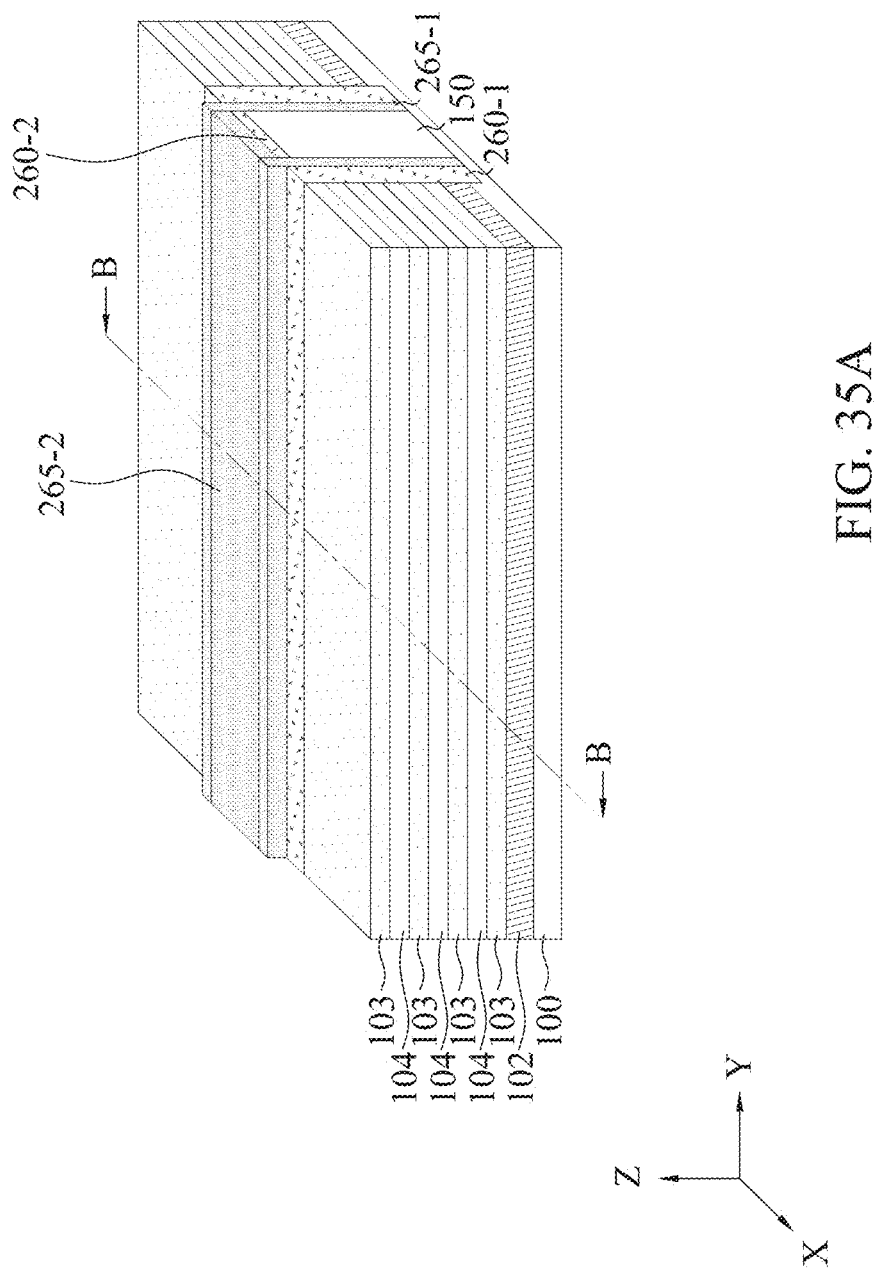
Figure 35B:
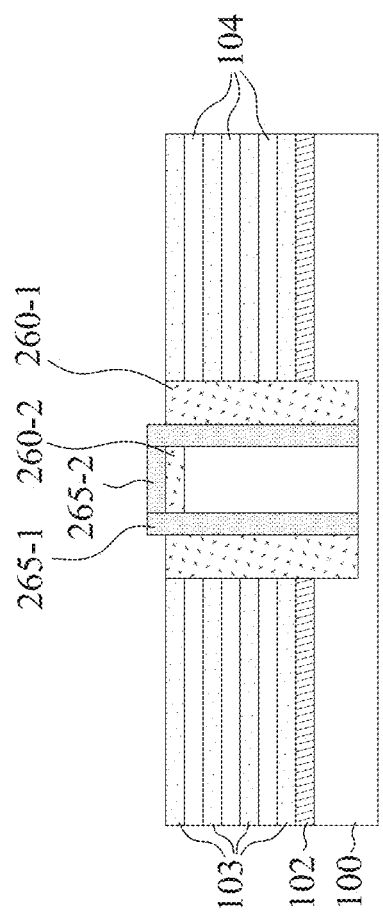

Reference is made to FIGS. 35A and 35B, in which FIG. 35B is a cross-sectional view along line B-B of FIG. 35A. The hard mask HM1 is removed to expose the topmost semiconductor layers 103.

Figure 36A:
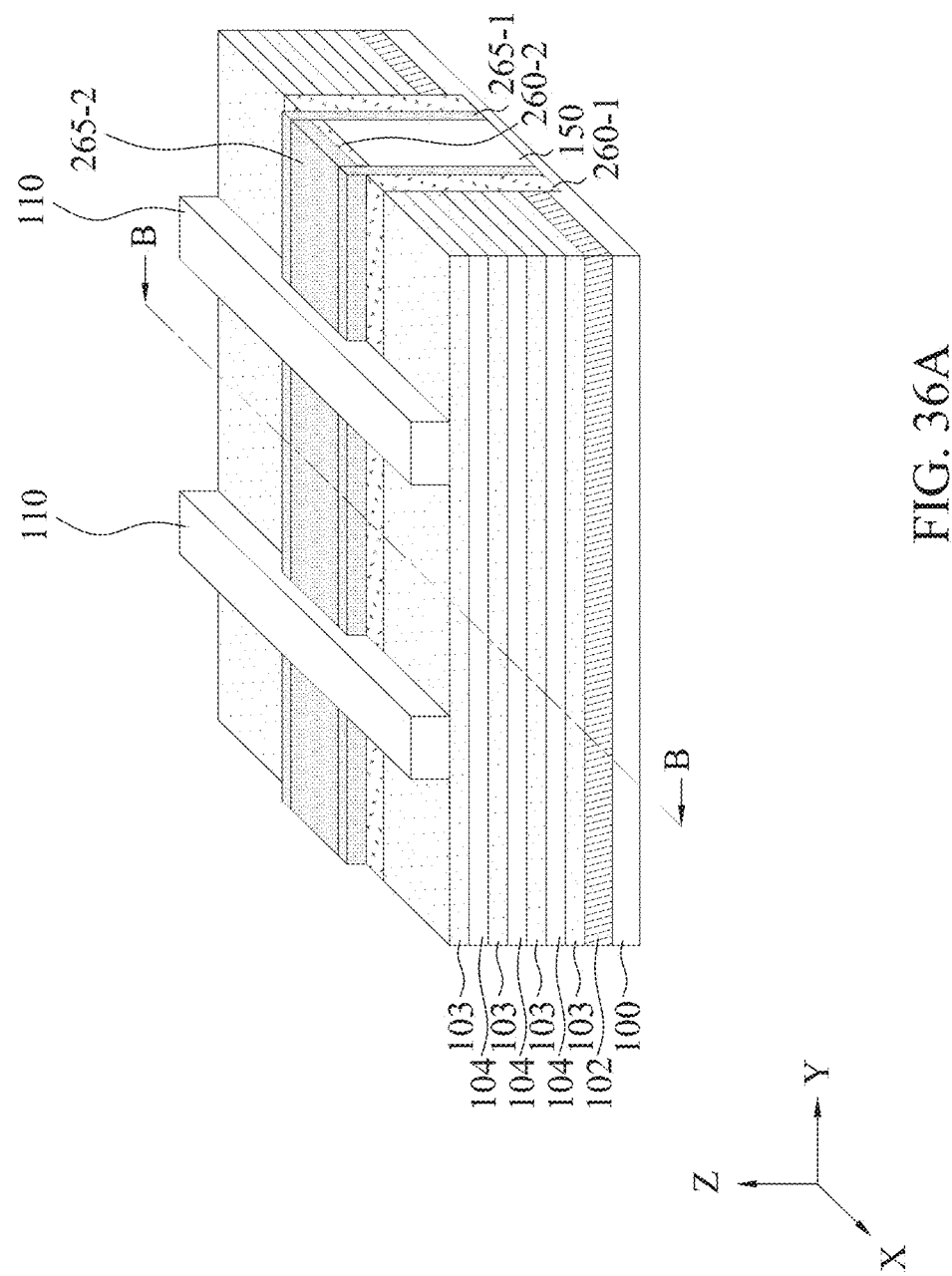
Figure 36B:
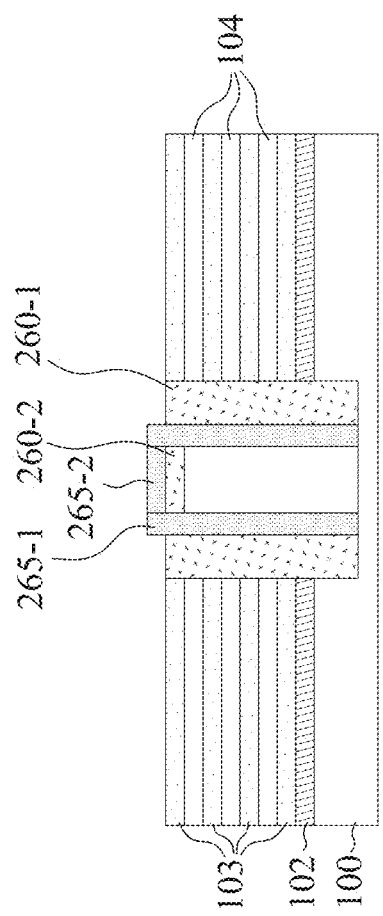

Reference is made to FIGS. 36A and 36B, in which FIG. 36B is a cross-sectional view along line B-B of FIG. 36A. Dummy gate structures 110 are formed over the substrate and over the semiconductor layers 103, 104.

Figure 37:
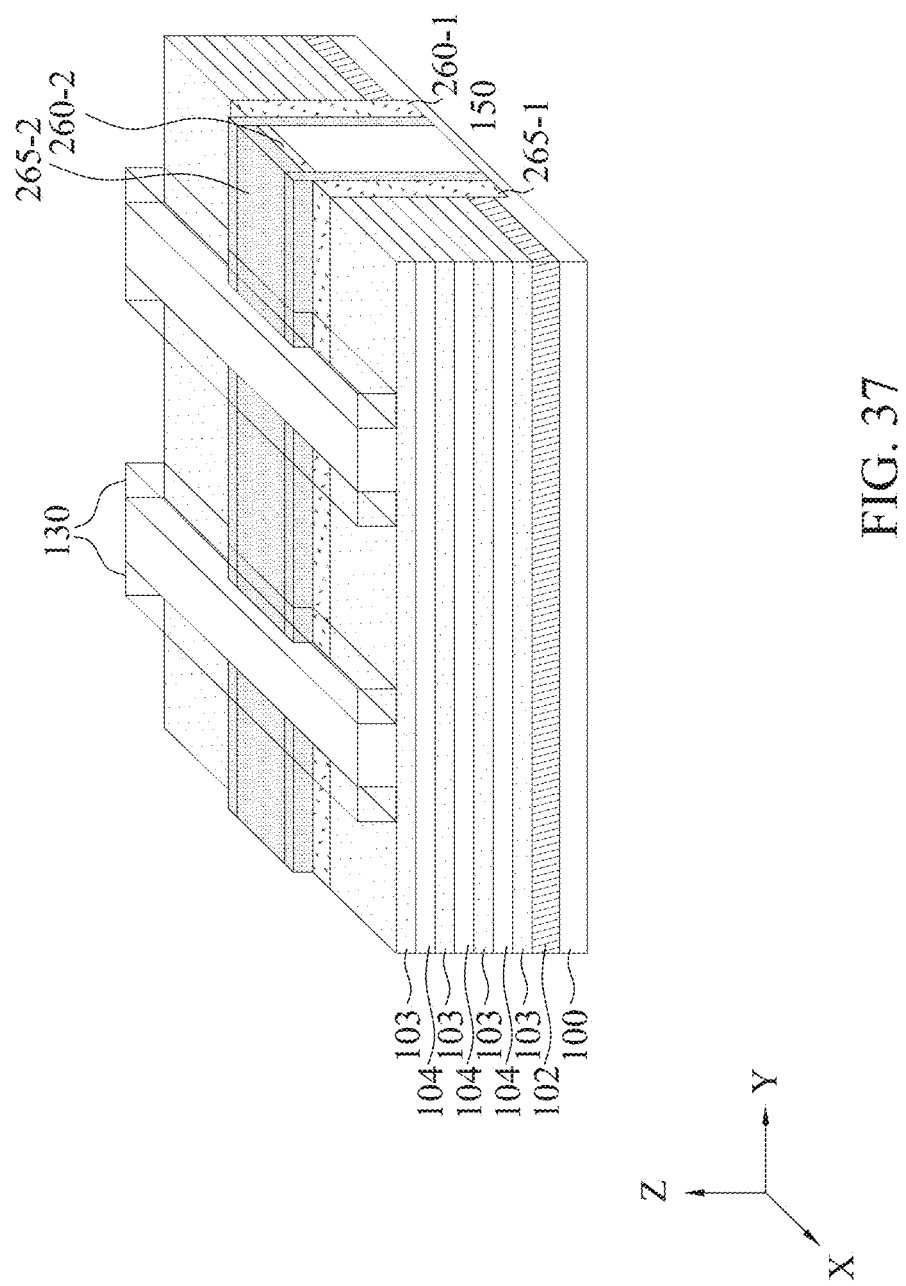

Reference is made to FIG. 37. Gate spacers 130 are formed on opposite sidewalls of the dummy gate structures 110.

Figure 38A:
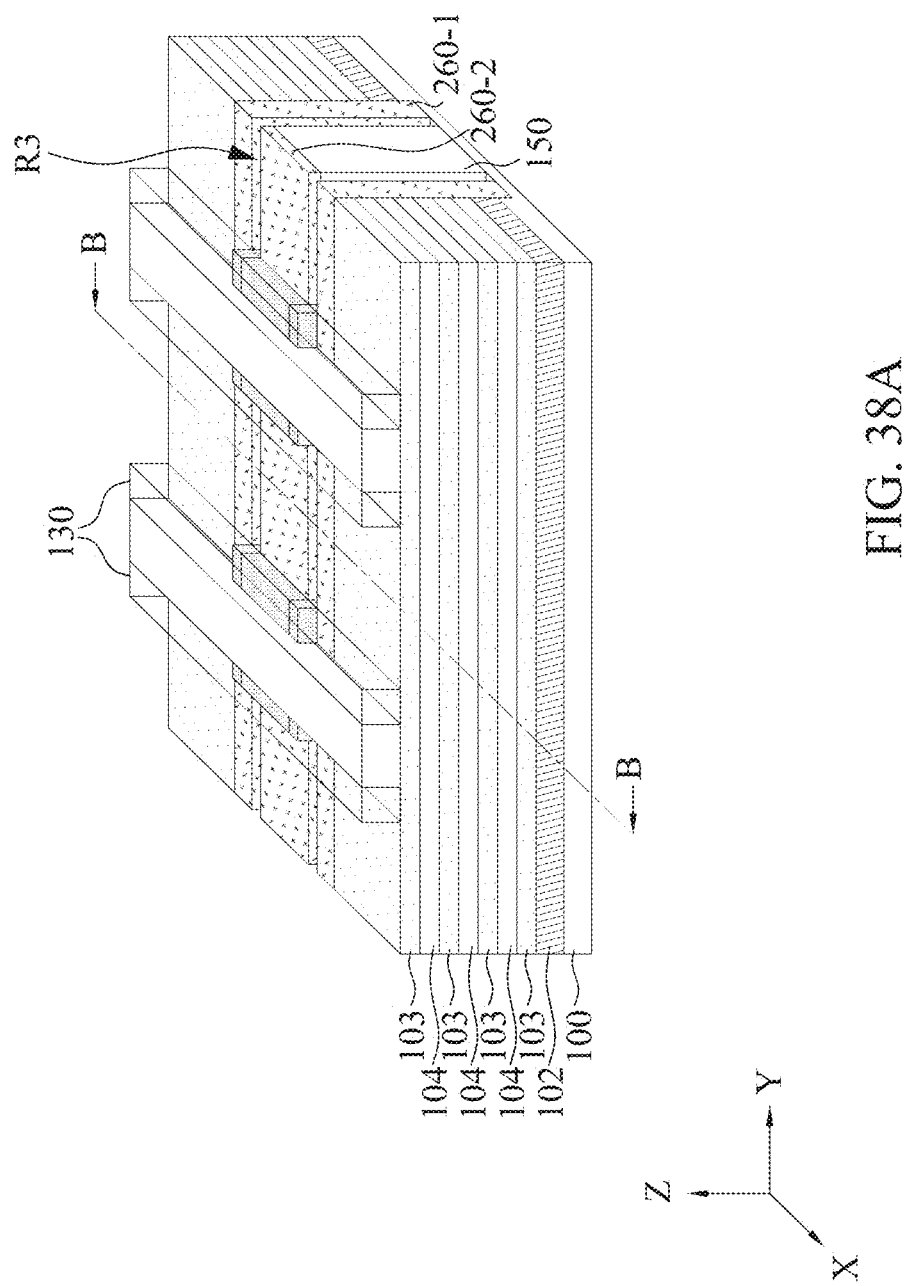
Figure 38B:
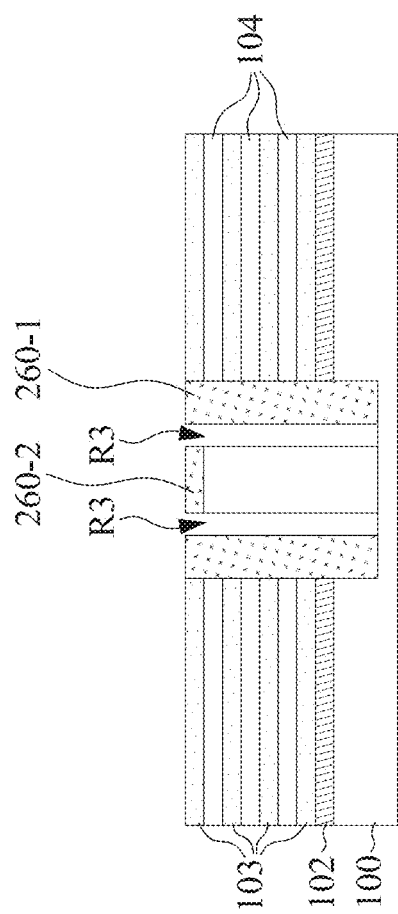

Reference is made to FIGS. 38A and 38B, in which FIG. 38B is a cross-sectional view along line B-B of FIG. 38A. An etching process is performed to remove the dielectric spacers 265-1 and dielectric cap 265-2 exposed by the dummy gate structures 110 and the gate spacers 130 to form recesses R3.

Figure 39A:
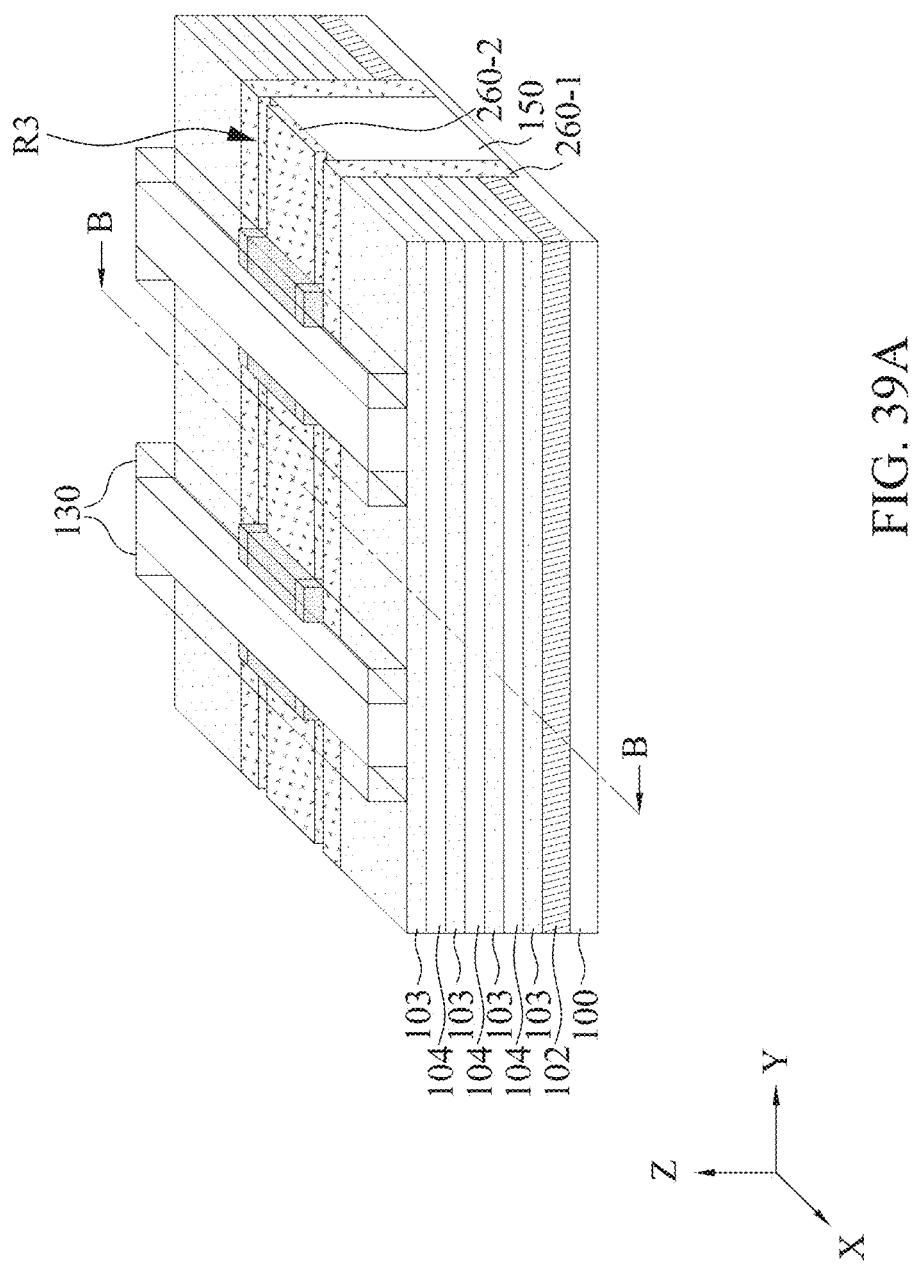
Figure 39B:
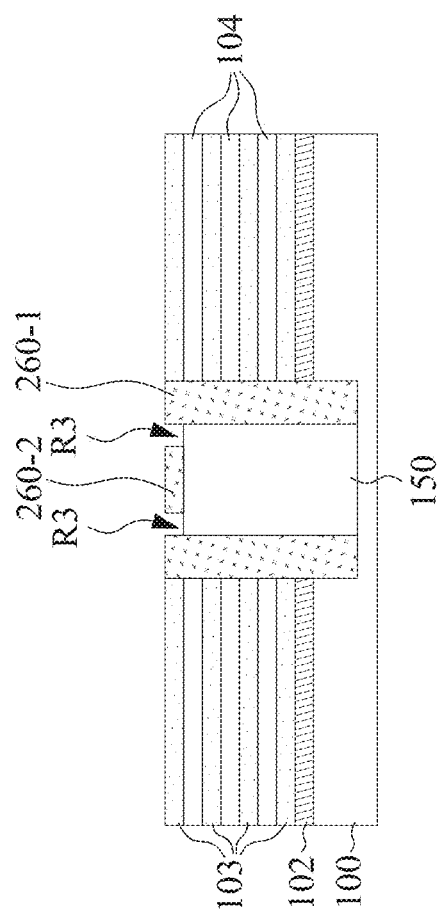

Reference is made to FIGS. 39A and 39B, in which FIG. 39B is a cross-sectional view along line B-B of FIG. 39A. The backside via 150 is expanded by filling a conductive material in the recesses R3.

Figure 40A:
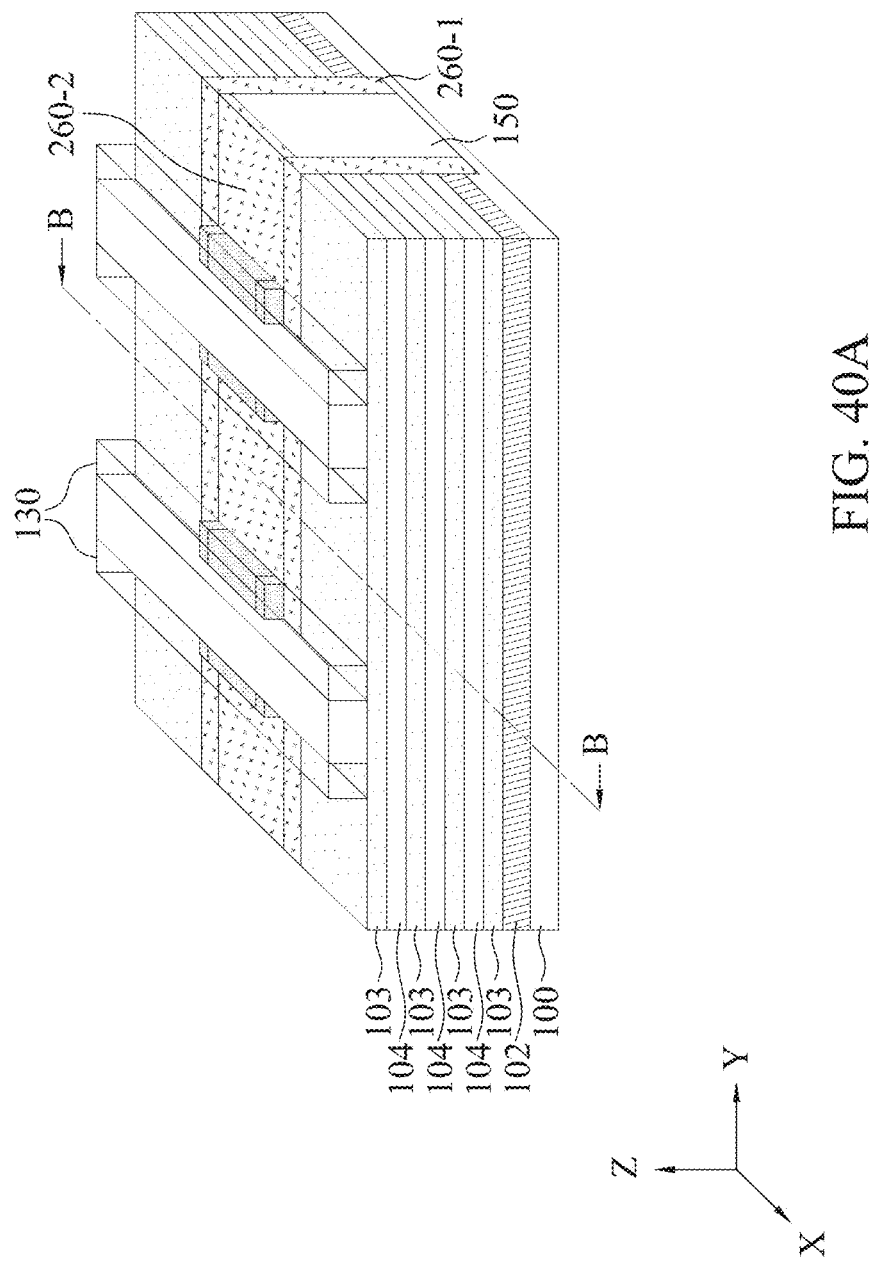
Figure 40B:
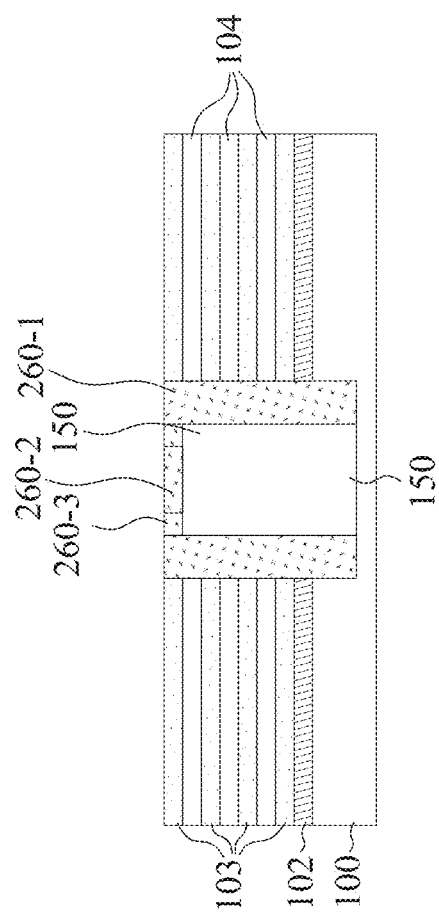

Reference is made to FIGS. 40A and 40B, in which FIG. 40B is a cross-sectional view along line B-B of FIG. 40A. Dielectric caps 260-3 are formed in the recesses R3. The dielectric caps 260-3 may be formed by similar method as described in FIGS. 15A and 15B.

Figure 41A:
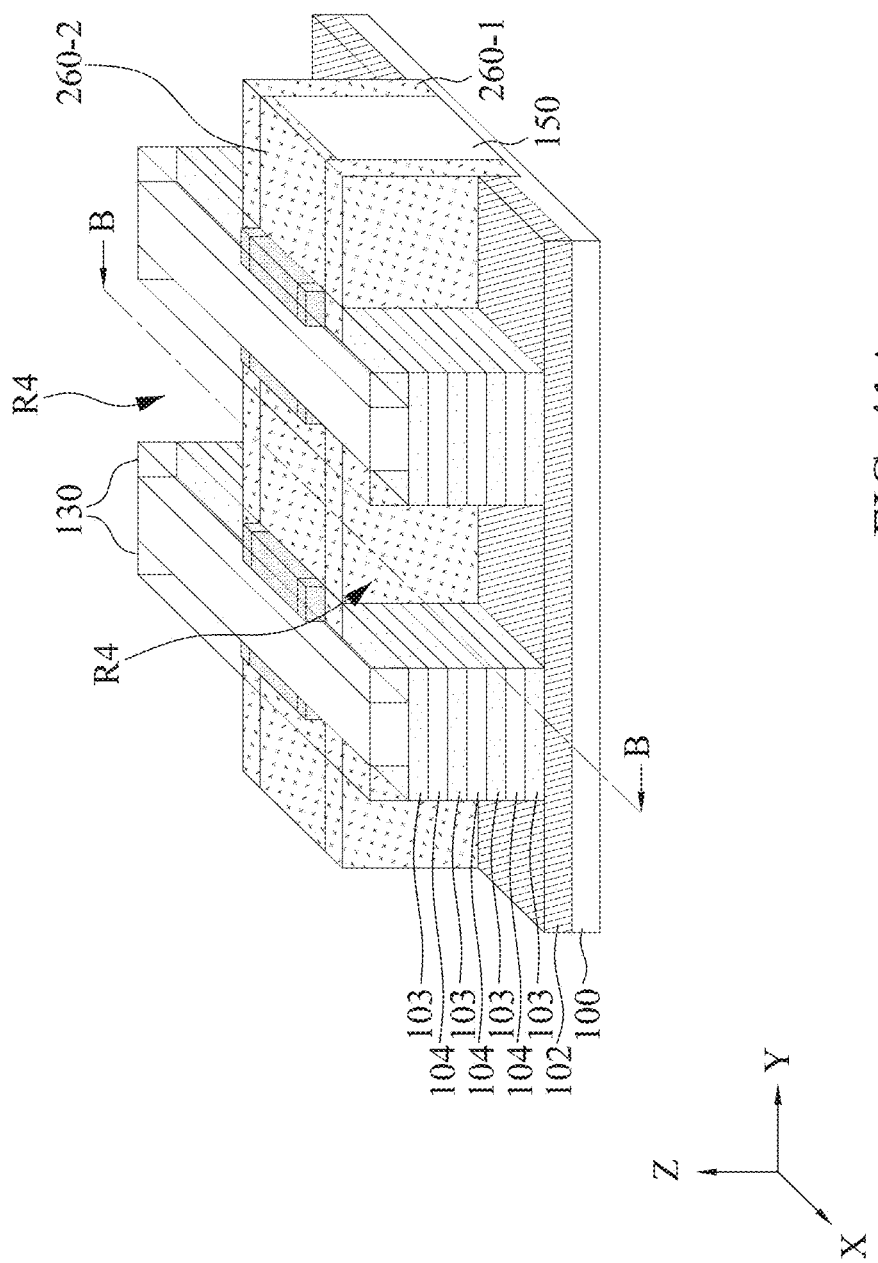
Figure 41B:
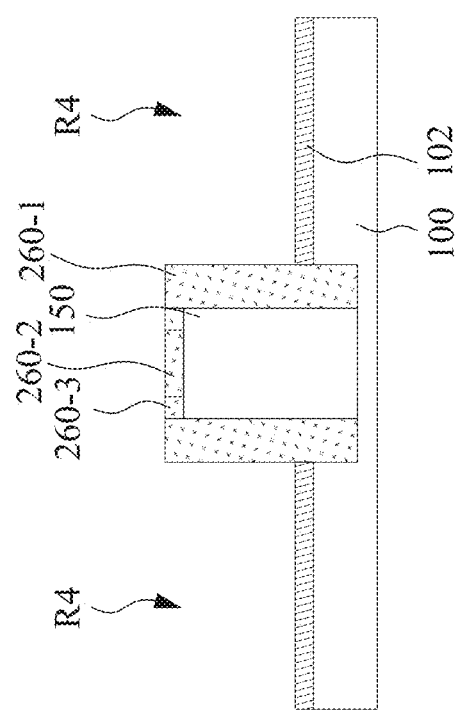

Reference is made to FIGS. 41A and 41B, in which FIG. 41B is a cross-sectional view along line B-B of FIG. 41A. An etching process is performed to remove portions of the semiconductor layers 103 and 104 exposed by the dummy gate structures 110 and the gate spacers 130 to form recesses R4.

Figure 42A:
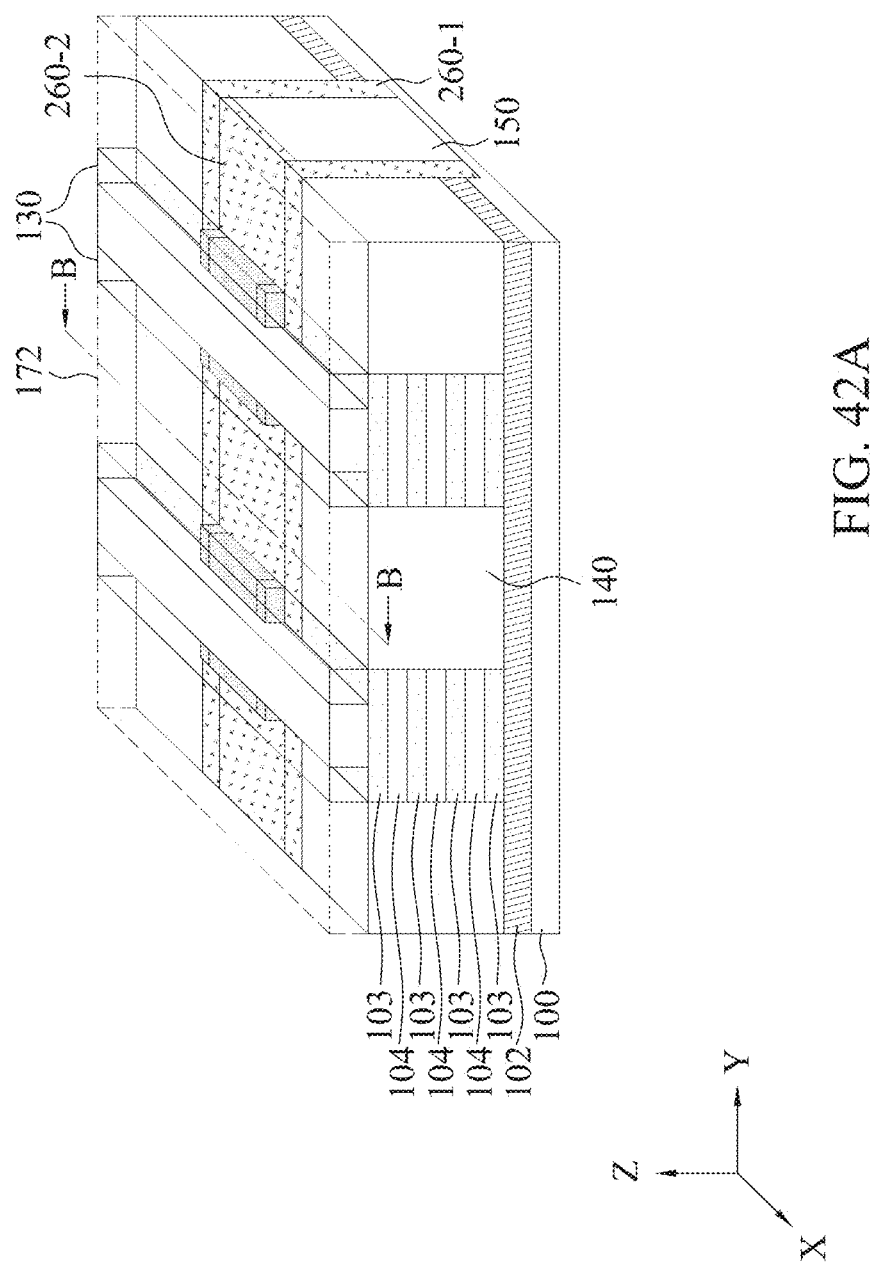
Figure 42B:
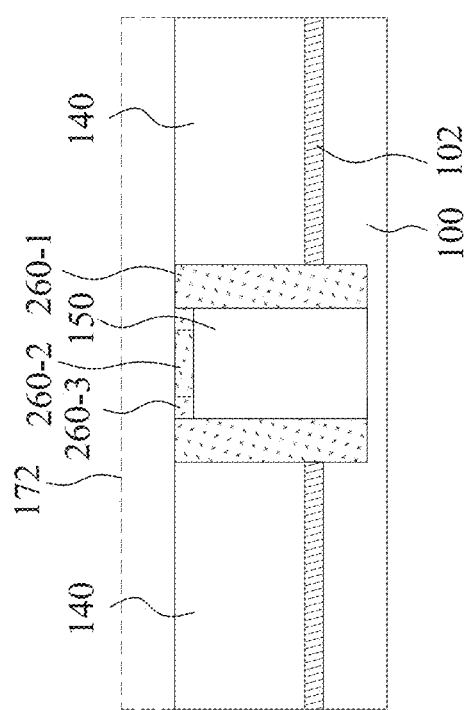

Reference is made to FIGS. 42A and 42B, in which FIG. 42B is a cross-sectional view along line B-B of FIG. 42A. Source/drain epitaxy structures 140 are formed in the recesses R4 and on opposite sides of the dummy gate structures 110. Next, an interlayer dielectric (ILD) layer 172 is formed over the source/drain epitaxy structures 140.

Figure 43A:
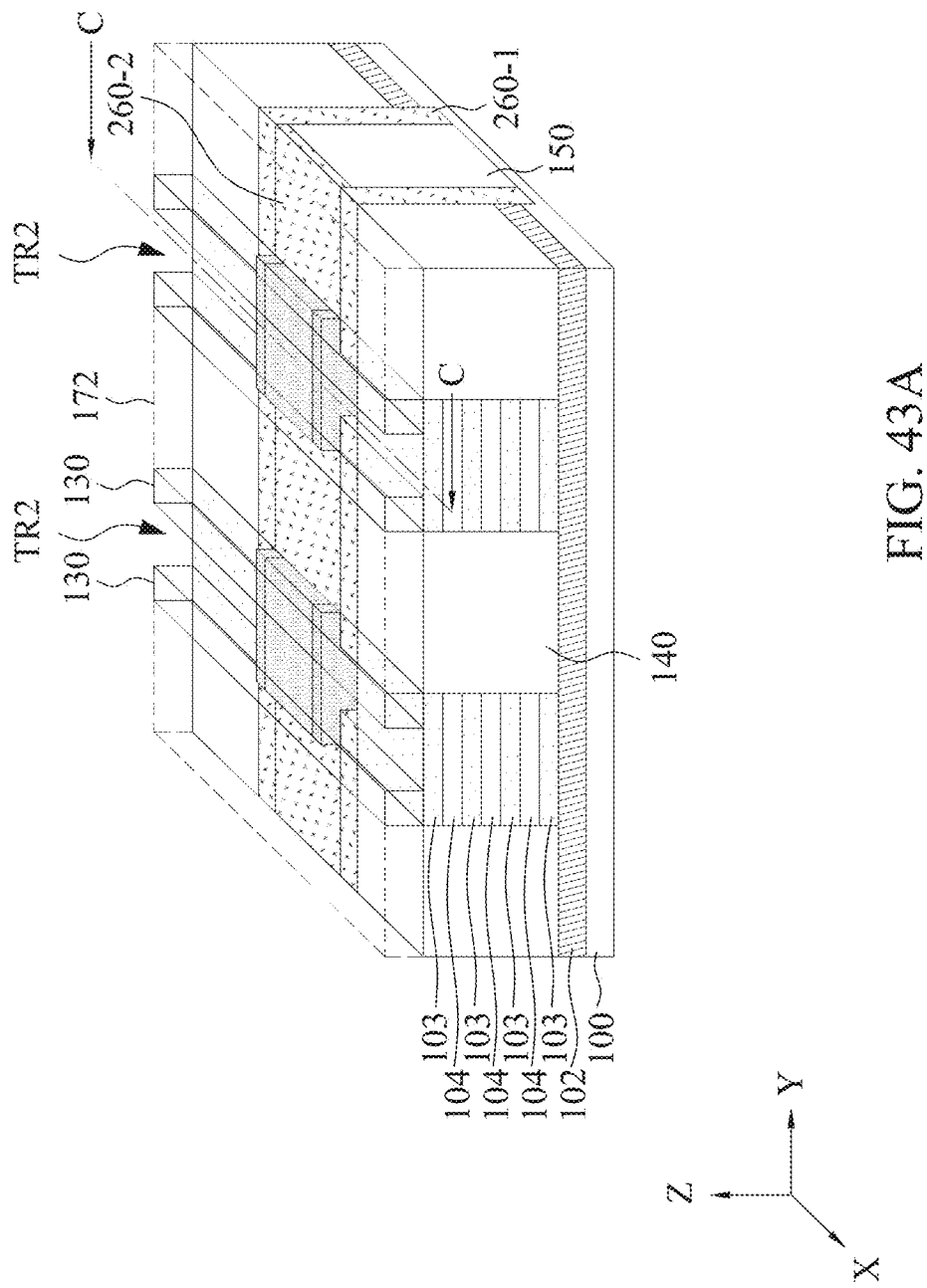
Figure 43B:
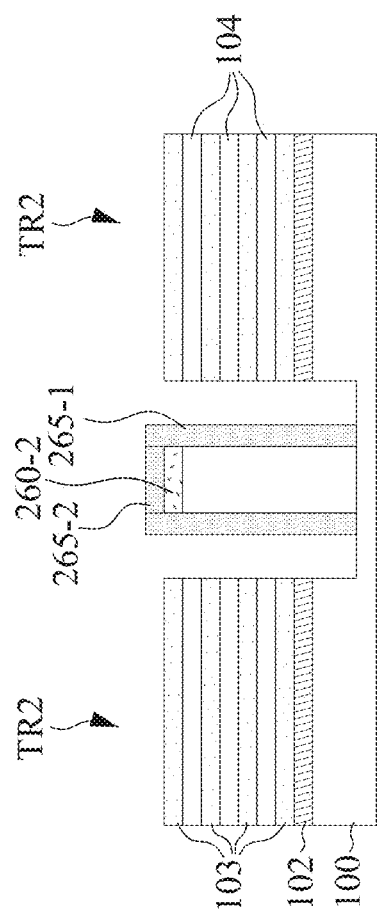

Reference is made to FIGS. 43A and 43B, in which FIG. 43B is a cross-sectional view along line C-C of FIG. 43A. The dummy gate structures 110, the dielectric spacers 260-1 are removed to from trenches TR2 between the gate spacers 130.

Figure 44A:
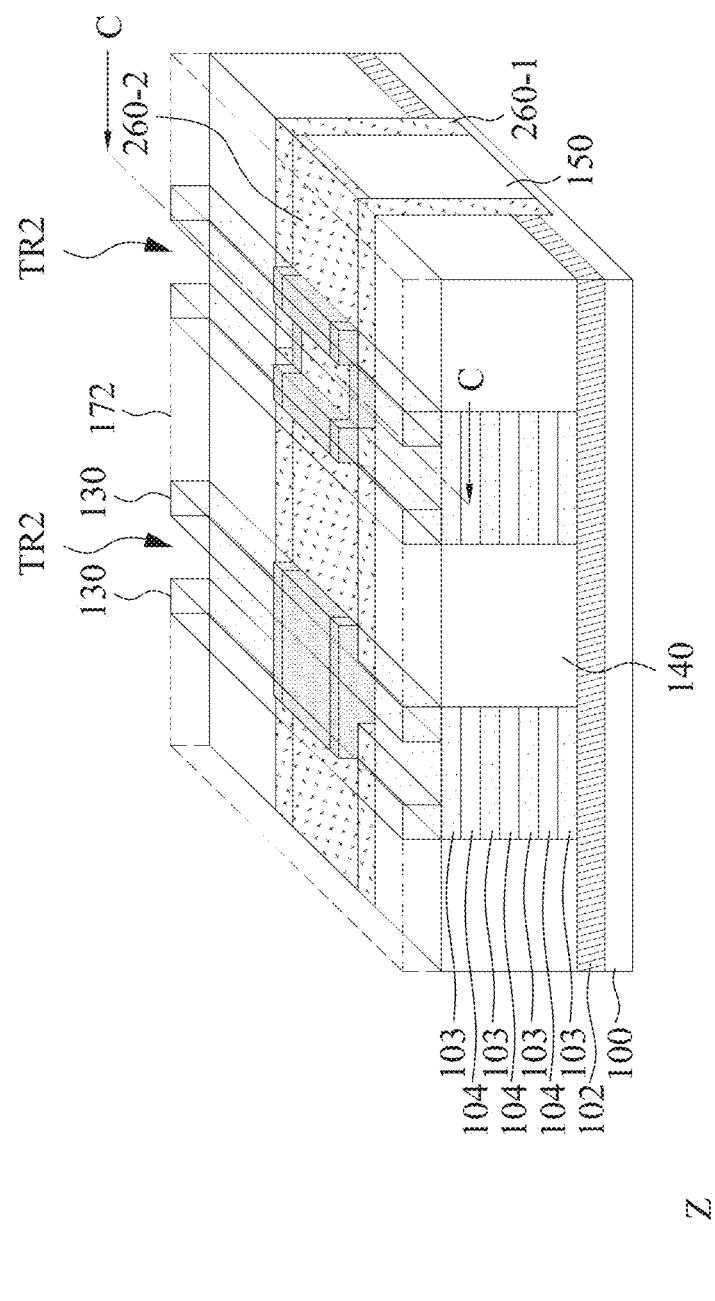
Figure 44B:
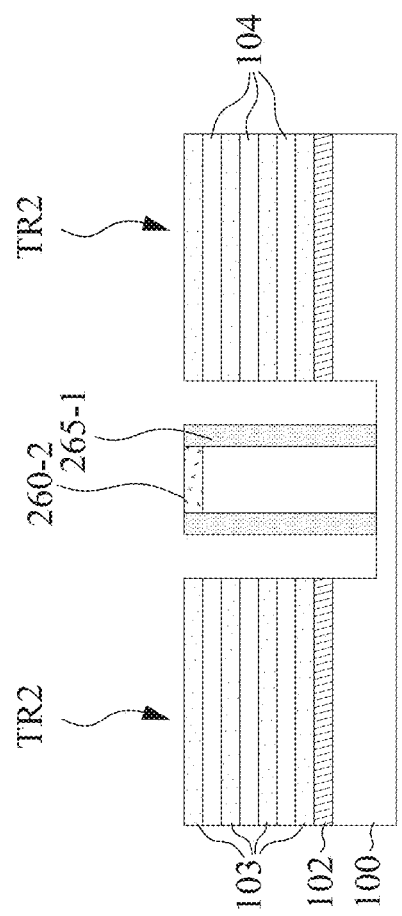

Reference is made to FIGS. 44A and 44B, in which FIG. 44B is a cross-sectional view along line C-C of FIG. 44A. A portion of the dielectric spacer 265-2 is removed to expose the dielectric cap 260-2. In some embodiments, in FIG. 44A, a portion of the dielectric cap 265-2 in the trench TR2 on right side of FIG. 44A is removed, while another portion of the dielectric cap 265-2 in the trench TR2 on left side of FIG. 44A remains. In some embodiments, the portion of the dielectric cap 265-2 may be removed by forming a patterned mask over the substrate 100 that exposed the portion of the dielectric cap 265-2 to be removed, and followed by an etching process, such as wet etch, dry etch, or combination thereof.

Figure 45A:
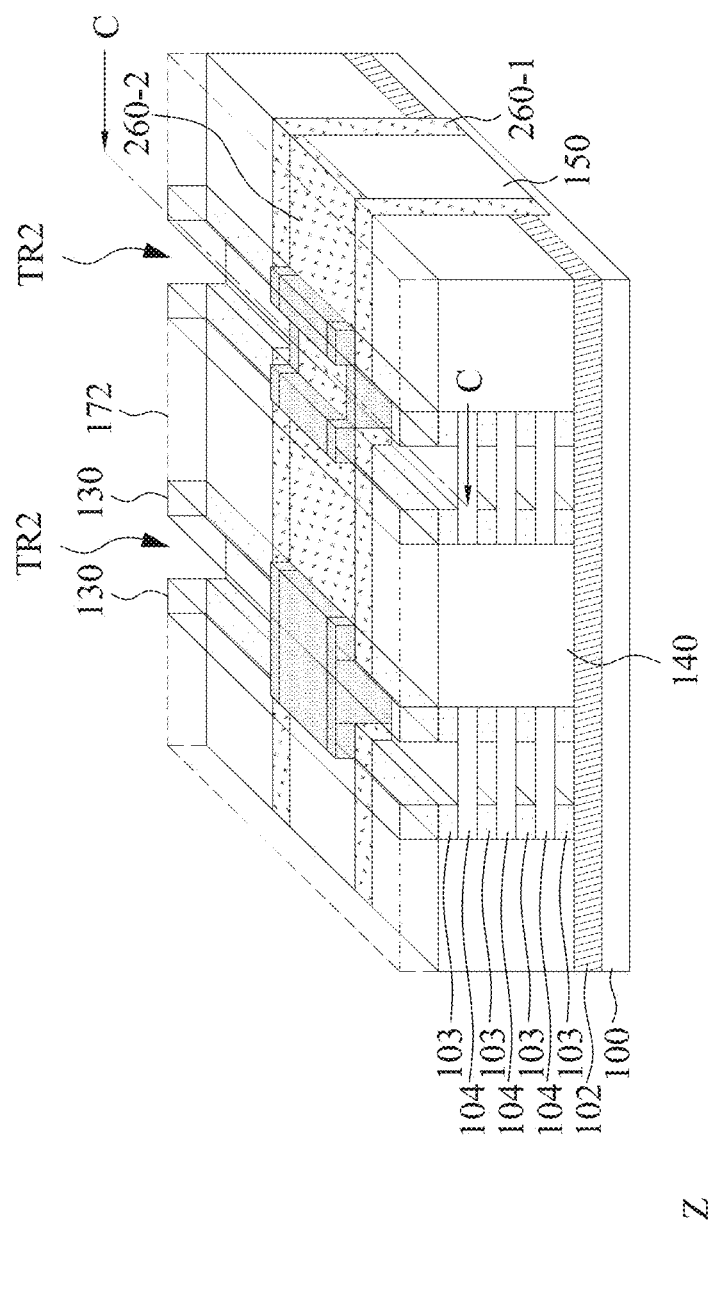
Figure 45B:
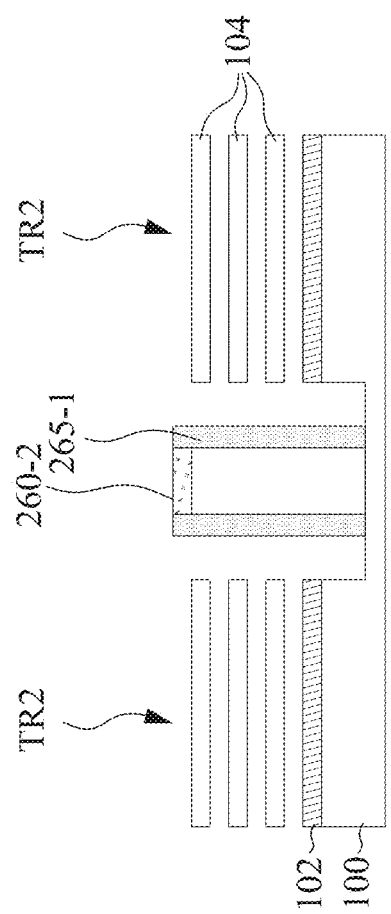

Reference is made to FIGS. 45A and 45B, in which FIG. 45B is a cross-sectional view along line C-C of FIG. 45A. The semiconductor layers 103 are removed through the trenches TR2.

Figure 46A:
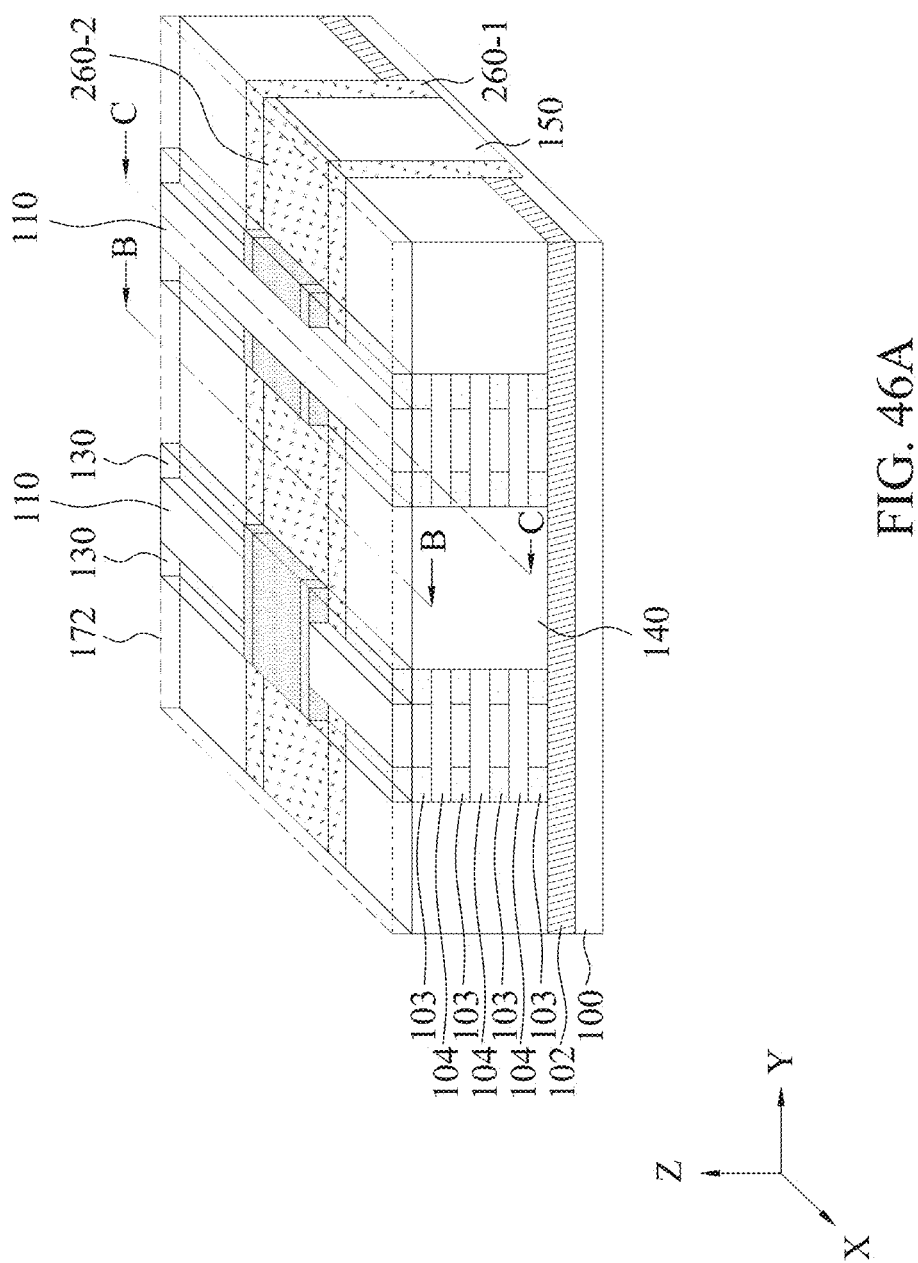
Figure 46B:
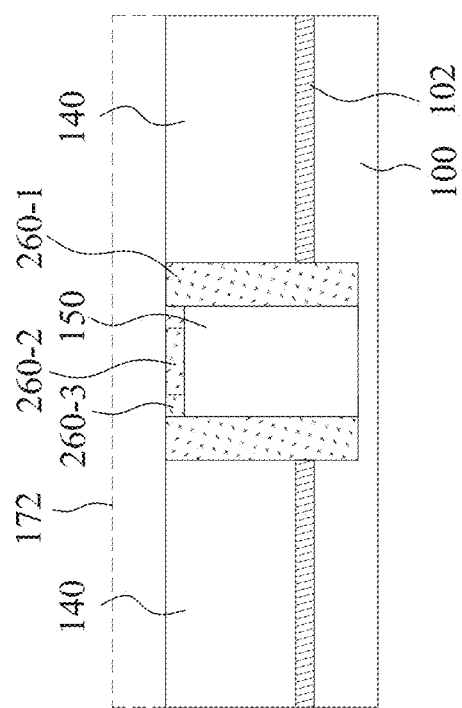
Figure 46C:
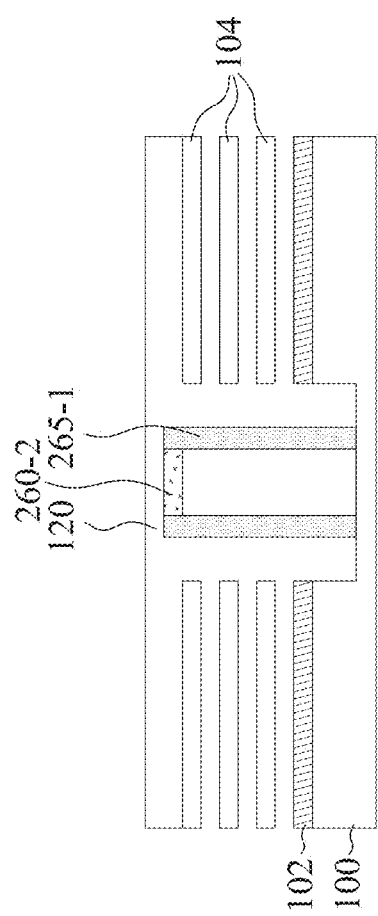

Reference is made to FIGS. 46A to 46C, in which FIG. 46B is a cross-sectional view along line B-B of FIG. 46A, and FIG. 46C is a cross-sectional view along line C-C of FIG. 46A. Gate structures 120 are formed in the trenches TR2.

Figure 47A:
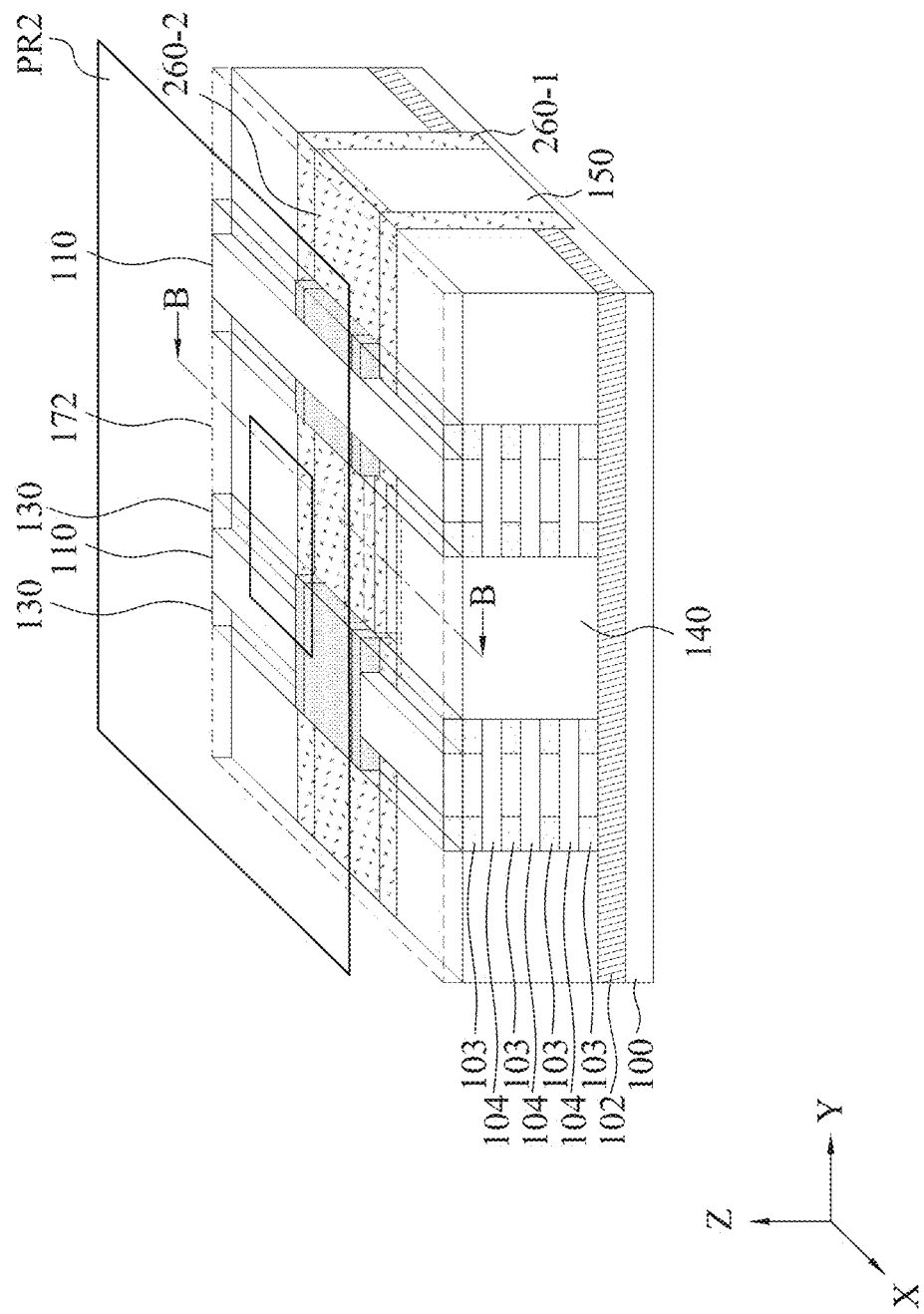
Figure 47B:
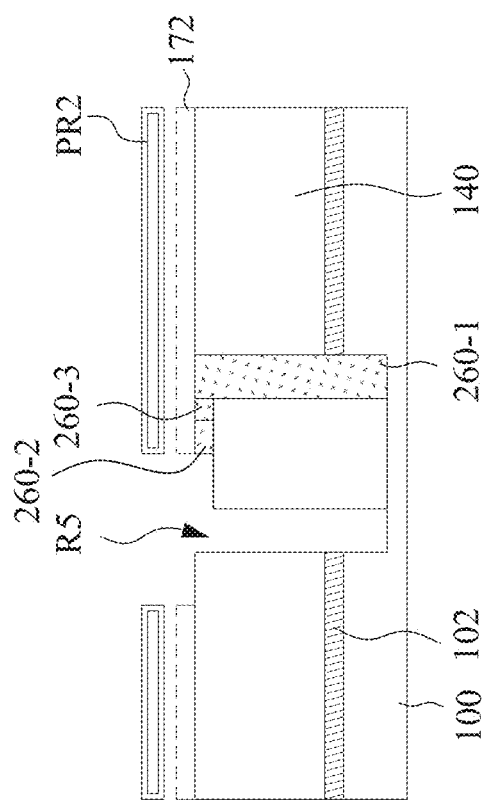

Reference is made to FIGS. 47A and 47B, in which FIG. 47B is a cross-sectional view along line B-B of FIG. 47A. A patterned photoresist resist layer PR2 is formed over the substrate 100, and a portion of the ILD layer 172 is removed through the opening of the patterned photoresist resist layer PR2. Next, portions of the dielectric spacers 260-1 and dielectric caps 2060-2 and 260-3 are removed through the opening of the patterned photoresist resist layer PR2 to form a recess R5.

Figure 48A:
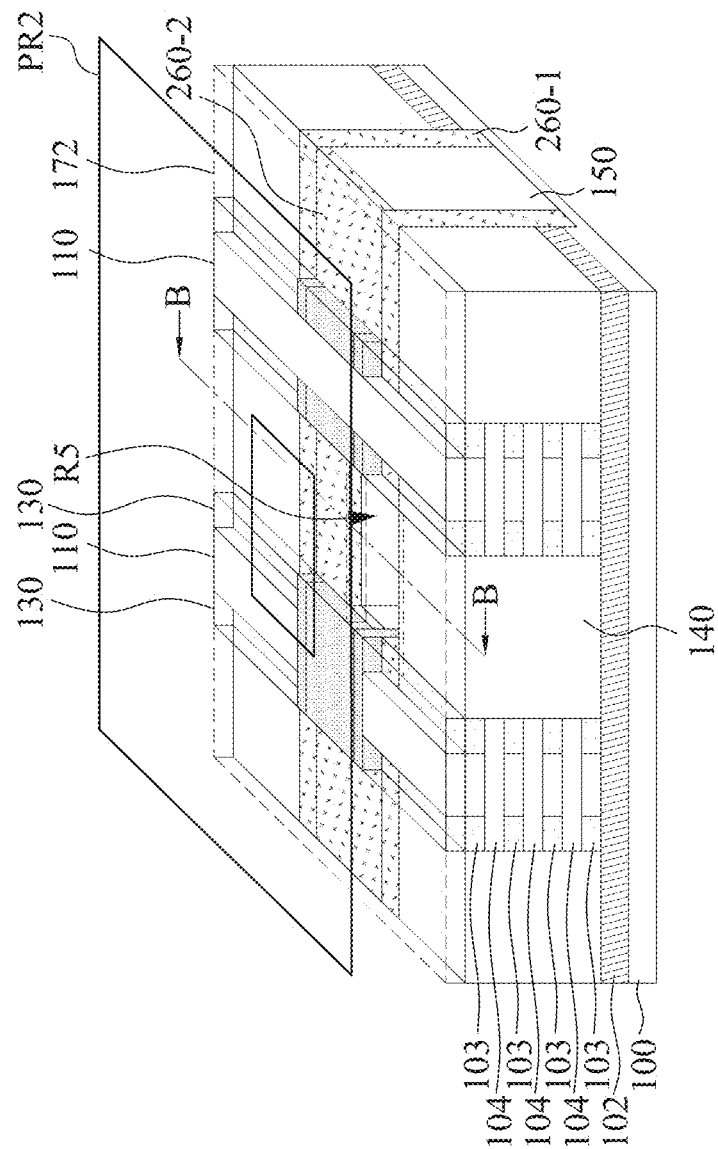
Figure 48B:
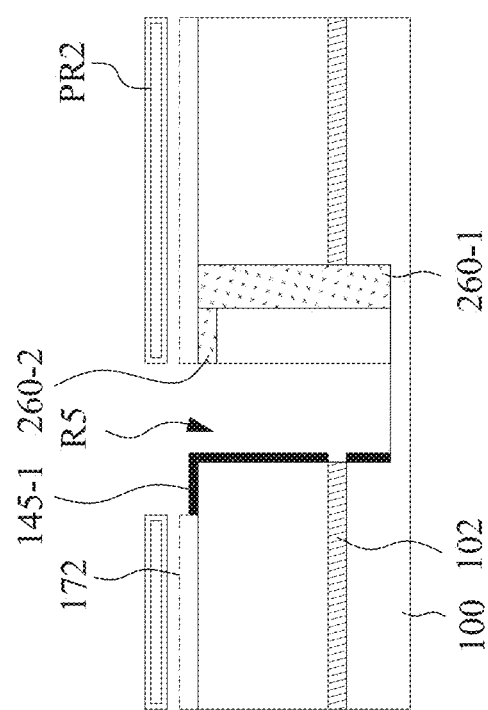

Reference is made to FIGS. 48A and 48B, in which FIG. 48B is a cross-sectional view along line B-B of FIG. 48A. A portion of the backside via 150 is removed through the opening of the patterned photoresist resist layer PR2. Next, silicide layers 145-1 are formed on the exposed surfaces of the epitaxy structure 140 and the substrate 100.

Figure 49A:
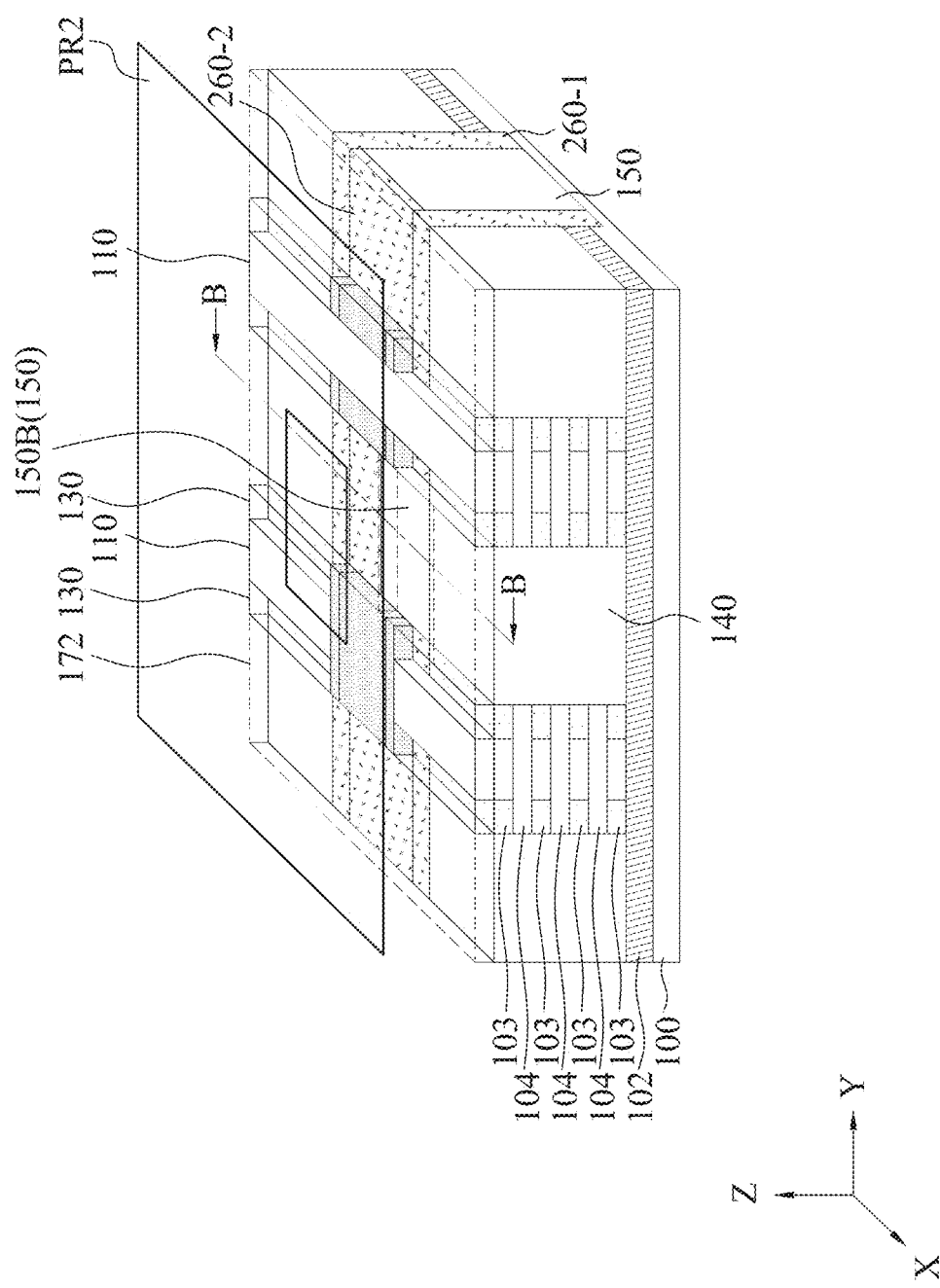
Figure 49B:
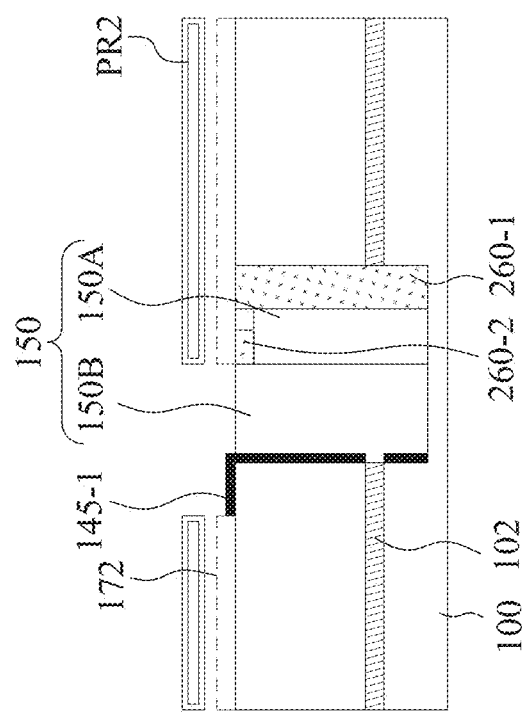

Reference is made to FIGS. 49A and 49B, in which FIG. 49B is a cross-sectional view along line B-B of FIG. 49A. A conductive material 150B is formed in the recess R5.

Figure 50A:
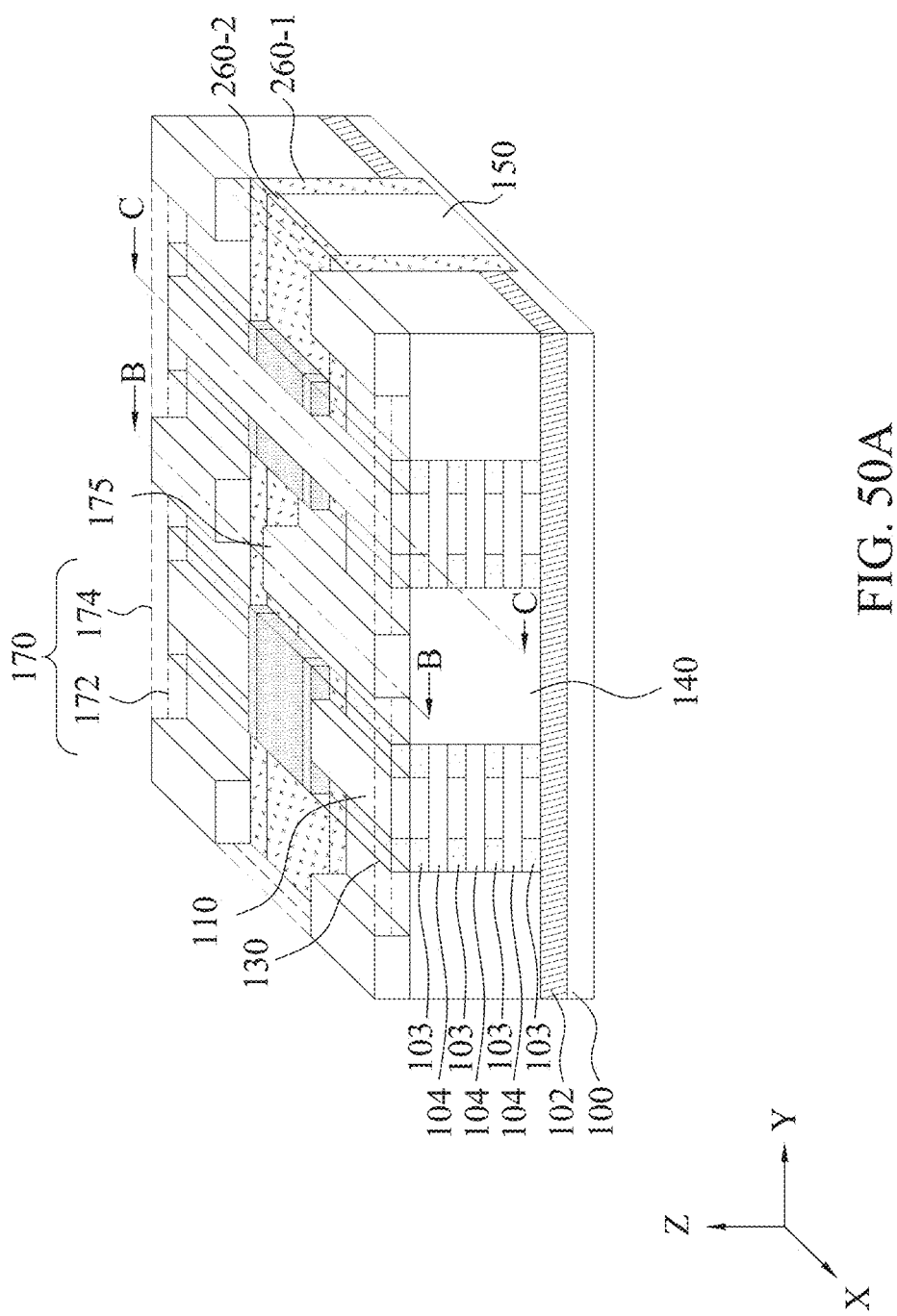
Figure 50B:
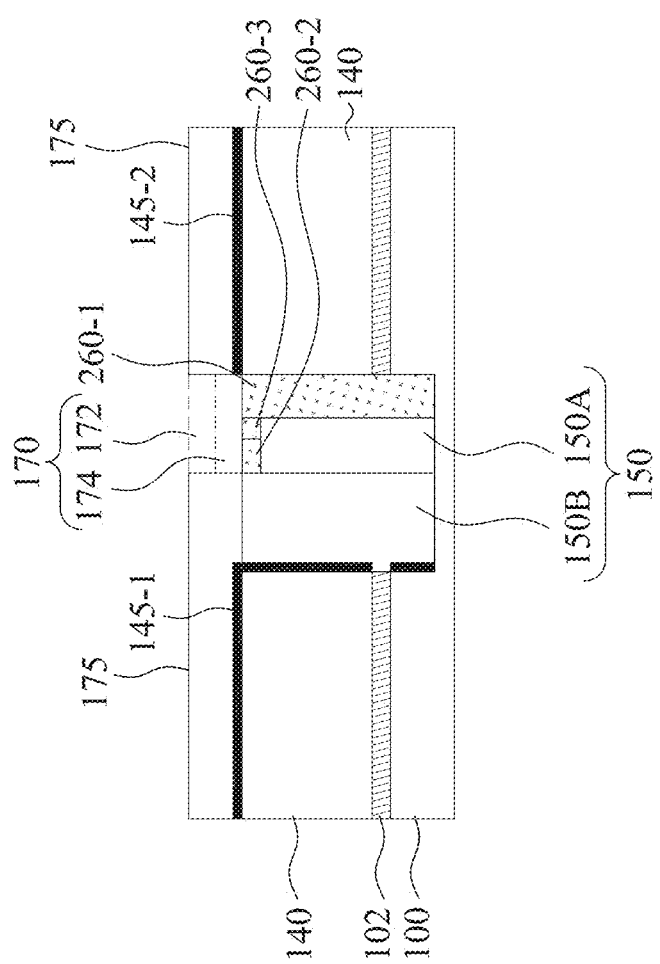
Figure 50C:
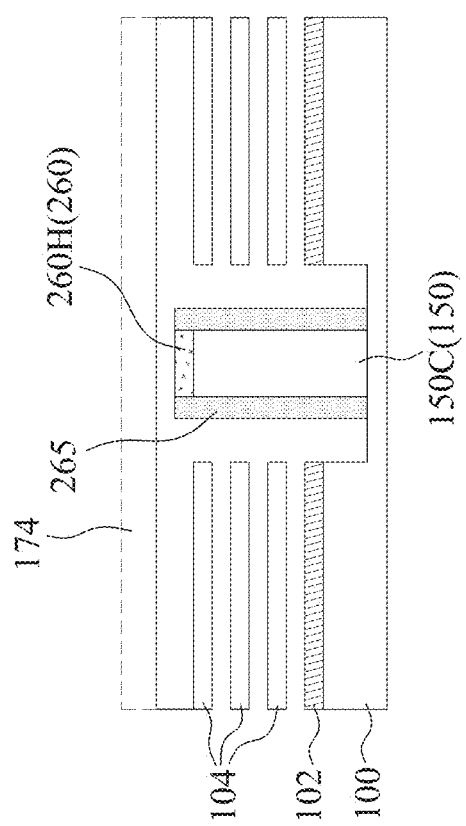

Reference is made to FIGS. 50A to 50C, in which FIG. 50B is a cross-sectional view along line B-B of FIG. 50A, and FIG. 50C is a cross-sectional view along line C-C of FIG. 50A. An interlayer dielectric layer 174 is formed over the substrate 100 and covering the ILD layer 172. Next, source/drain contacts 175 are formed extending through the ILD layers 172 and 174, and electrically connected to the source/drain epitaxy structures 140, respectively.

Figure 51A:
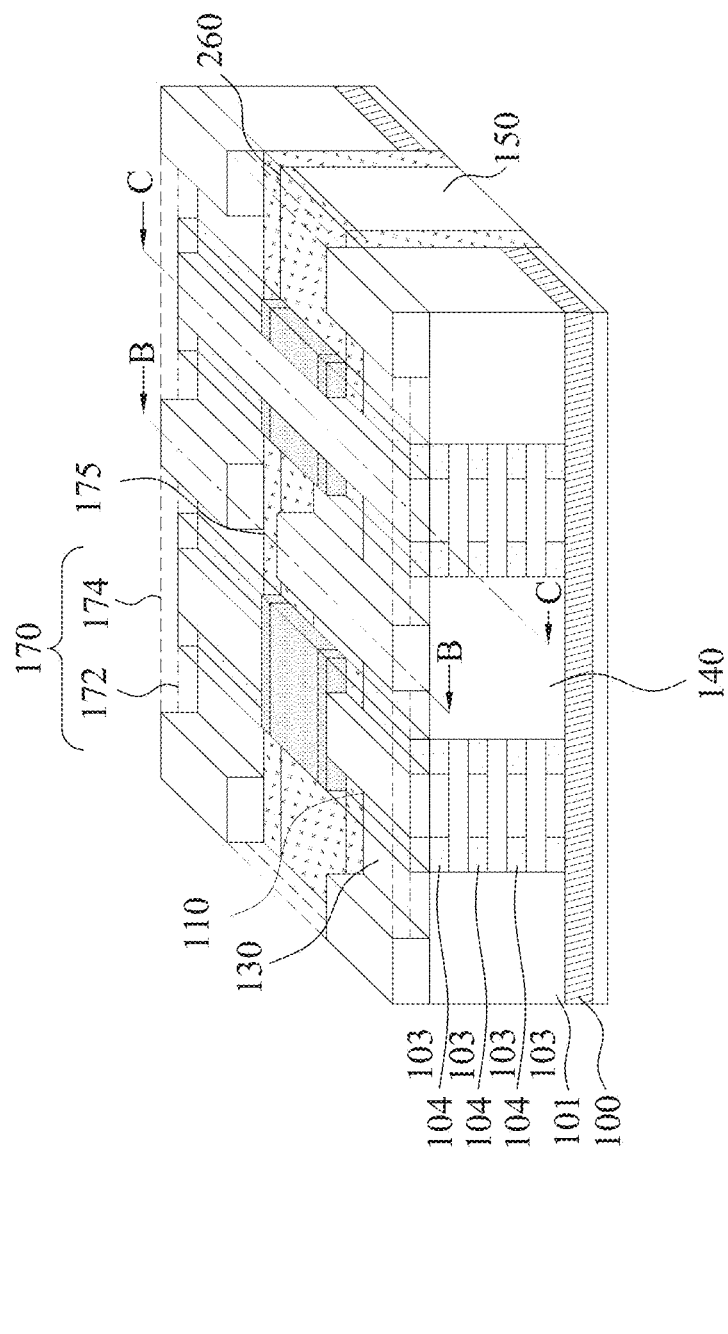
Figure 51B:
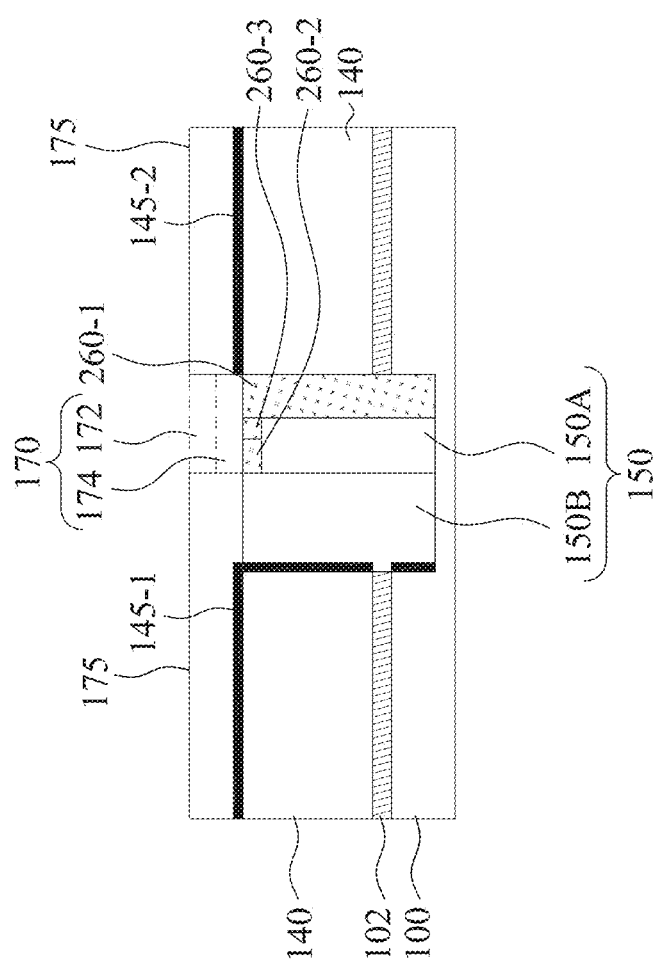
Figure 51C:
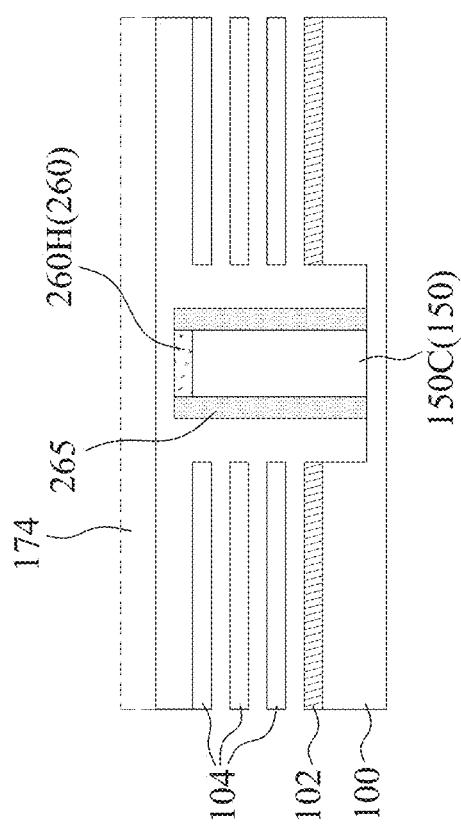

Reference is made to FIGS. 51A to 51C, in which FIG. 51B is a cross-sectional view along line B-B of FIG. 51A, and FIG. 51C is a cross-sectional view along line C-C of FIG. 51A. A CMP process is performed on the backside of the substrate 100, so as to remove portions of the substrate 100 until the backside via 150 is exposed.

Figure 52A:
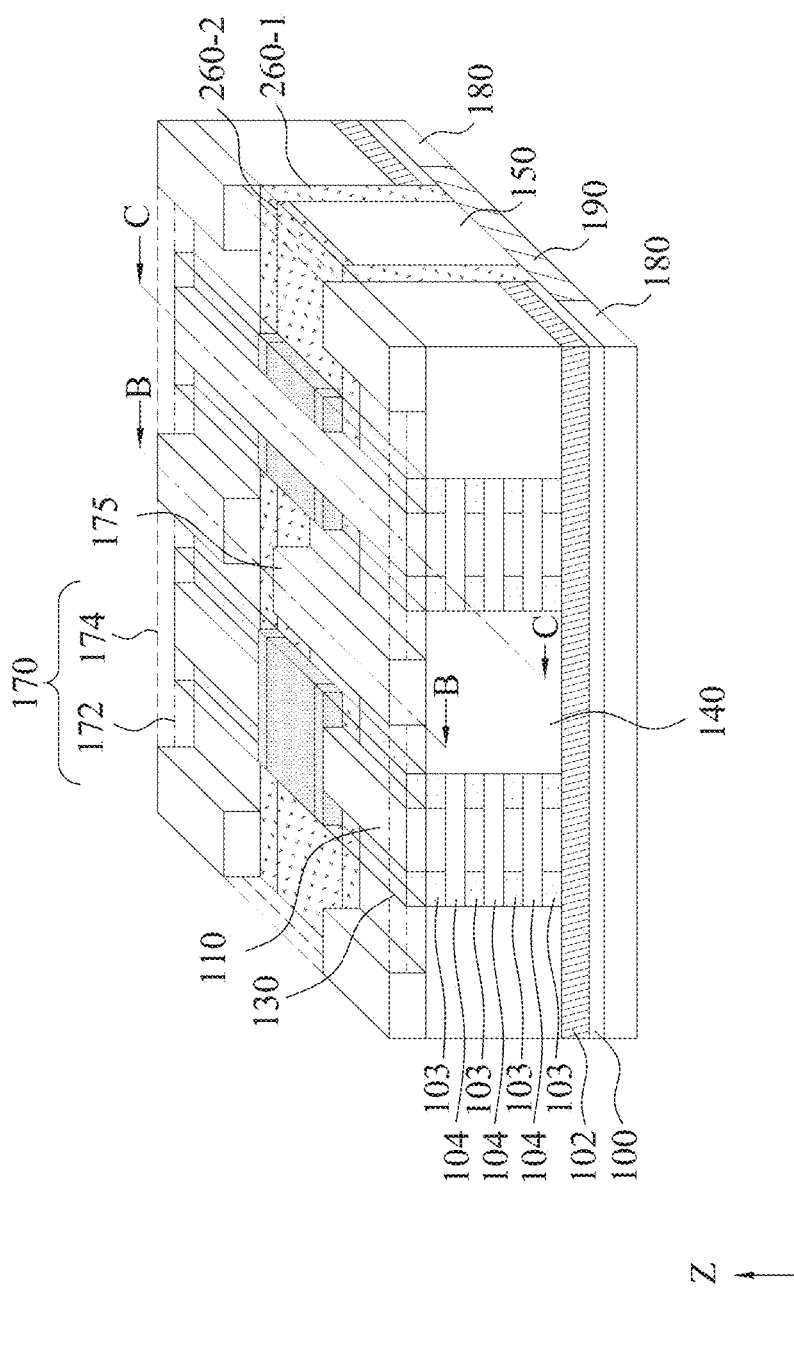
Figure 52B:
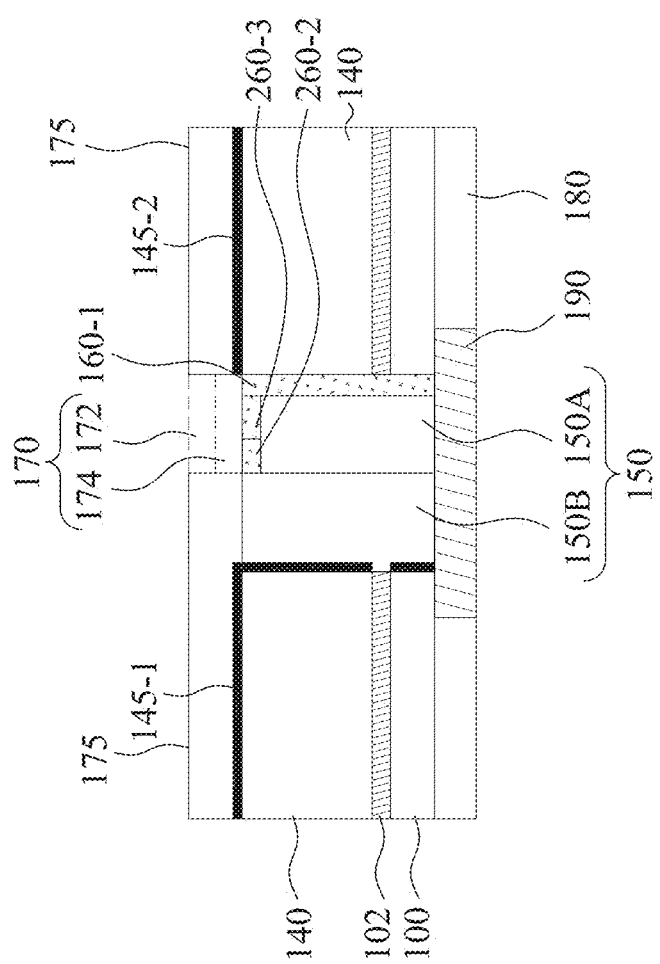
Figure 52C:
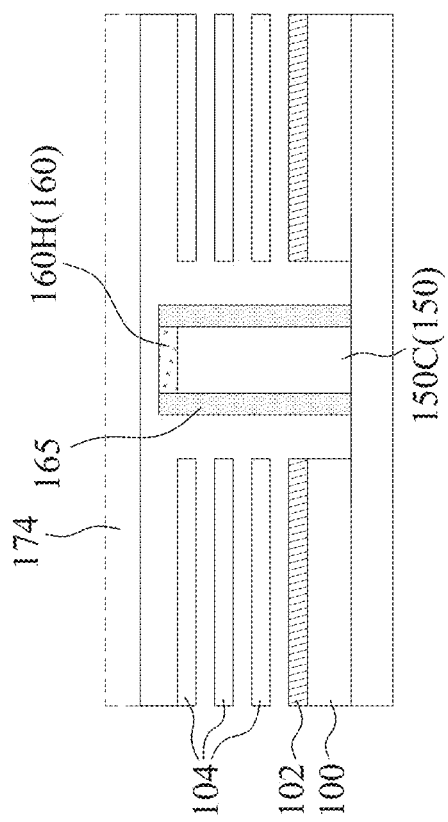

Reference is made to FIGS. 52A to 52C, in which FIG. 52B is a cross-sectional view along line B-B of FIG. 52A, and FIG. 52C is a cross-sectional view along line C-C of FIG. 52A. A backside dielectric layer 180 is formed on the backside of the substrate 100, and backside metal lines 190 are formed in the backside dielectric layer 180.

FIGS. 53 to 70 illustrate a method in various stages of fabricating an integrated circuit in accordance with some embodiments of the present disclosure. It is noted that some processes of FIGS. 53 to 69 are similar to those described in FIGS. 2 to 26C, and thus relevant details will not be repeated for brevity.

Figure 53:
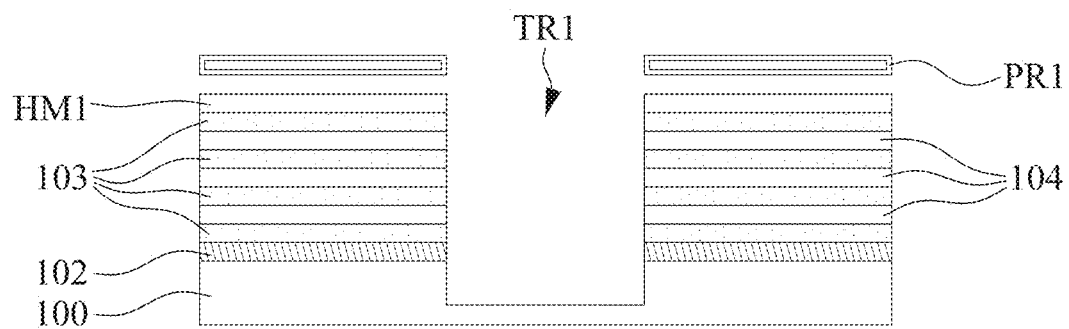
FIGS. 53 to 70 illustrate a method in various stages of fabricating an integrated circuit in accordance with some embodiments of the present disclosure.

Reference is made to FIG. 53. A dielectric layer 102 is formed over a substrate 100, and a plurality of semiconductor layers 103 and semiconductor layers 104 are alternately deposited over the substrate 100. A hard mask HM1 is formed over the substrate 100 and covering the topmost one of the semiconductor layers 103. A photoresist layer PR1 is formed over the hard mask HM1. Next, an etching process is performed, through the photoresist layer PR1, to remove portions of the hard mask HM1, the semiconductor layers 103, 104, the dielectric layer 102, and the substrate 100, so as to form a trench TR1 in the hard mask HM1, the semiconductor layers 103, 104, the dielectric layer 102, and the substrate 100.

Figure 54:
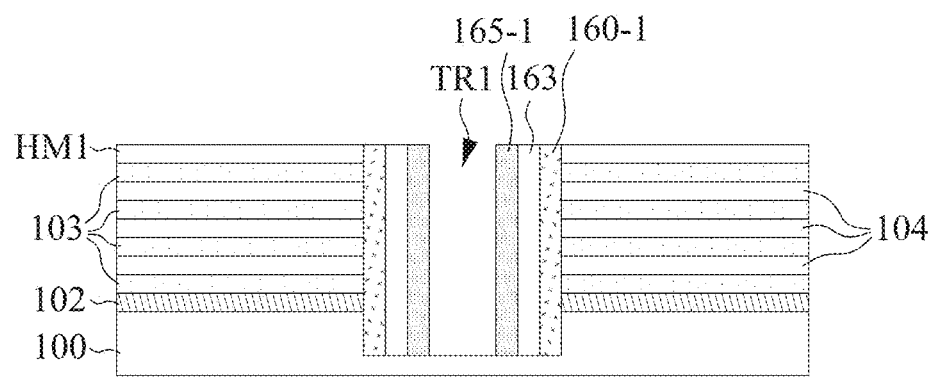

Reference is made to FIG. 54. Dielectric spacers 160-1, 163, and 165-1 are formed in the trench TR1.

Figure 55:
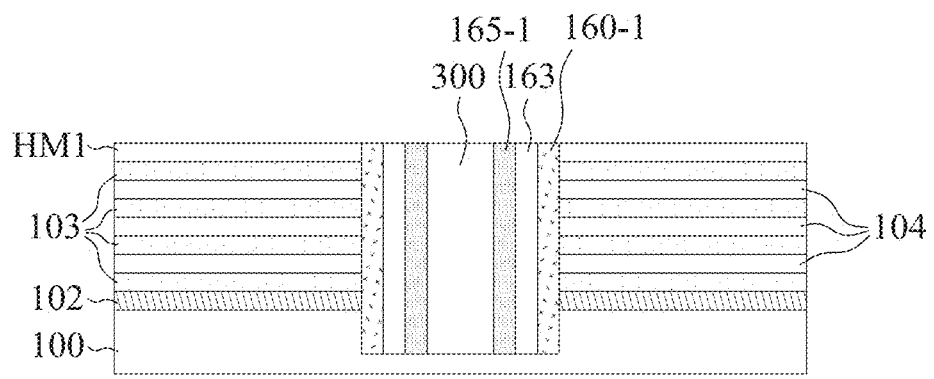

Reference is made to FIG. 55. A sacrificial dielectric layer 300 is formed in the trench TR1. In some embodiments, the sacrificial dielectric layer 300 is formed between the groupings of dielectric spacers 160-1, 165-1, 163 and fills the space between the dielectric spacers 165-1 provided on opposing sidewalls whereby the pair of dielectric spacers 165-1 line opposite sidewalls of the sacrificial dielectric layer 300, respectively. In some embodiments, the sacrificial dielectric layer 300 may be made of $SiO_2$, SiC, SiOC, SiCN, $Si_3N_4$, SiCNO, $TiO_2$, or other suitable dielectric materials. In some embodiments, the dielectric spacers 160-1, 163, 165-1, and the sacrificial dielectric layer 300 include at least two, and as many as four, different materials so as to provide etching selectivity between the various structures.

Figure 56:
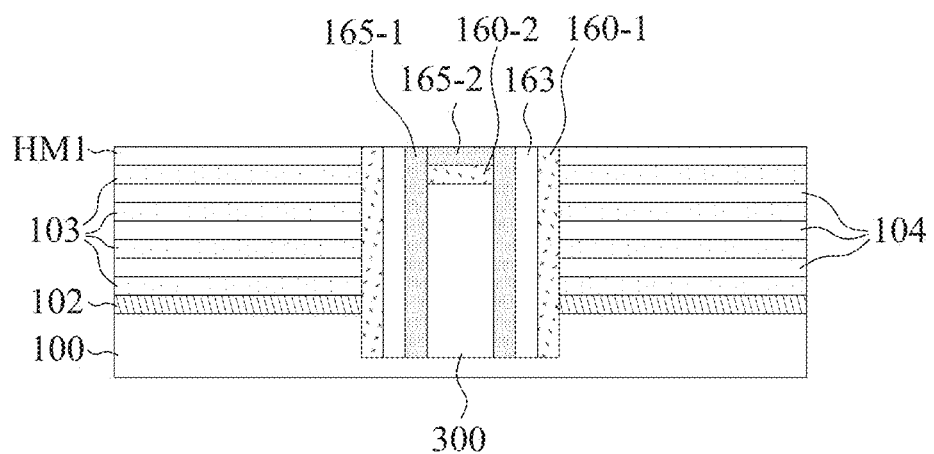

Reference is made to FIG. 56. The sacrificial dielectric layer 300 is etched back. Next, a dielectric cap 160-2 is formed over the sacrificial dielectric layer 300, and a dielectric cap 165-2 is formed over the dielectric cap 160-2.

Figure 57:
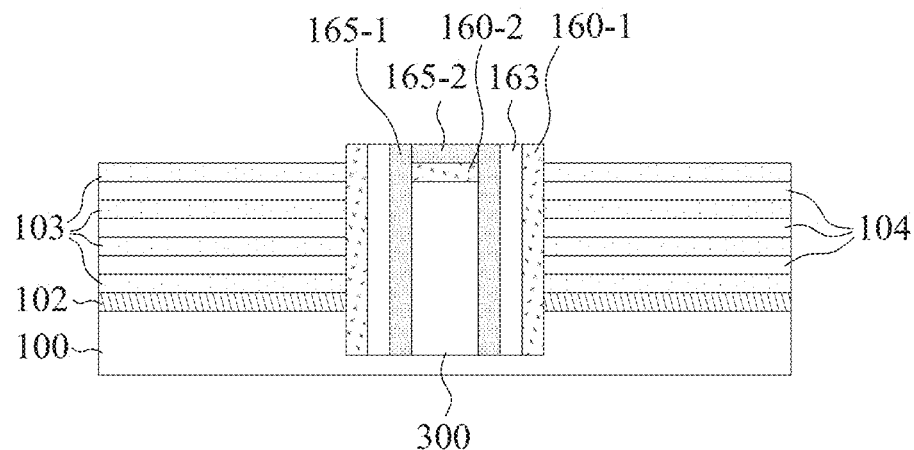

Reference is made to FIG. 57. The hard mask HM1 is removed to expose the topmost semiconductor layers 103.

Figure 58:
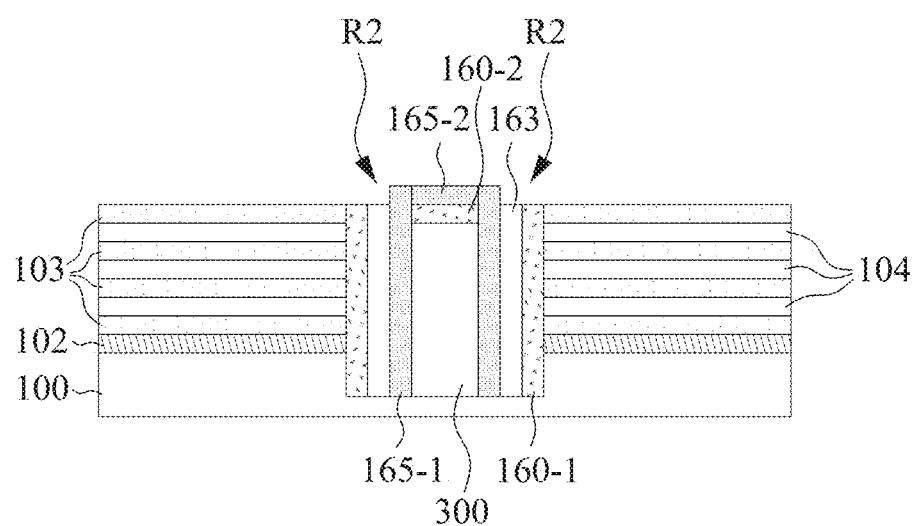

Reference is made to FIG. 58. The first and third dielectric spacers 160-1, 163 have been partially removed (etched back) to form recesses R2.

Figure 59:
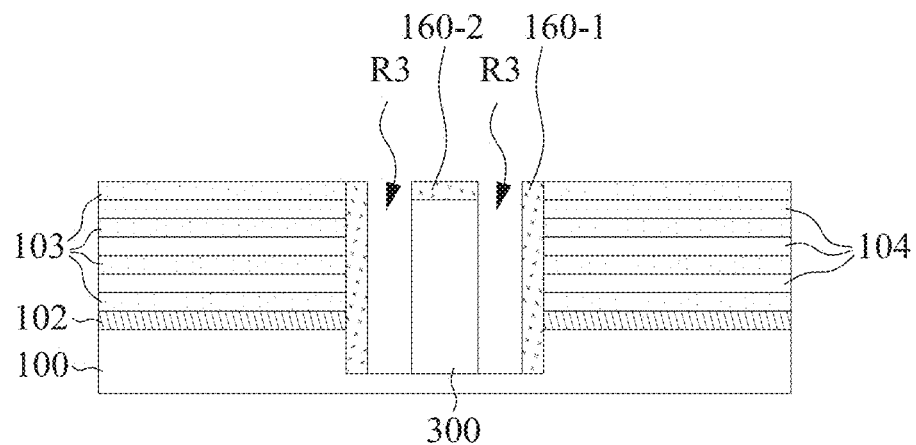

Reference is made to FIG. 59. The second and third dielectric spacers 163, 165-1 have been removed to form recesses R3.

Figure 60:
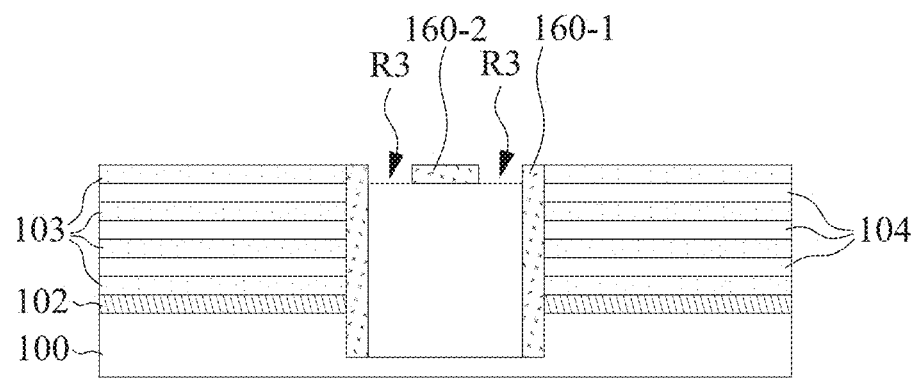

Reference is made to FIG. 60. The sacrificial dielectric layer 300 is expanded by filling a dielectric material in the recesses R3. In some embodiments, the dielectric material filled in the recesses R3 is the same as the material of the sacrificial dielectric layer 300. In some embodiments, the sacrificial dielectric layer 300 is expanded by, for example, depositing a dielectric material over the substrate 100 and filling the recesses R3, followed by an etching process to lower the top surface of the dielectric material to a level lower than the top surfaces of the dielectric spacers 160-1 and dielectric cap 160-2. In some embodiments, after the sacrificial dielectric layer 300 is expanded, top portions of the recesses R3 remain unfilled.

Figure 61:
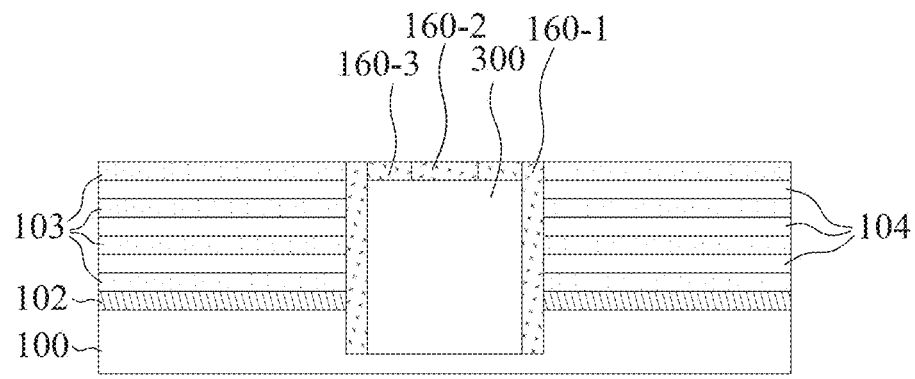

Reference is made to FIG. 61. Dielectric caps 160-3 are formed in the recesses R3.

Figure 62:
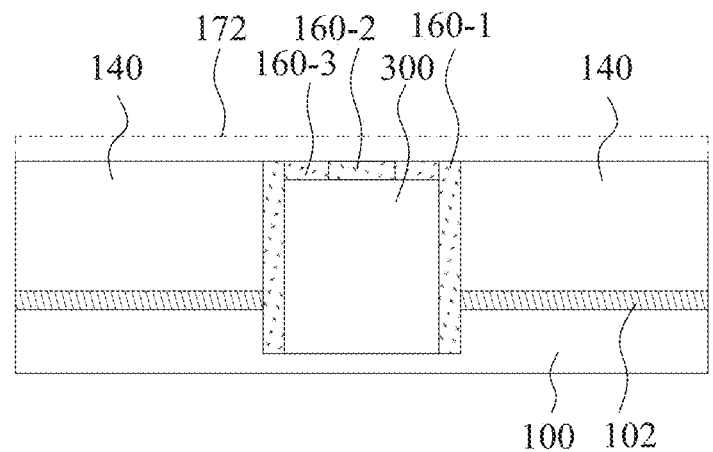

Reference is made to FIG. 62. Portions of the semiconductor layers 103 and 104 are replaced with source/drain epitaxy structures 140. Next, an interlayer dielectric (ILD) layer 172 is formed over the source/drain epitaxy structures 140. For example, an etching process is performed to remove portions of the semiconductor layers 103 and 104 to form recesses, the source/drain epitaxy structures 140 are formed in the recesses, and the ILD layer 172 is deposited over the source/drain epitaxy structures 140.

Figure 63:
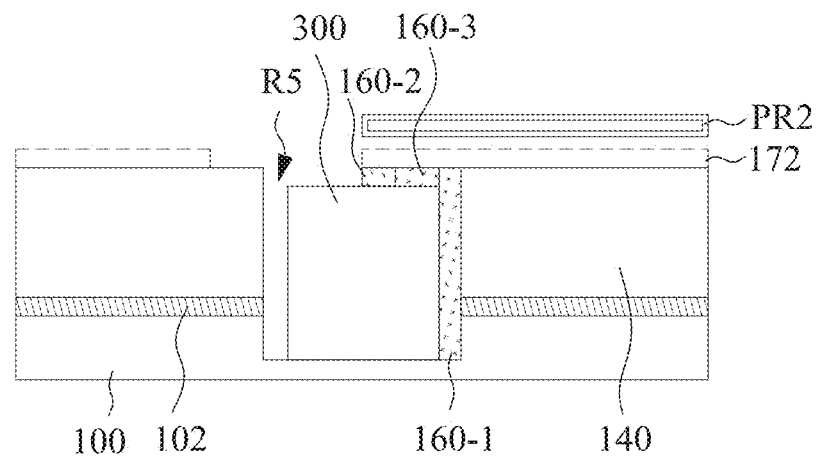

Reference is made to FIG. 63. A patterned photoresist resist layer PR2 is formed over the substrate 100, and a portion of the ILD layer 172 is removed through the opening of the patterned photoresist resist layer PR2. Next, portions of the dielectric spacers 160-1 and dielectric caps 160-3 are removed through the opening of the patterned photoresist resist layer PR2 to form a recess R5. In some embodiments, the recess R5 at least exposes the top surface and the sidewall of the sacrificial dielectric layer 300.

Figure 64:
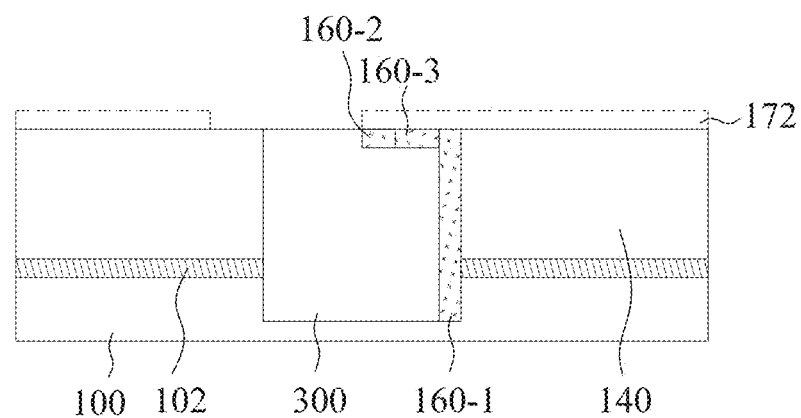

Reference is made to FIG. 64. A dielectric material is formed in the recesses R5, so as to enlarge the sacrificial dielectric layer 300. In some embodiments, the dielectric material is made of the same material as the sacrificial dielectric layer 300. In some embodiments, the dielectric material may be formed by, for example, depositing a dielectric layer over the substrate 100 and filling the recess R5, followed by an etching back process to lower a top surface of the dielectric layer to a desire position.

Figure 65:
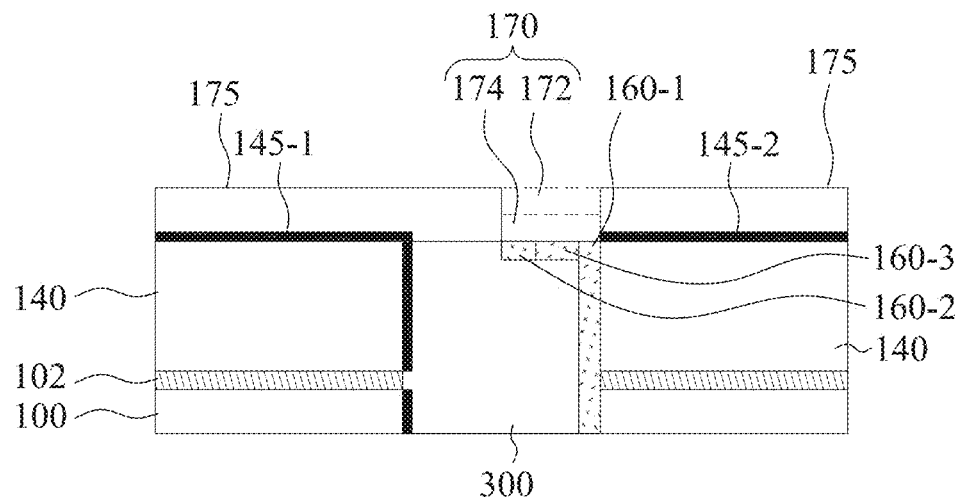

Reference is made to FIG. 65. An interlayer dielectric layer 174 is formed over the substrate 100 and covering the ILD layer 172. Next, source/drain contacts 175 are formed extending through the ILD layers 172 and 174, and are electrically connected to the source/drain epitaxy structures 140, respectively.

Figure 66:
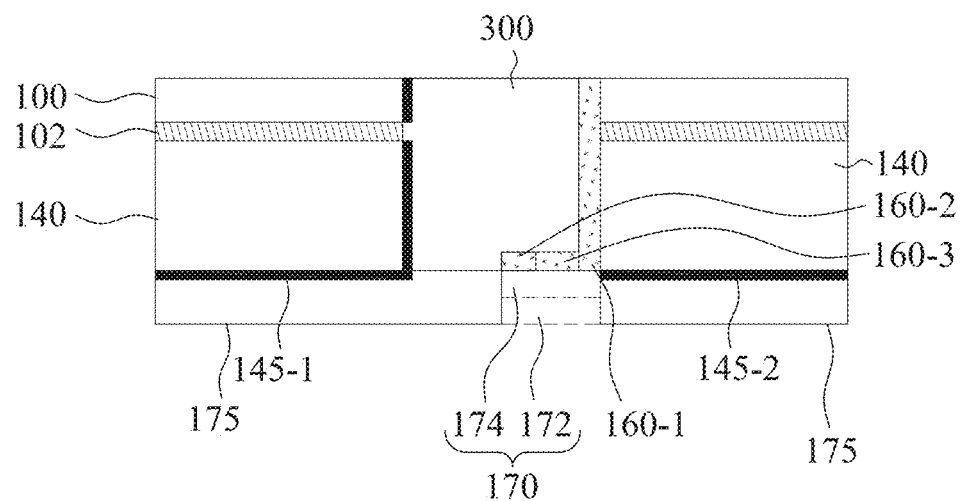

Reference is made to FIG. 66. A CMP process is performed on the backside of the substrate 100, so as to remove portions of the substrate 100 until the sacrificial dielectric layer 300 is exposed. In some embodiments, the structure shown in FIG. 65 is flipped over so that the backside of the substrate 100 is directed toward the top of the figure.

Figure 67:
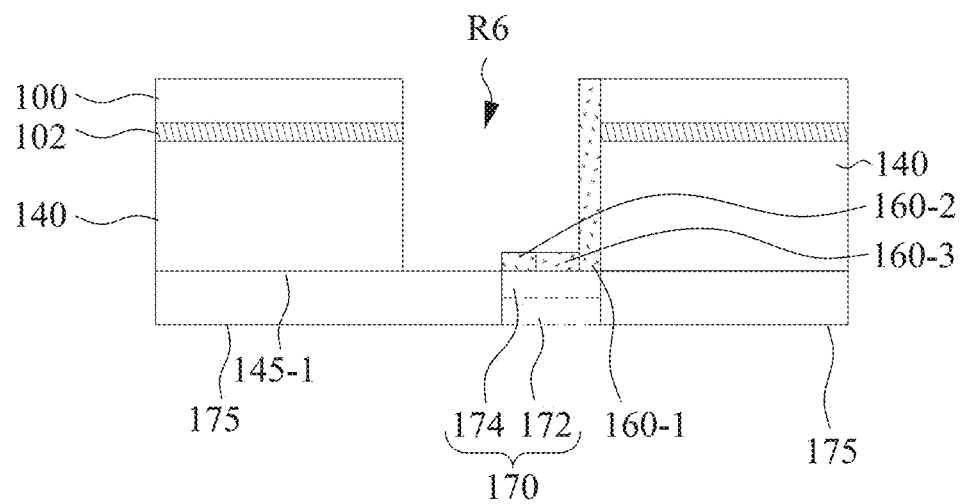

Reference is made to FIG. 67. The sacrificial dielectric layer 300 is removed to form a recess R6. In some embodiments, the recess R6 exposes a sidewall of one of the source/drain epitaxy structures 140. In some embodiments, the sacrificial dielectric layer 300 is removed by suitable etching process, such as wet etch, dry etch, or combinations thereof.

Figure 68:
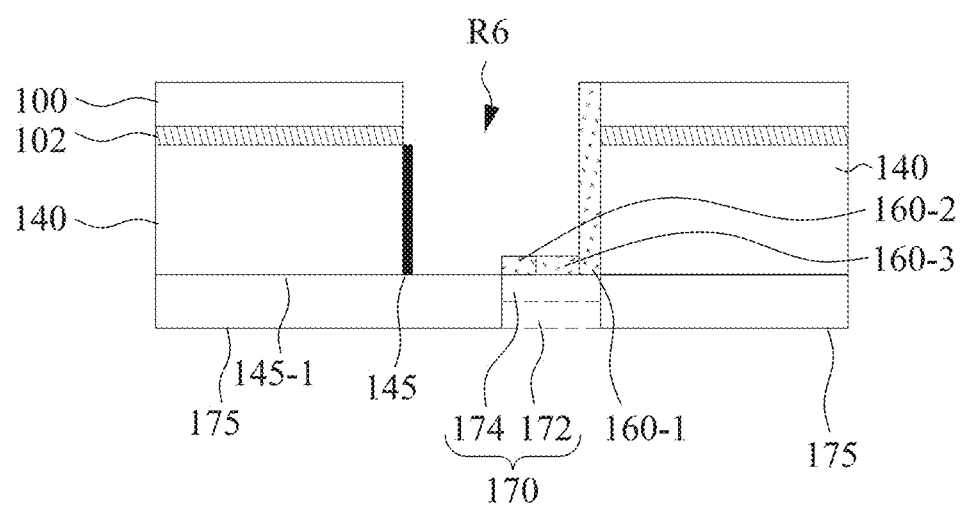

Reference is made to FIG. 68. Silicide layer 145 is formed on the exposed surface of the source/drain epitaxy structures 140.

Figure 69:
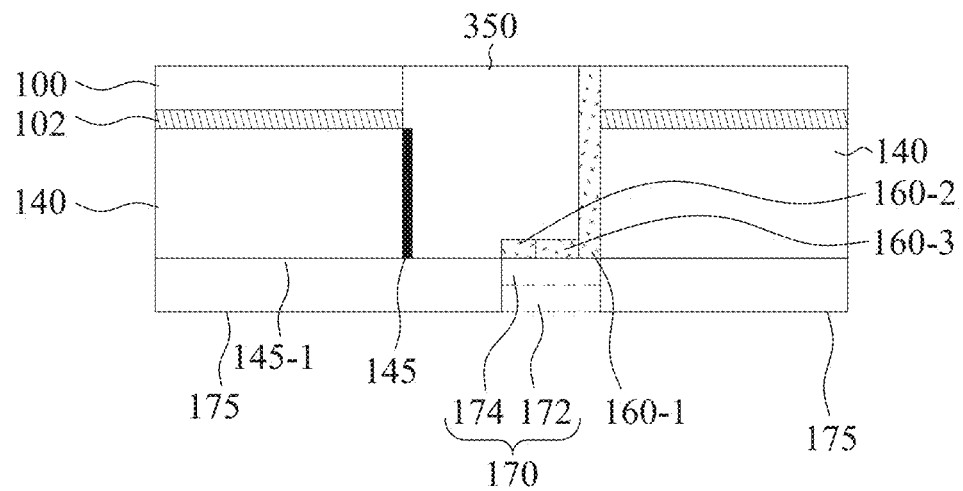

Reference is made to FIG. 69. A backside via 350 is formed in the recess R6. In some embodiments, the backside via 350 is formed by, for example, depositing a conductive material in the recess R6, and performing a CMP process to remove excess conductive material until the substrate 100 is exposed.

Figure 70:
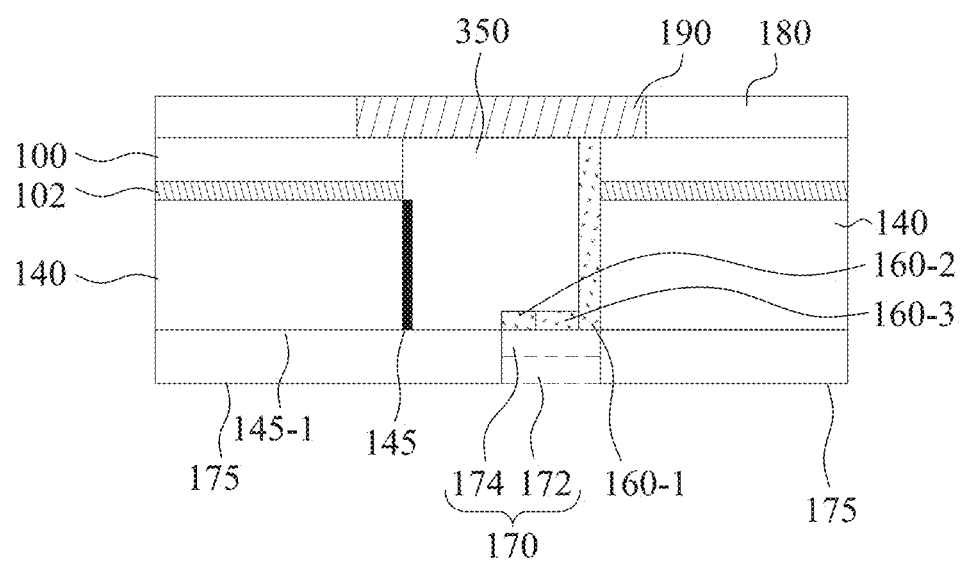

Reference is made to FIG. 70. A backside dielectric layer 180 is formed on the backside of the substrate 100, and backside metal lines 190 are formed in the backside dielectric layer 180.

Figure 71:
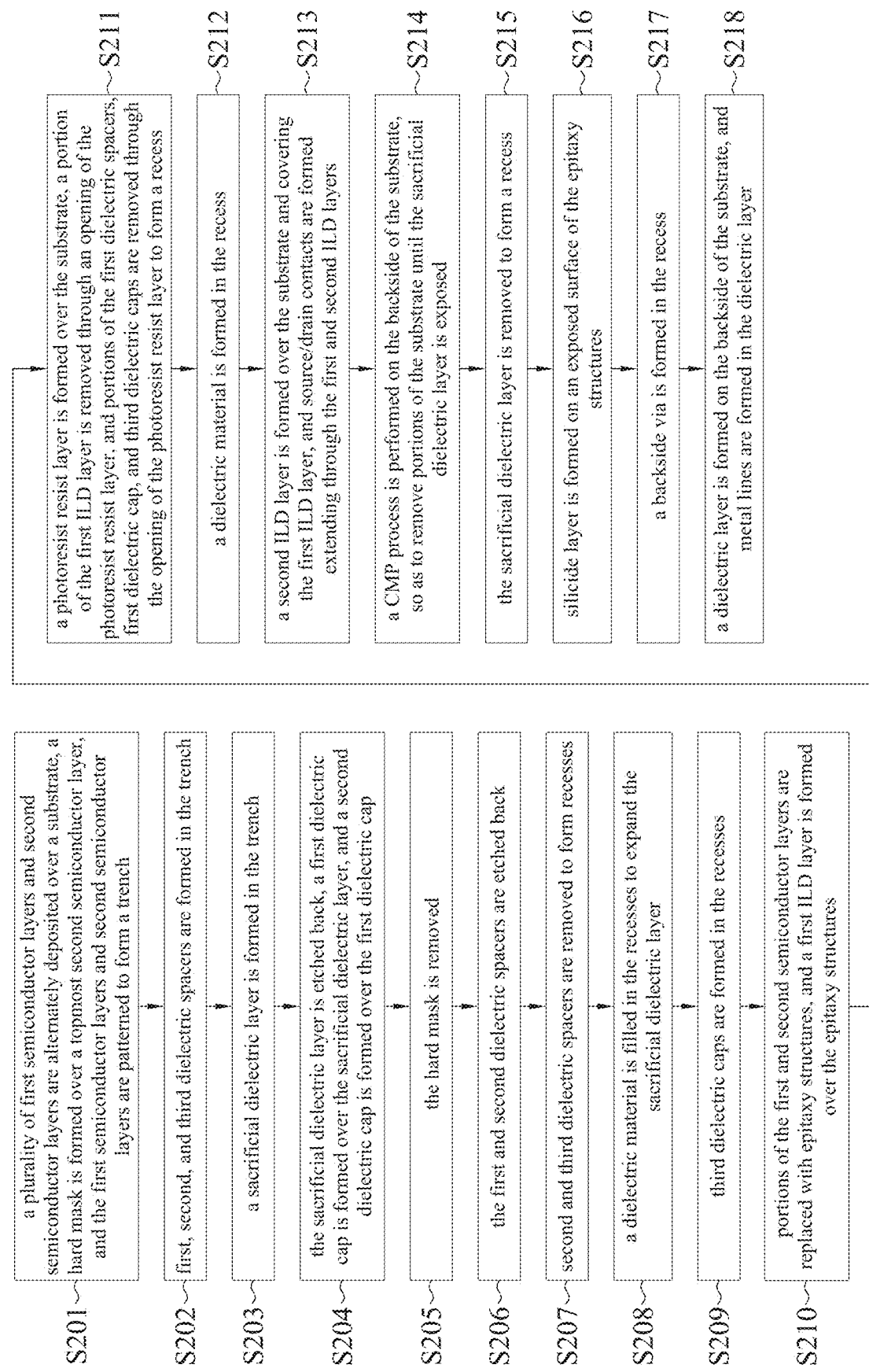
FIG. 71 illustrates a method of manufacturing an integrated circuit in accordance with some embodiments of the present disclosure.

FIG. 71 illustrates a method M2 of manufacturing an integrated circuit in accordance with some embodiments of the present disclosure. Although the method M2 is illustrated and/or described as a series of acts or events, it will be appreciated that the method is not limited to the illustrated ordering or acts. Thus, in some embodiments, the acts are carried out in different orders than illustrated, and/or are carried out concurrently. Further, in some embodiments, the illustrated acts or events are subdivided into multiple acts or events, which are carried out at separate times or concurrently with other acts or sub-acts. In some embodiments, some illustrated acts or events are omitted, and other unillustrated acts or events are included.

At block S201, a plurality of first semiconductor layers and second semiconductor layers are alternately deposited over a substrate, a hard mask is formed over a topmost second semiconductor layer, and the first semiconductor layers and second semiconductor layers are patterned to form a trench. FIG. 53 illustrates a schematic view of some embodiments corresponding to act in block S201.

At block S202, first, second, and third dielectric spacers are formed in the trench. FIG. 54 illustrates a schematic view of some embodiments corresponding to act in block S202.

At block S203, a sacrificial dielectric layer is formed in the trench. FIG. 55 illustrates a schematic view of some embodiments corresponding to act in block S203.

At block S204, the sacrificial dielectric layer is etched back, a first dielectric cap is formed over the sacrificial dielectric layer, and a second dielectric cap is formed over the first dielectric cap. FIG. 56 illustrates a schematic view of some embodiments corresponding to act in block S204.

At block S205, the hard mask is removed. FIG. 57 illustrates a schematic view of some embodiments corresponding to act in block S205.

At block S206, the first and second dielectric spacers are etched back. FIG. 58 illustrates a schematic view of some embodiments corresponding to act in block S206.

At block S207, second and third dielectric spacers are removed to form recesses. FIG. 59 illustrates a schematic view of some embodiments corresponding to act in block S207.

At block S208, a dielectric material is filled in the recesses to expand the sacrificial dielectric layer. FIG. 60 illustrates a schematic view of some embodiments corresponding to act in block S208.

At block S209, third dielectric caps are formed in the recesses. FIG. 61 illustrates a schematic view of some embodiments corresponding to act in block S209.

At block S210, portions of the first and second semiconductor layers are replaced with epitaxy structures, and a first ILD layer is formed over the epitaxy structures. FIG. 62 illustrates a schematic view of some embodiments corresponding to act in block S210.

At block S211, a photoresist resist layer is formed over the substrate, a portion of the first ILD layer is removed through an opening of the photoresist resist layer, and portions of the first dielectric spacers, first dielectric cap, and third dielectric caps are removed through the opening of the photoresist resist layer to form a recess. FIG. 63 illustrates a schematic view of some embodiments corresponding to act in block S211.

At block S212, a dielectric material is formed in the recess. FIG. 64 illustrates a schematic view of some embodiments corresponding to act in block S212.

At block S213, a second ILD layer is formed over the substrate and covering the first ILD layer, and source/drain contacts are formed extending through the first and second ILD layers. FIG. 65 illustrates a schematic view of some embodiments corresponding to act in block S213.

At block S214, a CMP process is performed on the backside of the substrate, so as to remove portions of the substrate until the sacrificial dielectric layer is exposed. FIG. 66 illustrates a schematic view of some embodiments corresponding to act in block S214.

At block S215, the sacrificial dielectric layer is removed to form a recess. FIG. 67 illustrates a schematic view of some embodiments corresponding to act in block S215.

At block S216, silicide layer is formed on an exposed surface of the epitaxy structures. FIG. 68 illustrates a schematic view of some embodiments corresponding to act in block S216.

At block S217, a backside via is formed in the recess. FIG. 69 illustrates a schematic view of some embodiments corresponding to act in block S217.

At block S218, a dielectric layer is formed on the backside of the substrate, and metal lines are formed in the dielectric layer. FIG. 70 illustrates a schematic view of some embodiments corresponding to act in block S218.

FIGS. 72 to 76 are cross-sectional view of integrated circuits in accordance with some embodiments of the present disclosure. It is noted that similar elements of FIGS. 72 to 76 are labeled the same, and relevant details will not be repeated for brevity.

Figure 72:
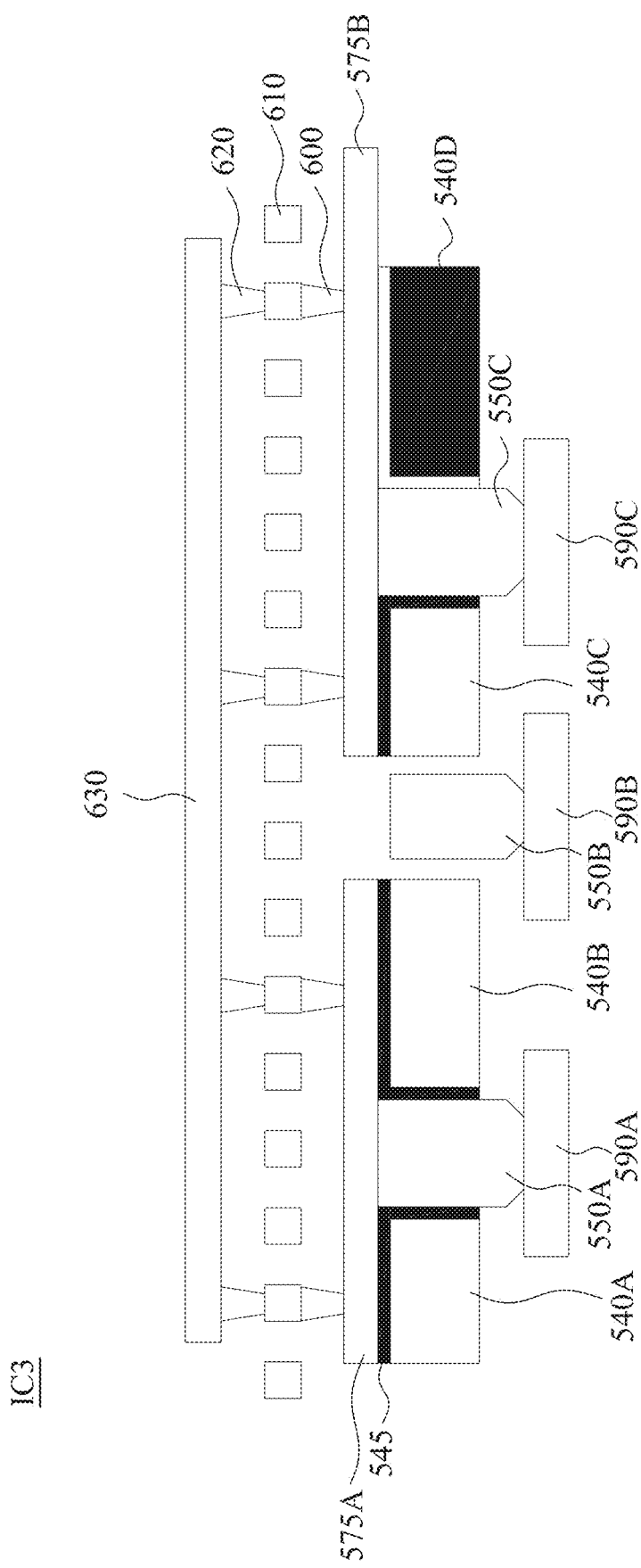
FIGS. 72 to 76 are cross-sectional view of integrated circuits in accordance with some embodiments of the present disclosure.

In FIG. 72, an integrated circuit IC3 is shown. The integrated circuit IC3 includes epitaxy structures 540A, 540B, 540C, 540D, in which the epitaxy structures 540A to 540D are similar to the source/drain epitaxy structures 140 described in FIGS. 1A to 71. The integrated circuit IC3 includes backside vias 550A, 550B, 550C, in which the backside vias 550A, 550B, 550C are similar to the backside vias 150, 350 as described in reference to FIGS. 1A to 71. The integrated circuit IC3 includes source/drain contacts 575A, 575B, in which the source/drain contacts 575A, 575B are similar to the source/drain contacts 175 described in FIGS. 1A to 71. Vias 600 are disposed over and electrically connected to the source/drain contacts 575A, 575B, metal lines 610 are disposed over and electrically connected to the vias 600, vias 620 are disposed over and electrically connected to the metal lines 610, and metal line 630 is disposed over and electrically connected to the vias 620. The integrated circuit IC3 includes metal lines 590A, 590B, 590C in contact with the backside vias 550A, 550B, 550C, respectively, in which metal lines 590A, 590B, 590C are similar to the backside metal lines 190 described in FIGS. 1A to 71. In some embodiments, the metal lines 590A, 590B, 590C may act as power rails. For example, in some embodiments, the metal line 590B acts as a power rail (also referred to as VDD rail), and the metal lines 590A and 590C act as true power rails (also referred to as TVDD rail). A TVDD rail (e.g., the metal lines 590A, 590C) is a power rail that is always ON when the IC is ON. For example, TVDD rail is coupled to a power supply terminal of the IC without a switch in between. In contrast, the power rail (e.g., the metal line 590B) are virtual power rails which are coupled to the power supply terminal of the IC via one or more switches configured to turn OFF the virtual power rails to save energy under one or more predetermined conditions, e.g., when the IC is in an idle or sleep mode.

In FIG. 72, the backside via 550A is between the epitaxy structures 540A and 540B, and is electrically connected to the epitaxy structures 540A and 540B through silicide layers 145. Thus, the epitaxy structures 540A and 540B are electrically connected to the metal line 590A through the backside via 550A. The backside via 550C is between the epitaxy structures 540C and 540D, and is electrically connected to the epitaxy structures 540C and 540D through silicide layers 145. Thus, the epitaxy structures 540C and 540D are electrically connected to the metal line 590C through the backside via 550C. On the other hand, the backside via 550B is between, but not electrically connected to, the adjacent epitaxy structures 540B and 540C.

Moreover, the source/drain contact 575A extends over the epitaxy structures 540A and 540B, and is in contact with the backside via 550A. Thus, the source/drain contact 575A is electrically connected to the metal line 590A through the backside via 550A. The source/drain contact 575B extends over the epitaxy structures 540C and 540D, and is in contact with the backside via 550C. Thus, the source/drain contact 575B is electrically connected to the metal line 590C through the backside via 550C.

In some embodiments of FIG. 72, one backside via is electrically connected to two epitaxy structures, such that the epitaxy structures are electrically connected to a backside metal line (or backside power rail). This can lower the resistance between the epitaxy structures and the backside metal line. Moreover, the source/drain contact is electrically connected to the backside metal line through the backside via. That is, a conductive path between the metal line at the back side and the metal lines at the front side may bypass the epitaxy structure with higher resistance, and the resistance between the metal line at the back side and the metal lines at the front side can be reduced.

In some embodiments, the integrated circuit IC3 of FIG. 72 is used for a header circuit. A header circuit may include a plurality of headers, which act as switches of power rails (e.g., the metal lines 590A, 590B, 590C), and each header may be coupled between a power rail and other devices in the integrated circuit. In some embodiments, each header includes at least one transistor. If the transistor in a header is turned off, the header functions as an open circuit, and is electrically disconnected the corresponding power rail from the device. If the transistor in a header is turned on, the header functions as current path for a current to flow through the source and the drain of the transistor, and thus the current can be applied to the device.

Figure 73:
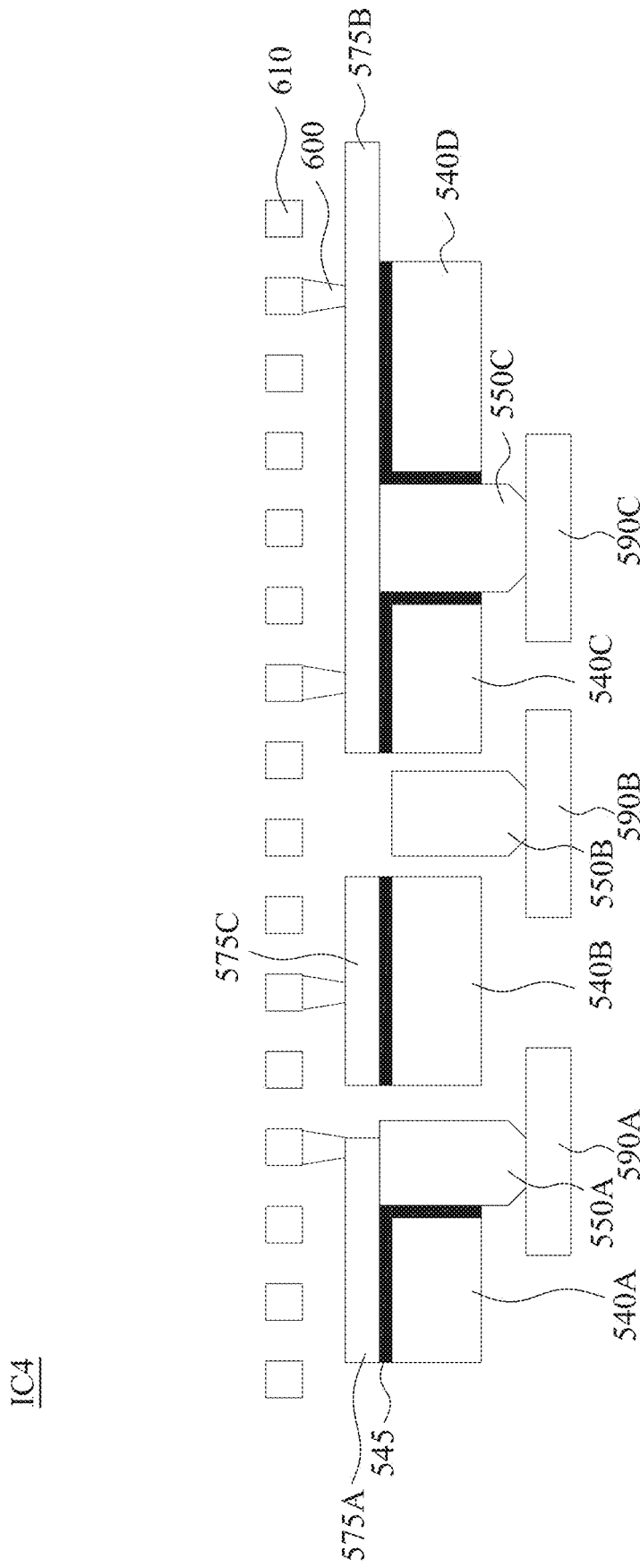

Reference is made to FIG. 73. An integrated circuit IC4 is shown. The integrated circuit IC4 of FIG. 73 is different from the integrated circuit IC3 of FIG. 72, in that the backside via 550A is separated from the epitaxy structure 540B. Moreover, the integrated circuit IC4 includes a source/drain contact 575A over the epitaxy structure 540A and the backside via 550A, and a source/drain contact 575C over the epitaxy structure 540B. Similar to FIG. 72, the metal line 590B may act as a power rail (also referred to as VDD rail), and the metal lines 590A and 590C may act as true power rail (also referred to as TVDD rail).

Figure 74:
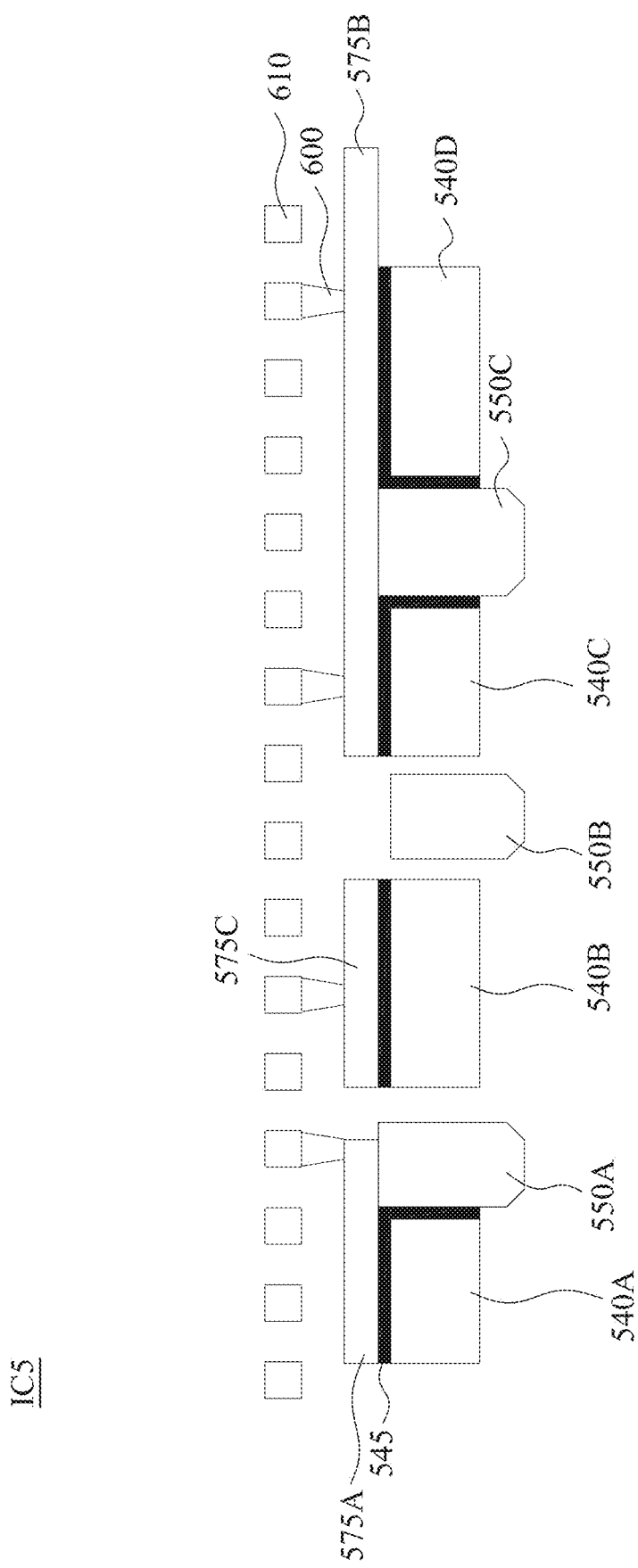

Reference is made to FIG. 74. An integrated circuit IC5 is shown. The integrated circuit IC5 of FIG. 74 is different from the integrated circuit IC4 of FIG. 73, in that no metal line is in contact with bottom surfaces of the backside via 550A, 550B, 550C. In some embodiments of FIG. 74, the source/drain contact 575A is in contact with the backside via 550A, and the source/drain contact 575B is in contact with the backside via 550C. The backside vias 550A and 550c can provide additional current path, and will further improve the device performance and provide routing flexibility.

Figure 75:
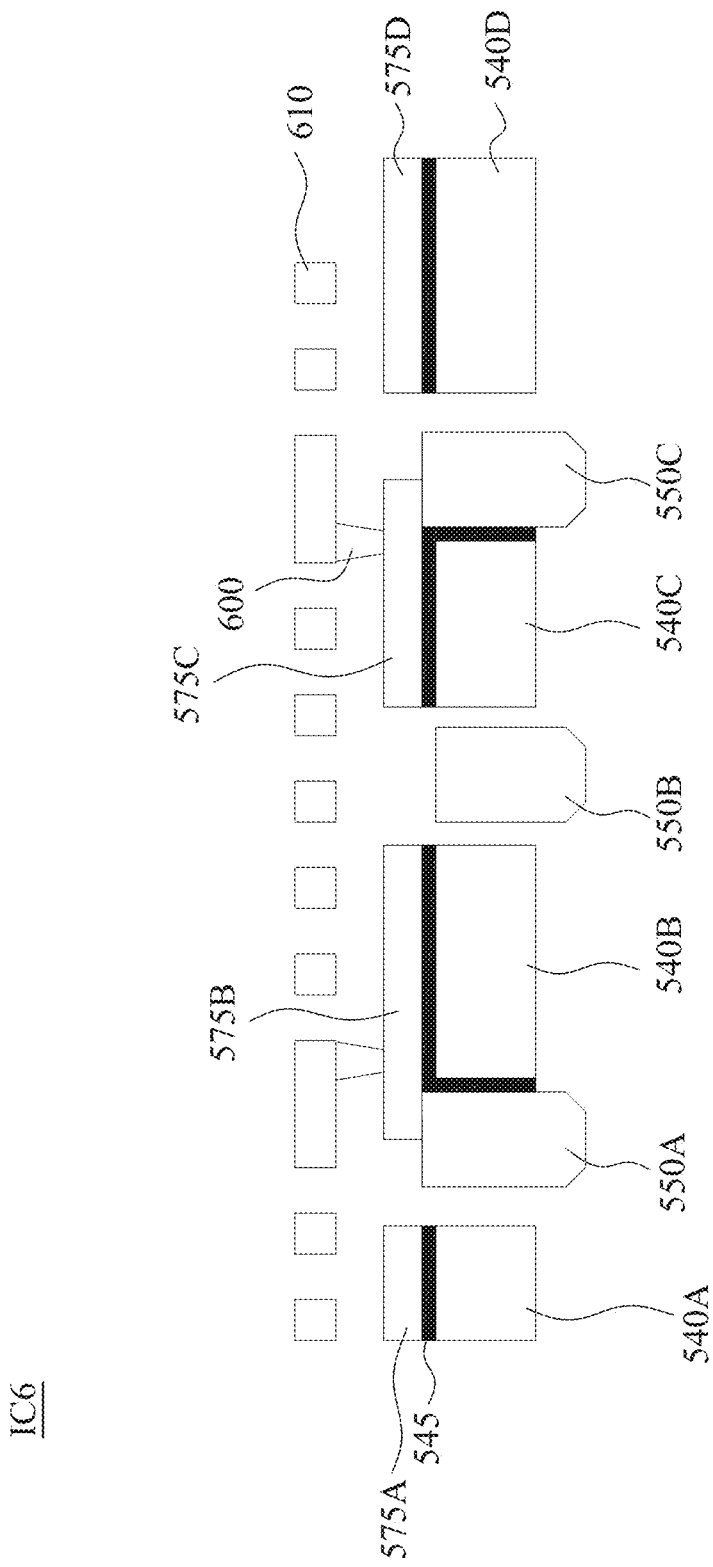

Reference is made to FIG. 75. An integrated circuit IC6 is shown. The integrated circuit IC6 of FIG. 75 is similar to the integrated circuit IC5 of FIG. 74, in that no metal line is in contact with bottom surfaces of the backside via 550A, 550B, 550C. The backside via 550A is electrically connected to the epitaxy structure 540B, and is separated from the epitaxy structure 540A. The backside via 550C is electrically connected to the epitaxy structure 540C, and is separated from the epitaxy structure 540D. In some embodiments, the integrated circuit IC6 includes source/drain contacts 575A, 575B, 575C, and 575D respectively over the epitaxy structures 540A to 540D. In some embodiments, the source/drain contact 575B is in contact with a top surface of the backside via 550A, and at least a portion of the top surface of the backside via 550A is not covered by the source/drain contact 575B. The source/drain contact 575C is in contact with a top surface of the backside via 550C, and at least a portion of the top surface of the backside via 550C is not covered by the source/drain contact 575C.

Figure 76:
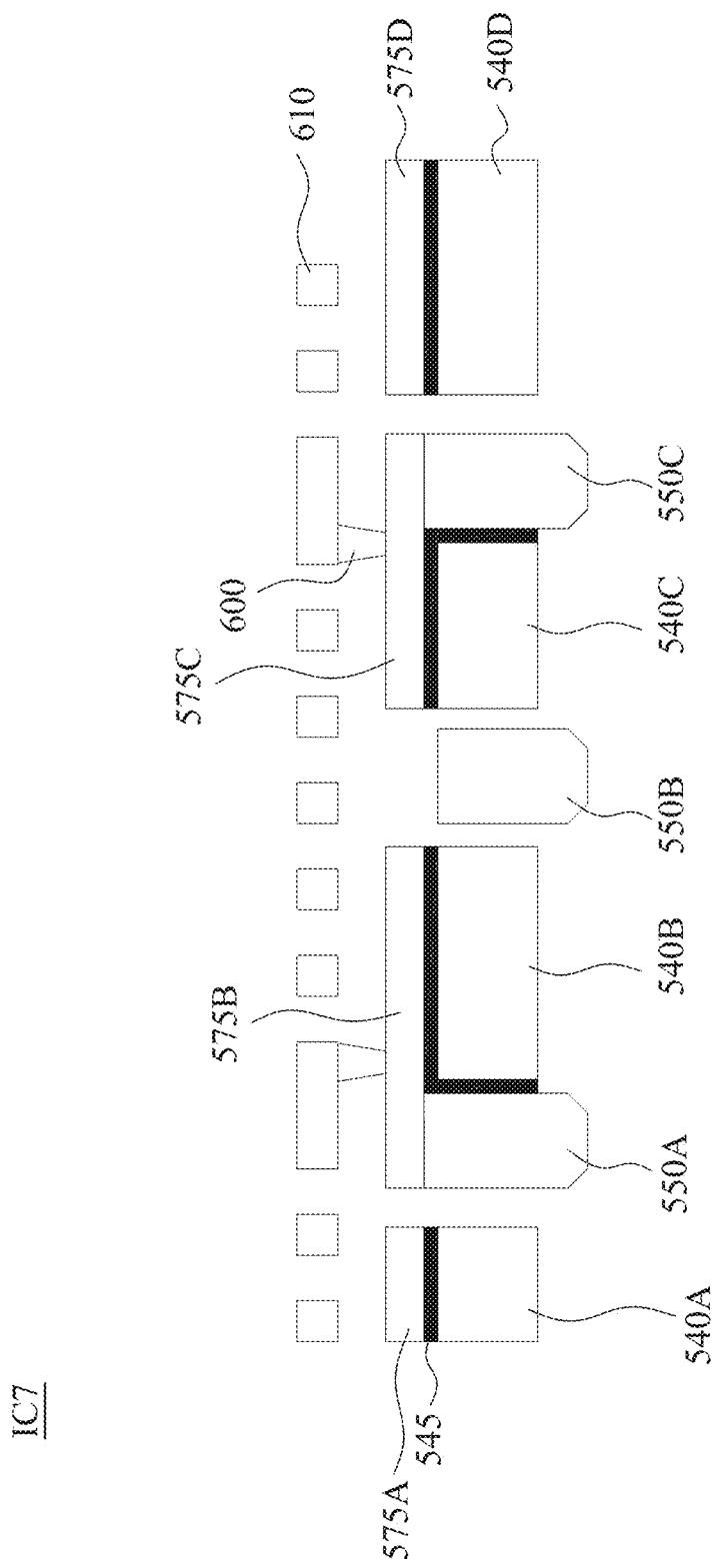

Reference is made to FIG. 76. An integrated circuit IC7 is shown. The integrated circuit IC7 of FIG. 76 is similar to the integrated circuit IC6 of FIG. 75. The integrated circuit IC7 of FIG. 76 is different from the integrated circuit IC6 of FIG. 75, in that an entirety of the top surface of the backside via 550A is covered by the source/drain contact 575B, and an entirety of the top surface of the backside via 550C is covered by the source/drain contact 575C.

Based on the above discussion, it can be seen that the present disclosure offers advantages. It is understood, however, that other embodiments may offer additional advantages, and not all advantages are necessarily disclosed herein, and further that no particular advantage is required for all embodiments. One advantage is that a backside via is formed aside the epitaxy structure rather than under the epitaxy structure, such that the chip height is reduced. Another advantage is that source/drain contact may contact the backside via, such that the metal line at the back side of the device may be electrically connected to the metal lines at the front side of the device. That is, a conductive path between the metal line at the back side and the metal lines at the front side will bypass the epitaxy structure with higher resistance, and the resistance between the metal line at the back side and the metal lines at the front side can be reduced. This will further improve the device performance and provide routing flexibility. Yet another advantage is that when one backside via is electrically connected to two epitaxy structures, such that the epitaxy structures are electrically connected to one backside metal line (or backside power rail), there is less resistance between the epitaxy structures and the backside metal line.

In some embodiments of the present disclosure, a semiconductor device includes a substrate, a gate structure, source/drain structures, a backside via, and a power rail. The gate structure extends along a first direction parallel with a front-side surface of the substrate. Source/drain structures are on opposite sides of the gate structure, respectively. The backside via extends along a second direction parallel with the front-side surface of the substrate but perpendicular to the first direction, the backside via has a first portion aligned with one of the source/drain structures along the first direction and a second portion aligned with the gate structure along the first direction, the first portion of the backside via has a first width along the first direction, and the second portion of the backside via has a second width along the first direction, in which the first width is greater than the second width. The power rail is on a backside surface of the substrate and in contact with the backside via.

In some embodiments of the present disclosure, a method includes alternately forming first semiconductor layers and second semiconductor layers over a front-side of a substrate; etching the first semiconductor layers, the second semiconductor layers, and the substrate to form a trench; forming a first dielectric spacer lining a sidewall of the trench; forming a second dielectric spacer lining a sidewall of the first dielectric spacer; after forming the second dielectric spacer, forming a backside via in the trench; forming a gate structure extending across the first and second dielectric spacers and the backside via; after forming the gate structure, removing a portion of the second dielectric spacer not covered by the gate structure to form a first recess; filling the first recess with a first conductive material to enlarge the backside via; after enlarging the backside via, etching a portion of the first dielectric spacer not covered by the gate structure to form a second recess; and filling the second recess with a second conductive material.

In some embodiments of the present disclosure, a method includes forming an epitaxial stack of alternating first semiconductor layers and second semiconductor layers over a front-side of a substrate; forming a first dielectric spacer alongside the epitaxial stack; forming a second dielectric spacer alongside the first dielectric spacer; forming a third dielectric spacer alongside the second dielectric spacer; forming a sacrificial dielectric layer next to the third dielectric spacer, in which the first, second, third dielectric spacers, and the sacrificial dielectric layer are made of at least two, and as many as four, different materials; after forming the sacrificial dielectric layer, replacing a portion of the epitaxial stack with a source/drain epitaxy structure; after replacing the portion of the epitaxial stack with the source/drain epitaxy structure, performing a CMP process to a backside of the substrate until a bottom surface of the sacrificial dielectric layer is exposed; removing the sacrificial dielectric layer to form a recess exposing a sidewall of the source/drain epitaxy structure; and filling the recess with a backside via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a gate structure extending along a first direction parallel with a front-side surface of the substrate;
   source/drain structures on opposite sides of the gate structure, respectively;
   a backside via extending along a second direction parallel with the front-side surface of the substrate but perpendicular to the first direction, the backside via having a first portion aligned with one of the source/drain structures along the first direction and a second portion aligned with the gate structure along the first direction, the first portion of the backside via having a first width along the first direction, and the second portion of the backside via having a second width along the first direction, wherein the first width is greater than the second width; and
   a power rail on a backside surface of the substrate and in contact with the backside via.

2. The semiconductor device of claim 1, further comprising a dielectric layer below the gate structure, wherein the first portion of the backside via is in contact with a side surface of the dielectric layer.

3. The semiconductor device of claim 1, further comprising a first dielectric spacer, wherein the first dielectric spacer has a horizontal portion in contact with a top surface of the first portion of the backside via and a vertical portion in contact with a first sidewall of the first portion of the backside via.

4. The semiconductor device of claim 3, wherein the power rail is in contact with a bottom surface of the vertical portion of the first dielectric spacer.

5. The semiconductor device of claim 1, further comprising a first dielectric spacer having a first vertical portion in contact with a first sidewall of the first portion of the backside via and a second vertical portion in contact with a second sidewall of the first portion of the backside via.

6. The semiconductor device of claim 1, further comprising:
   a first dielectric spacer on a top surface of the second portion of the backside via; and
   a second dielectric spacer on a sidewall of the backside via and on a sidewall of the first dielectric spacer, wherein the second dielectric spacer is laterally between the gate structure and the backside via.

7. The semiconductor device of claim 6, wherein the gate structure is in contact with a top surface of the second dielectric spacer.

8. The semiconductor device of claim 6, wherein the power rail is in contact with a bottom surface of the second dielectric spacer.

9. The semiconductor device of claim 1, further comprising:
   nanosheets arranged one above another in a spaced apart manner, each of the nanosheets being surrounded by the gate structure;
   a gate spacer above the nanosheets and on a sidewall of the gate structure;

semiconductor layers vertically below the gate spacer, wherein each of the semiconductor layers is vertically between an adjacent pair of the nanosheets, and wherein the backside via comprises a third portion aligned with the semiconductor layers along the first direction; and first, second, and third dielectric spacers laterally between the semiconductor layers and the third portion of the backside via.

10. The semiconductor device of claim 9, wherein the gate spacer is in contact with top surfaces of the first and second dielectric spacers, and is in contact with a sidewall of the third dielectric spacer.

11. A method, comprising:
alternately forming first semiconductor layers and second semiconductor layers over a front-side of a substrate;
etching the first semiconductor layers, the second semiconductor layers, and the substrate to form a trench;
forming a first dielectric spacer lining a sidewall of the trench;
forming a second dielectric spacer lining a sidewall of the first dielectric spacer;
after forming the second dielectric spacer, forming a backside via in the trench;
forming a gate structure extending across the first and second dielectric spacers and the backside via;
after forming the gate structure, removing a portion of the second dielectric spacer not covered by the gate structure to form a first recess;
filling the first recess with a first conductive material to enlarge the backside via;
after enlarging the backside via, etching a portion of the first dielectric spacer not covered by the gate structure to form a second recess; and
filling the second recess with a second conductive material.

12. The method of claim 11, further comprising:
performing a CMP process to a backside of the substrate until a bottom surface of the backside via is exposed; and
forming a metal line on the bottom surface of the backside via.

13. The method of claim 11, further comprising:
after forming the backside via, etching back the backside via;
forming a first dielectric cap over the backside via, wherein the first dielectric cap and the first dielectric spacer are made of the same material; and
forming a second dielectric cap over the first dielectric cap, wherein the second dielectric cap is made of a different material than both the first and second dielectric spacers.

14. The method of claim 11, further comprising forming a dielectric cap over the first conductive material before etching the portion of the first dielectric spacer.

15. The method of claim 11, further comprising:
replacing the gate structure with a metal gate structure after enlarging the backside via.

16. A method, comprising:
forming an epitaxial stack of alternating first semiconductor layers and second semiconductor layers over a front-side of a substrate;
forming a first dielectric spacer alongside the epitaxial stack;
forming a second dielectric spacer alongside the first dielectric spacer;
forming a third dielectric spacer alongside the second dielectric spacer;
forming a sacrificial dielectric layer next to the third dielectric spacer, wherein the first, second, third dielectric spacers, the sacrificial dielectric layer comprise at least two different materials;
after forming the sacrificial dielectric layer, replacing a portion of the epitaxial stack with a source/drain epitaxy structure;
after replacing the portion of the epitaxial stack with the source/drain epitaxy structure, performing a CMP process to a backside of the substrate until a bottom surface of the sacrificial dielectric layer is exposed;
removing the sacrificial dielectric layer to form a recess exposing a sidewall of the source/drain epitaxy structure; and
filling the recess with a backside via.

17. The method of claim 16, further comprising:
prior to performing the CMP process to the backside of the substrate, etching back the sacrificial dielectric layer to form a first recess;
forming a first dielectric cap in the first recess and over the sacrificial dielectric layer, wherein the first dielectric cap and the first dielectric spacer are made of a first material; and
forming a second dielectric cap in the first recess and over the first dielectric cap, wherein the second dielectric cap and the third dielectric spacer are made of a second material.

18. The method of claim 17, further comprising:
etching back the first and second dielectric spacers after forming the second dielectric cap;
removing the second and third dielectric spacers, and the second dielectric cap to form a second recess between the sacrificial dielectric layer and the first dielectric spacer; and
filling the second recess with a dielectric material.

19. The method of claim 18, further comprising forming a third dielectric cap in the second recess and over the dielectric material, wherein the third dielectric cap and the first dielectric spacer are made of the first material.

20. The method of claim 16, further comprising:
prior to filling the recess with the backside via, forming a silicide layer on the exposed sidewall of the source/drain epitaxy structure.

* * * * *